United States Patent
Peterson et al.

(10) Patent No.: US 9,176,810 B2
(45) Date of Patent: Nov. 3, 2015

(54) BIT ERROR REDUCTION THROUGH VARIED DATA POSITIONING

(75) Inventors: Jim Peterson, San Jose, CA (US); John Strasser, Syracuse, UT (US); Jea Hyun, South Jordan, UT (US)

(73) Assignee: SANDISK TECHNOLOGIES, INC., Plano, TX (US)

( * ) Notice: Subject to any disclaimer, the term of this patent is extended or adjusted under 35 U.S.C. 154(b) by 447 days.

(21) Appl. No.: 13/482,892

(22) Filed: May 29, 2012

(65) Prior Publication Data

US 2012/0304039 A1 Nov. 29, 2012

Related U.S. Application Data

(60) Provisional application No. 61/491,024, filed on May 27, 2011.

(51) Int. Cl.
| | |
|---|---|
| *G11C 29/00* | (2006.01) |
| *G06F 11/00* | (2006.01) |
| *G11C 7/10* | (2006.01) |
| *G06F 13/00* | (2006.01) |
| *G06F 11/10* | (2006.01) |
| *H03M 13/05* | (2006.01) |

(52) U.S. Cl.
CPC ............ *G06F 11/1044* (2013.01); *G06F 11/10* (2013.01); *H03M 13/05* (2013.01); *G06F 11/1076* (2013.01)

(58) Field of Classification Search
CPC ............ G06F 11/1008; G06F 12/0246; G06F 11/108; G06F 11/1076; G06F 11/10; G06F 11/1044; H03M 13/05
USPC ......... 714/763, 761, 766–767, 773–774, 787, 714/805, 739, 746, 6.1, 6.2, 6.24, 48, 52, 714/54, 704; 711/100, 104, 114, 127, 150, 711/103; 365/189.01, 189.04
See application file for complete search history.

(56) References Cited

U.S. PATENT DOCUMENTS

| | | | | |
|---|---|---|---|---|
| 7,173,852 | B2 * | 2/2007 | Gorobets et al. | 365/185.09 |
| 8,254,167 | B2 * | 8/2012 | Patapoutian et al. | 365/185.03 |
| 8,650,438 | B2 * | 2/2014 | Huang et al. | 714/6.24 |
| 8,656,085 | B2 * | 2/2014 | Jung | 711/103 |
| 2010/0332922 | A1 * | 12/2010 | Chang et al. | 714/704 |

* cited by examiner

*Primary Examiner* — Christine Tu

(57) ABSTRACT

Devices, apparatuses, systems, and methods are disclosed for bit error reduction through varied data positioning. A write request module is configured to receive data for storage in an array of solid-state storage elements. The solid-state storage elements are accessible in parallel. A write module is configured to store the data in parallel to the array of solid-state storage elements with varied data positions for the data relative to different solid-state storage elements of the array. A read module is configured to read the data in parallel from the array of solid-state storage elements.

25 Claims, 33 Drawing Sheets

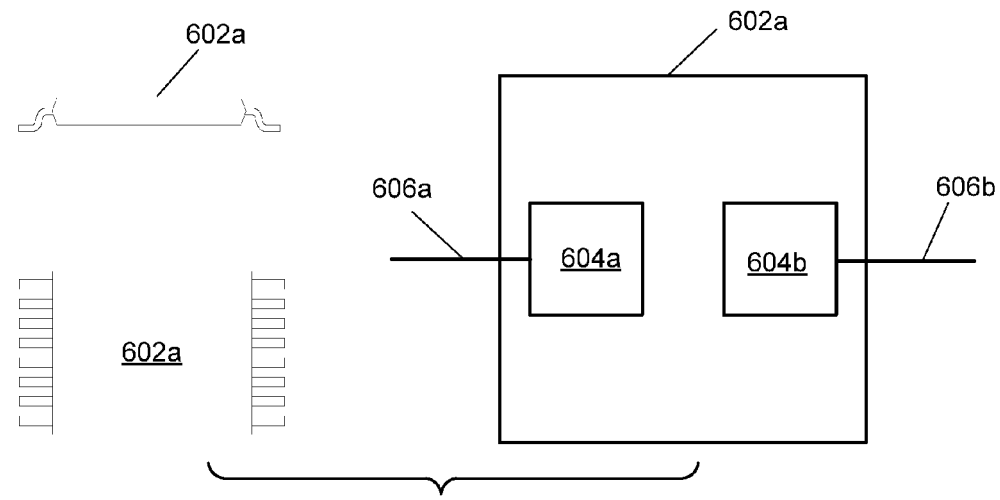
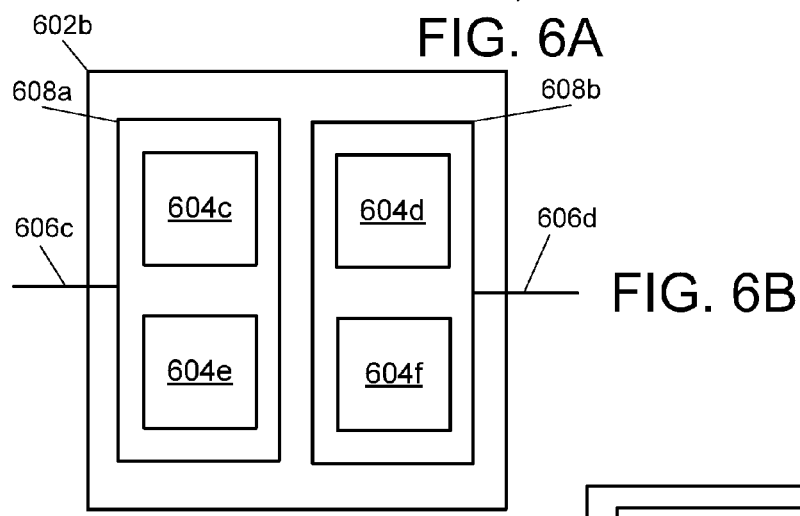
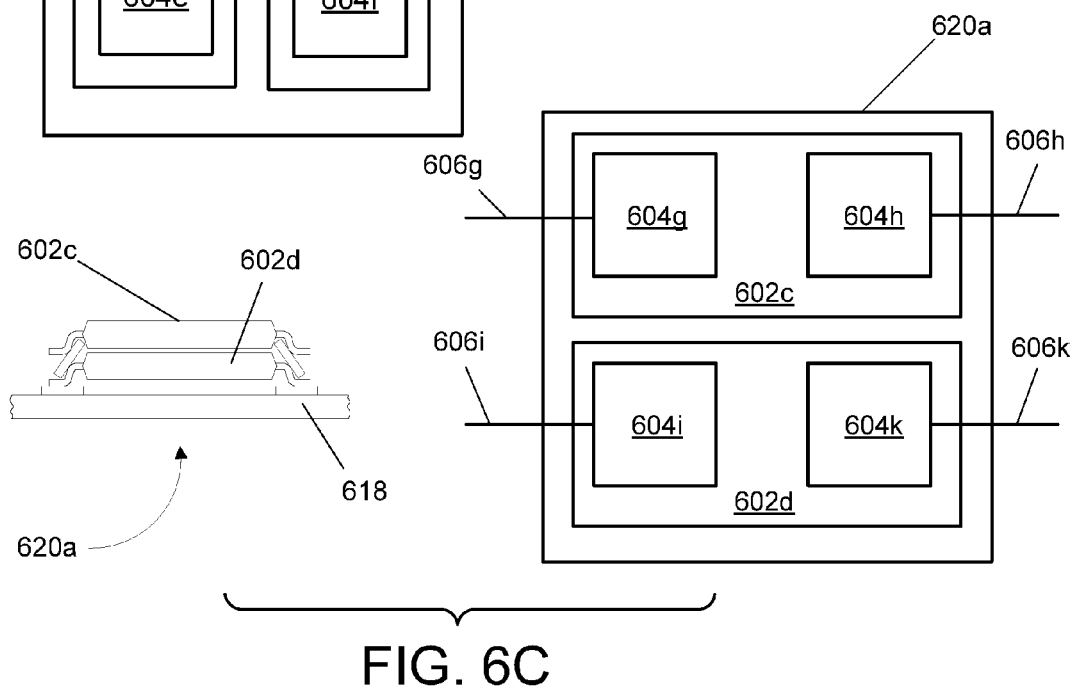

BIT ERROR REDUCTION THROUGH VARIED DATA POSITIONING

CROSS-REFERENCES TO RELATED APPLICATIONS

This application claims the benefit of U.S. Provisional Patent Application No. 61/491,024 entitled "BIT ERROR REDUCTION THROUGH VARIED DATA POSITIONING" and filed on May 27, 2011 for Jim Peterson et al., which is incorporated herein by reference.

TECHNICAL FIELD

The present disclosure, in various embodiments, relates to devices, systems, and methods for bit error reduction through varied data positioning.

BACKGROUND

Solid-state storage devices are generally designed to store data in an array of memory cells. Ideally, the reliability with which the memory cells of the array store the data is consistent across the array. However, in some cases, certain memory cells may be more reliable than others. For example, some die within a package or stack of packages may have a higher raw bit error rate (RBER) than other die in the package, some erase blocks within a die may have a higher RBER than other erase blocks in the die, some pages within an erase block may have a higher RBER than other pages in the erase block, and upper pages of multi-level memory cells may have a higher RBER than lower pages of the multi-level memory cells or the like.

BRIEF SUMMARY

In one embodiment, a method for varied data positioning includes receiving data for storage in an array of solid-state storage elements. In a further embodiment, the solid-state storage elements are accessible in parallel. In one embodiment, the method includes storing the data in parallel to the array of solid-state storage elements. In a further embodiment, the data is stored in a plurality of different data positions relative to solid-state storage elements of the array. In one embodiment, the method includes reading the data in parallel from the different data positions relative to solid-state storage elements of the array.

In a further embodiment, the method includes determining a different address for each of the different data positions according to a deterministic pattern. In a further embodiment, the method includes sending the different addresses in parallel to the solid-state storage elements of the array to store the data and to read the data. In one embodiment, the deterministic pattern including adding a predetermined offset to addresses to define each of the different data positions according to an order of the solid-state storage elements of the array to determine the different addresses.

In one embodiment, from the data is stored as a logical page spanning logical erase blocks of the array of solid-state storage elements so that a physical page of a physical erase block of the logical erase block is not unused. In certain embodiments, the different data positions may include solid-state storage dies having different relative positions within the solid-state storage elements of the array, physical pages disposed in different positions relative to the solid-state storage elements of the array, one or more upper pages and one or more lower pages of the solid-state storage elements of the array, physical erase blocks disposed in different physical positions relative to the solid-state storage elements of the array, and/or one or more odd physical pages and one or more even physical pages of the array of solid-state storage elements.

In one embodiment, the data includes a logical page of data and the different data positions include physical pages disposed in different positions relative to the solid-state storage elements of the array. In a further embodiment, the method includes inverting an address bit for solid-state storage elements of the array to alternate the different data positions between the one or more upper pages and the one or more lower pages of the multi-level memory cells. In certain embodiments, the method includes restructuring logical pages of the array of solid-state storage elements from physical pages disposed in similar positions relative to the solid-state storage elements of the array to the physical pages disposed in different positions in response to a number of program/erase cycles satisfying a threshold. In one embodiment, the method includes buffering the data with other data such that the data and the other data is stored to the physical pages in an order that satisfies a write order for the solid-state storage elements of the array.

In one embodiment, an apparatus for varied data positioning includes a write request module configured to receive data for storage in an array of solid-state storage elements. In a further embodiment, the solid-state storage elements are accessible in parallel. In one embodiment, the apparatus includes a write module configured to store the data in parallel to the array of solid-state storage elements with varied data positions for the data relative to different solid-state storage elements of the array. In one embodiment, the apparatus includes a read module configured to read the data in parallel from the different solid-state storage elements of the array.

In a further embodiment, the apparatus includes an address module configured to determine a different address for each of the varied data positions according to a deterministic pattern and to send the different addresses in parallel to the solid-state storage elements of the array. In one embodiment, enable lines are electrically coupled to the different solid-state storage elements of the array in different relative locations of the different solid-state storage elements such that the array of solid-state storage elements is configured to receive the data in parallel at the varied data positions. In one embodiment, the varied data positions include solid-state storage dies having different relative positions within the different solid-state storage elements of the array.

In one embodiment, the data includes a logical page of data and the varied data positions include physical pages disposed in different positions relative to the different solid-state storage elements of the array. In a further embodiment, the array of solid-state storage elements includes multi-level memory cells and the physical pages disposed in different positions include one or more upper pages and one or more lower pages of the multi-level memory cells. In one embodiment, the logical page spans more than one logical erase block of the array of solid-state storage elements.

In one embodiment, the varied data positions include physical erase blocks disposed in different physical positions relative to the different solid-state storage elements of the array. In certain embodiments, the varied data positions include one or more odd physical pages and one or more even physical pages of the array of solid-state storage elements. In one embodiment, the varied data positions include a combination of two or more of solid-state storage dies having different relative positions within the different solid-state storage elements of the array, one or more upper pages and one or more lower pages of the array of solid-state storage elements, and physical pages disposed in different positions relative to the different solid-state storage elements of the array. In one embodiment, the varied data positions are selected to average an error rate across the array of solid-state storage elements.

In one embodiment, a system for varied data positioning includes a solid-state storage device comprising an array of solid-state storage elements. In a further embodiment, the solid-state storage elements are accessible in parallel. In one embodiment, the system includes a storage controller for the solid-state storage device. The storage controller, in one embodiment, includes a write module configured to store an error correcting code chunk in parallel across the array of solid-state storage elements. In a further embodiment, portions of the error correcting code chunk are stored in a plurality of different locations relative to different solid-state storage elements of the array. The different locations, in certain embodiments, comprise different error rates. In one embodiment, the storage controller includes a read module configured to read the portions of the error correcting code chunk in parallel from the array of solid-state storage elements. In a further embodiment, the system includes a host computing system in communication with the solid-state storage device over one or more communications buses.

One embodiment of a computer program product comprising a computer readable storage medium storing computer usable program code executable to perform operations for varied data positioning includes operations for determining a plurality of different addresses for each of a plurality of different data positions relative to different solid-state storage elements of an array of solid-state storage elements accessible in parallel. In one embodiment, the operations include sending the plurality of different addresses in parallel to the solid-state storage elements of the array. In one embodiment, the operations include storing data in parallel to the array of solid-state storage elements at the plurality of different data positions of the plurality of different addresses.

One embodiment of an apparatus for varied data positioning includes means for receiving data for storage in an array of solid-state storage elements. In a further embodiment, the solid-state storage elements are accessible in parallel. In one embodiment, the apparatus includes means for storing the data in parallel to the array of solid-state storage elements. In a further embodiment, the data is stored in different data positions relative to different solid-state storage elements of the array. The different data positions, in another embodiment, are selected to average an error rate across the array. In one embodiment, the apparatus includes means for reading the data in parallel from the array of solid-state storage elements.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 6A is a schematic block diagram illustrating one embodiment of a solid-state storage element package;

FIG. 6B is a schematic block diagram illustrating an alternate embodiment of a solid-state storage element package;

FIG. 6C is a schematic block diagram illustrating one embodiment of a solid-state storage element pad;

DETAILED DESCRIPTION

Figure 1A:
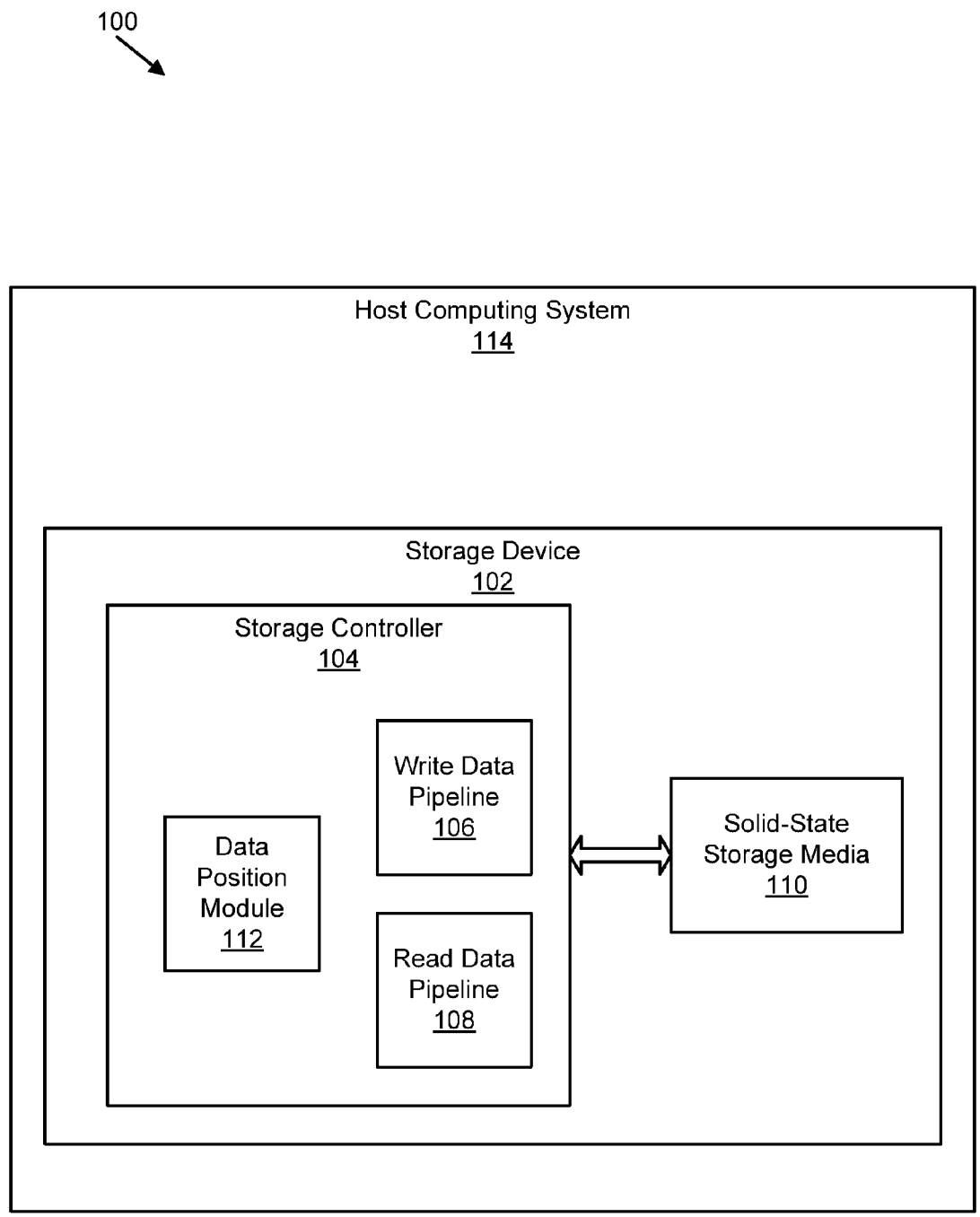
FIG. 1A is a schematic block diagram illustrating one embodiment of a system for varied data positioning including a storage device.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages of the present invention will become more fully apparent from the following description and appended claims, or may be learned by the practice of the invention as set forth hereinafter.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

System for Bit Error Reduction Through Varied Data Positioning

FIG. 1A depicts one embodiment of a system 100 for reducing bit errors through varied data positioning. In the depicted embodiment, the system 100 includes a host computing system 114, and a storage device 102. The host computing system 114 may be a computer such as a server, laptop, desktop, a mobile device, or other computing device known in the art. The host computing system 114 typically includes components such as memory, processors, buses, and other components as known to those of skill in the art.

The host computing system 114 stores data in the storage device 102 and communicates data with the storage device 102 via one or more communications buses. The storage device 102 may be internal to the host computing system 114 or external to the host computing system 114. The one or more communications buses may include a bus, a network, or other manner of connection allowing the transfer of data between the host computing system 114 and the storage device 102. In one embodiment, the storage device 102 is connected to the host computing system 114 by a PCI connection such as PCI express ("PCI-e"). The storage device 102 may be a card that plugs into a PCI-e connection on the host computing system 114 or the like.

The storage device 102, in the depicted embodiment, performs data storage operations such as reads, writes, erases, etc. In certain embodiments, a power connection and the communications connection for the storage device 102 are part of the same physical connection between the host computing system 114 and the storage device 102. For example, the storage device 102 may receive power over PCI, PCI-e, serial advanced technology attachment ("serial ATA" or "SATA"), parallel ATA ("PATA"), small computer system interface ("SCSI"), IEEE 1394 ("FireWire"), Fiber Channel, universal serial bus ("USB"), PCIe-AS, or another communications bus connection with the host computing system 114.

The storage device 102 provides nonvolatile storage for the host computing system 114. FIG. 1 depicts the storage device 102 as a nonvolatile solid-state storage device 102 comprising a solid-state storage controller 104, a write data pipeline 106, a read data pipeline 108, nonvolatile solid-state storage media 110, and a data position module 112. The storage device 102 may contain additional components that are not shown in order to provide a simpler view of the storage device 102.

The solid-state storage media 110 comprises nonvolatile memory that stores data such that the data is retained even when the storage device 102 is not powered. Examples of solid-state storage media 110 include flash memory, nano random access memory ("NRAM"), magneto-resistive RAM ("MRAM"), dynamic RAM ("DRAM"), phase change RAM ("PRAM"), Racetrack memory, Memristor memory, nanocrystal wire-based memory, silicon-oxide based sub-10 nanometer process memory, graphene memory, Silicon-Oxide-Nitride-Oxide-Silicon ("SONOS"), Resistive random-access memory ("RRAM"), programmable metallization cell ("PMC"), conductive-bridging RAM ("CBRAM"), and the like. While, in the depicted embodiment, the storage device 102 includes solid-state storage media 110, in other embodiments, the storage device 102 may include magnetic media such as hard disks, tape, and the like, optical media, or other nonvolatile data storage media. The storage device 102 also includes a storage controller 104 that coordinates the storage and retrieval of data in the solid-state storage media 110. The storage controller 104 may use one or more indexes to locate and retrieve data, and perform other operations on data stored in the storage device 102. For example, the storage controller 104 may include a groomer for performing data grooming operations such as garbage collection.

As shown, the storage device 102, in certain embodiments, implements a write data pipeline 106 and a read data pipeline 108, an example of which is described in greater detail below. The write data pipeline 106 may perform certain operations on data as the data is transferred from the host computing system 114 into the solid-state storage media 110. These operations may include, for example, error correction code ("ECC") generation, encryption, compression, and others. The read data pipeline 108 may perform similar and potentially inverse operations on data that is being read out of solid-state storage media 110 and sent to the host computing system 114. The storage controller 104, including the data position module 112, the write data pipeline 106, and/or the read data pipeline 108, in various embodiments, may comprise logic hardware of the storage device 102, a device driver installed and executing on the host computing system 114, or a combination of both logic hardware of the storage device 102 and a device driver installed and executing on the host computing system 114.

The data position module 112, in general, varies data positioning of data stored on the solid-state storage media 110, to reduce uncorrectable data errors, average a raw bit error rate ("RBER"), or the like for the solid-state storage media 110. For example, certain physical and/or logical positions within the solid-state storage media 110 may have a higher RBER or be more prone to errors than other positions. In embodiments where the storage controller 104 accesses solid-state storage elements of the solid-state storage media 110 in parallel, if the storage controller 104 used the same data position or address for each solid-state storage element, positions or locations with a higher RBER would be grouped together.

In various embodiments, as described in greater detail below, the data position module 112 may vary data positioning in the solid-state storage media 110 by writing an ECC chunk across a set of die located in a variety of positions 802 within the solid-state storage media, by writing an ECC chunk across a set of erase blocks located in a variety of positions within the solid-state storage media 110, by writing an ECC chunk across a set of pages located in a variety of positions within the solid-state storage media 110, by writing an ECC chunk across a mixture of upper pages and lower pages within the solid-state storage media 110, by writing an ECC chunk across a variety of page types (e.g., even lower, odd lower, even upper, and odd upper) within the solid-state storage media 110, and/or a combination of the above data varying techniques. In certain embodiments, the data position module 112 varies data positions for parallel data accesses deterministically, so that the storage controller 104, in cooperation with the write data pipeline 106 and the read data pipeline 108 or the like, may write data to and read data from the solid-state storage media 110 using the same known pattern of varied data positions for reads and writes.

In one embodiment, the host computing system 114 includes one or more other components in addition to the storage device 102, such as additional storage devices, graphics processors, network cards, and the like. Those of skill in the art, in view of this disclosure, will appreciate the different types of components that may be in a host computing system 114. The components may be internal or external to the host computing system 114. In one embodiment, some of the components may be PCI or PCI-e cards that connect to the host computing system 114 and receive power through the host computing system 114.

Figure 1B:
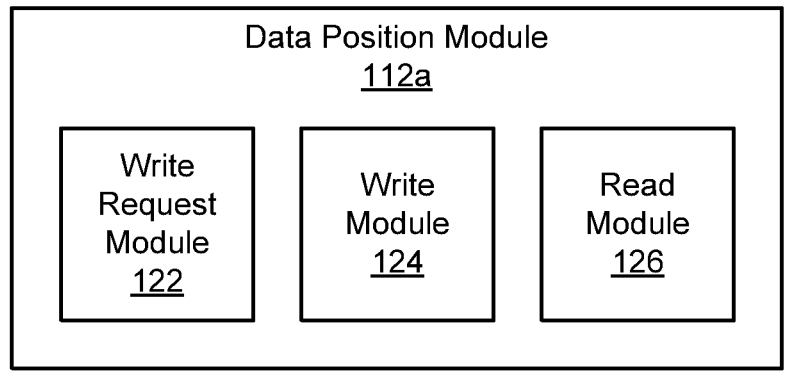
FIG. 1B is a schematic block diagram illustrating one embodiment of a data position module.

FIG. 1B depicts another embodiment of a data position module 112a. The data positioning module 112a may be substantially similar to the data position module 112 described above with regard to FIG. 1A. In the depicted embodiment, the data position module 112a includes a write request module 122, a write module 124, and a read module 126.

In one embodiment, the write request module 122 receives data for storage in an array of solid-state storage elements, such as the solid-state storage media 110, which may be accessible in parallel. The write request module 122 may receive the data either directly or indirectly. The data may comprise workload data associated with a write request from the host computing system 114 or another client, valid data being copied forward to an append point of a sequential log-based writing structure of the solid-state storage media 110 by the storage controller 104 as part of a storage capacity recovery operation, overhead data or metadata from the storage controller 104, or the like. The write request module 122 may receive the data as part of a write request, as a direct memory access ("DMA") transfer, a remote DMA ("RDMA") transfer, or the like.

In one embodiment the write module 124 programs, writes, or otherwise stores data from the write request module 122 to the array of solid-state storage elements, such as the solid-state storage media 110. The write module 124 may store data in a plurality of different data positions relative to different solid-state storage elements of the array, to vary data positions for the data in the different solid-state storage elements during the same parallel write operation. The write module 124 may cooperate with the write data pipeline 106, a write agent 404, or the like described below.

In a single parallel write or program operation, the write module 124 may store data to dies having different relative positions within different solid-state storage elements of the array, to physical erase blocks disposed in different physical positions relative to different solid-state storage elements of the array, to wordlines disposed in different physical locations relative to different solid-state storage elements of the array, to physical pages disposed in different positions relative to different solid-state storage elements of the array, to one or more upper pages and one or more lower pages of multi-level memory cells of the array, to one or more odd physical pages and one or more even physical pages of the array, or to a combination of two or more of the above different/varied positions within the array. In one embodiment, the different data positions to which the write module 124 stores data are selected to average an error rate across the array of solid-state storage elements, by mixing positions with different error rates or the like.

In certain embodiments, where the array of solid-state storage elements has a required or preferred write order, the write module 124 may buffer data until the write module 124 can store the data to the array in an order that satisfies the write order for the array. For example, if the array comprises multi-level cell ("MLC") solid-state storage elements, lower pages typically should be written before upper pages in the write order.

The write module 124, in certain embodiments, selects the varied, different positions for data according to a deterministic pattern, so that the read module 126 described below may read the data back using the same deterministic pattern. A deterministic pattern is a known algorithm whereby the same varied, different positions may be repeatedly determined. In such deterministic embodiments, records, logs, metadata, or other indicators of the varied, different positions for data may not need to be maintained, reducing storage overhead for the data position module 112a. In other embodiments, the write module 124 may maintain data position metadata indicating the varied, different positions to which the write module 124 stored data in the array of solid-state storage elements or the like.

In one embodiment, one or more connections of the solid-state storage elements of the array, such as chip enable lines, may be hard-wired to store data in varied, different positions relative to the solid-state storage elements. In other embodiments, as described below with regard to the address module 132 of FIG. 1C, the write module 124 may store data using addresses determined for each varied, different data position.

In one embodiment, the read module 126 reads data in parallel from the array of solid-state storage elements, from the same varied, different data positions to which the write module 124 stored the data. For example, the read module 126 may read data in response to a read request from the host computing system 114 or another client, in response to a storage capacity recovery operation or read request from the storage controller 104, or the like. The read module 126 may determine the varied, different data positions according to a deterministic pattern, one or more connections of the solid-state storage elements of the array, such as chip enable lines, may be hard-wired to read data in the varied, different positions relative to the solid-state storage elements, or the like.

Figure 1C:
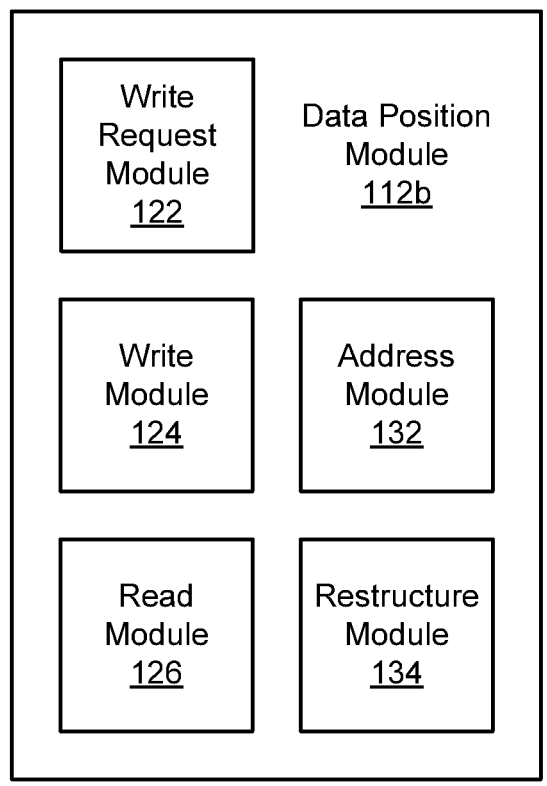
FIG. 1C is a schematic block diagram illustrating another embodiment of a data position module.

FIG. 1C depicts a further embodiment of a data position module 112b, which may be substantially similar to the data position module 112 and/or the data position module 112a described above with regard to FIGS. 1A and 1B. In the depicted embodiment, the data position module 112b includes a write request module 122, a write module 124, a read module 126, an address module 132, and a restructure module 134.

In one embodiment, the address module 132 determines a different address for each varied, different data position to which the write module 124 stores data and/or from which the read module 126 reads data. The address module 132 may determine addresses according to a deterministic pattern. For example, the address module 132 may determine a base address for a first solid-state storage element, and may add a predetermined offset to the base address for each subsequent storage element according to an order of the solid-state storage elements of the array or the like. In another embodiment, the address module 132 may interleave a base address and a base address plus an offset for alternating addresses or the like. For example, the address module 132 may invert an address bit for solid-state storage elements of the array to alternate the varied, different data positions between one or more upper pages and one or more lower pages of MLC solid-state storage elements, or the like. One of skill in the art, in light of this disclosure, will recognize other deterministic patterns that the address module 132 may use to determine a different address for varied, different data positions relative to solid-state storage elements of an array.

In determining addresses, in certain embodiments, the address module 132 may configure one or more logical pages to span more than one logical erase block, so that no physical page of a physical erase block of an associated logical erase block goes unused, but substantially each physical page is used, as described below. The address module 132, in a further embodiment, may prevent an error correcting code chunk of data from spanning more than one logical erase block of the array of solid-state storage elements, even if a logical page may span multiple logical erase blocks. In one embodiment, the address module 132 selects addresses for varied, different data positions to average an error rate across the array of solid-state storage elements.

The address module 132, in one embodiment, in cooperation with the write module 124 and/or the read module 126, sends the different addresses in parallel to the solid-state storage elements of the array to store the data, read the data, or the like. In other embodiments, instead of or in addition to using an address module 132, enable lines may be electrically coupled to solid-state storage elements of the array in different relative locations, to different electrical contacts, or the like of the different solid-state storage elements, so that data is stored in parallel to the array in a plurality of different data positions relative to the solid-state storage elements.

In certain embodiments, the restructure module 134 restructures logical pages of the array of solid-state storage elements from physical pages disposed in similar positions relative to solid-state storage elements of the array to physical pages disposed in different positions. Stated differently, in certain embodiments, the write module 124 may initially store data to the same relative position in each solid-state storage element of the array, and the restructure module 134, in response to a trigger, may restructure the solid-state storage elements, in cooperation with the write module 124 or the like, to store data in varied, different relative positions. For example, the restructure module 134 may restructure solid-state storage elements, logical pages, or the like in response to a number of program/erase cycles satisfying a threshold. The number, or count, of program/erase cycles, in various embodiments, may comprise a total program/erase count for an array, a program/erase count for upper pages of an array, an average program/erase count for an array, and/or another indicator of a number of program/erase cycles for an array of solid-state storage elements.

Solid-State Storage Device

Figure 2:
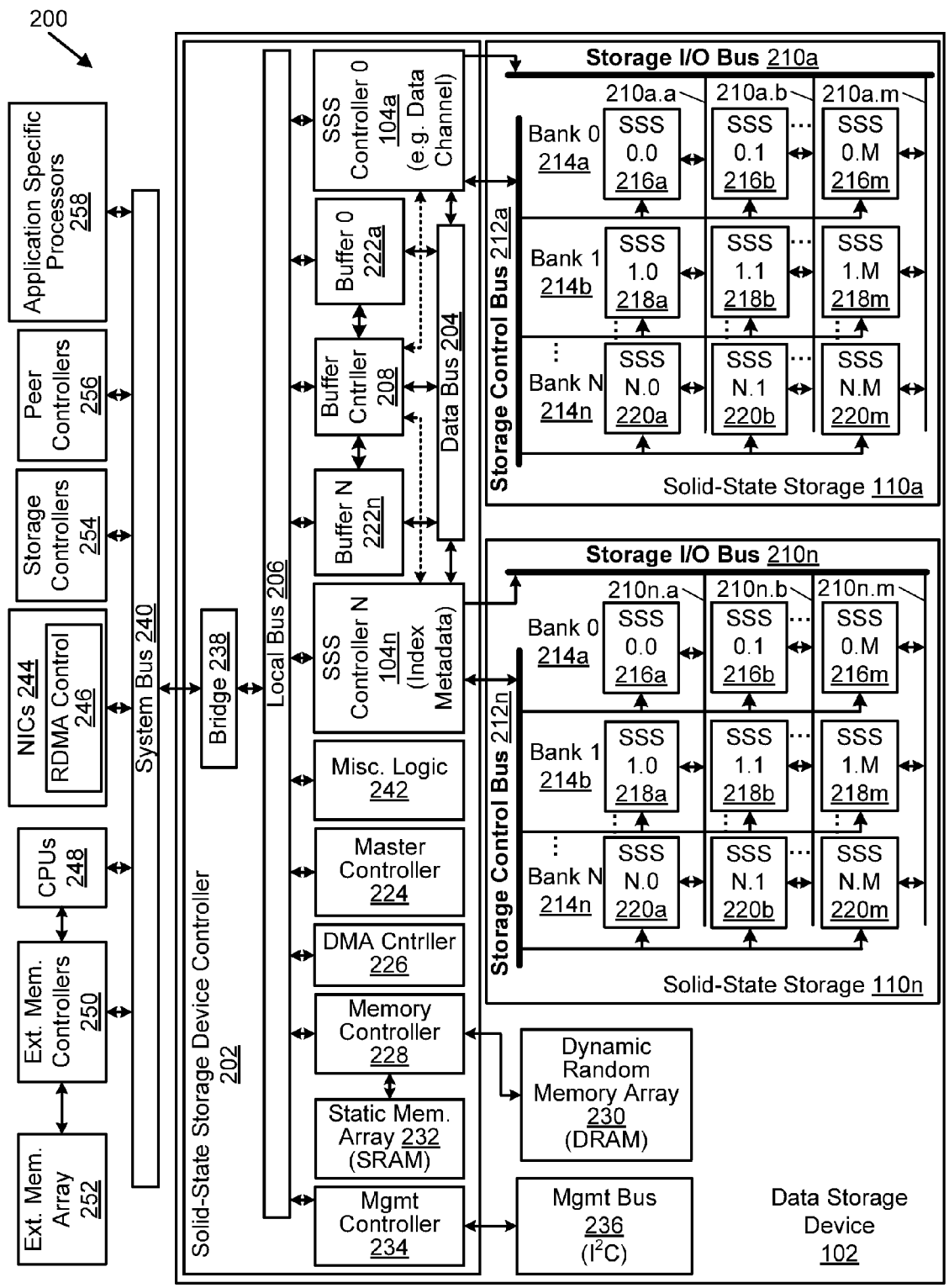
FIG. 2 is a schematic block diagram illustrating one embodiment of a solid-state storage device controller for a data storage device.

FIG. 2 is a schematic block diagram illustrating one embodiment 200 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage media 110. In the depicted embodiment, two solid-state controllers are shown: solid-state controller 0 104a and solid-state storage controller N 104n, and each controlling respective solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid-state controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state controller 104 is a field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g., SSS 0.0 216a) is typically configured as a chip (a package of one or more dies) or a die on a circuit board. As depicted, a solid-state storage element (e.g., 216a) operates independently or semi-independently of other solid-state storage elements (e.g., 218a) even if these several elements are packaged together in a chip package, a stack of chip packages, or some other package element. As depicted, a row of solid-state storage elements 216a, 216b, 216m is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage media 110. Of course, different embodiments may include different values for n and m. In one embodiment, a solid-state storage media 110a includes twenty solid-state storage elements 216a-216m per bank 214 with eight banks 214. In one embodiment, the solid-state storage media 110a includes twenty-four solid-state storage elements 216a-216m per bank 214 with eight banks 214. In addition to the n×m storage elements 216a-216m, 218a-218m, 220a-220m, one or more additional columns (P) may also be addressed and operated in parallel with other solid-state storage elements 216a, 216b, 216m for one or more rows. The added P columns in one embodiment, store parity data for the portions of an ECC chunk (i.e., an ECC codeword) that span m storage elements for a particular bank. In one embodiment, each solid-state storage element 216, 218, 220 is comprised of single-level cell ("SLC") devices. In another embodiment, each solid-state storage element 216, 218, 220 is comprised of multi-level cell ("MLC") devices.

In one embodiment, solid-state storage elements that share a common line 211 on the storage I/O bus 210a (e.g., 216b, 218b, 220b) are packaged together. In one embodiment, a solid-state storage element 216, 218, 220 may have one or more dies per package with one or more packages stacked vertically and each die may be accessed independently. In another embodiment, a solid-state storage element (e.g., SSS 0.0 216a) may have one or more virtual dies per die and one or more dies per package and one or more packages stacked vertically and each virtual die may be accessed independently. In another embodiment, a solid-state storage element SSS 0.0 216a may have one or more virtual dies per die and one or more dies per package with some or all of the one or more dies stacked vertically and each virtual die may be accessed independently.

In one embodiment, two dies are stacked vertically with four stacks per group to form eight storage elements (e.g., SSS 0.0-SSS 8.0) 216a, 218a . . . 220a, each in a separate bank 214*a*, 214*b* . . . 214*n*. In another embodiment, 24 storage elements (e.g., SSS 0.0-SSS 0.24) 216*a*, 216*b*, . . . 216*m* form a logical bank 214*a* so that each of the eight logical banks has 24 storage elements (e.g., SSS0.0-SSS 8.24) 216, 218, 220. Data is sent to the solid-state storage media 110 over the storage I/O bus 210 to all storage elements of a particular group of storage elements (SSS 0.0-SSS 8.0) 216*a*, 218*a*, 220*a*. The storage control bus 212*a* is used to select a particular bank (e.g., Bank 0 214*a*) so that the data received over the storage I/O bus 210 connected to all banks 214 is written just to the selected bank 214*a*.

In one embodiment, the storage I/O bus 210 is comprised of one or more independent I/O buses ("IIOBa-m" comprising 210*a.a-m* . . . 210*n.a-m*) wherein the solid-state storage elements within each column share one of the independent I/O buses that are connected to each solid-state storage element 216, 218, 220 in parallel. For example, one independent I/O bus 210*a.a* of the storage I/O bus 210*a* may be physically connected to a first solid-state storage element 216*a*, 218*a*, 220*a* of each bank 214*a-n*. A second independent I/O bus 210*a.b* of the storage I/O bus 210*b* may be physically connected to a second solid-state storage element 216*b*, 218*b*, 220*b* of each bank 214*a-n*. Each solid-state storage element 216*a*, 216*b*, 216*m* in a bank 214*a* (a row of solid-state storage elements as illustrated in FIG. 2) may be accessed simultaneously and/or in parallel. In one embodiment, where solid-state storage elements 216, 218, 220 comprise stacked packages of dies, all packages in a particular stack are physically connected to the same independent I/O bus. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214*a-n* are independently selected using the storage control bus 212. In one embodiment, a bank 214 is selected using a chip enable or chip select. Where both chip select and chip enable are available, the storage control bus 212 may select one package within a stack of packages. In other embodiments, other commands are used by the storage control bus 212 to individually select one package within a stack of packages. Solid-state storage elements 216, 218, 220 may also be selected through a combination of control signals and address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2048 bytes ("2 kB"). In one example, a solid-state storage element (e.g., SSS 0.0) includes two registers and can program two pages so that a two-register solid-state storage element 216, 218, 220 has a capacity of 4 kB. A bank 214 of 20 solid-state storage elements 216*a*, 216*b*, 216*m* would then have an 80 kB capacity of pages accessed with the same address going out the independent I/O buses of the storage I/O bus 210.

This group of pages in a bank 214 of solid-state storage elements 216*a*, 216*b*, . . . 216*m* of 80 kB may be called a logical page or virtual page. Similarly, an erase block of each storage element 216*a*, 216*b*, . . . 216*m* of a bank 214*a* may be grouped to form a logical erase block (which may also be called a virtual erase block). In certain embodiments, a logical page and/or a logical erase block may span banks 214. For example, in one embodiment, a logical page may not span banks 214 or cross boundaries between banks 214 (e.g. is formatted to fit evenly within a bank 214) but a logical erase block may span banks 214, cross boundaries between banks 214, or the like. In one embodiment, an erase block of pages within a solid-state storage element is erased when an erase command is received within the solid-state storage element. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, wherein the packet is intended to be written to a location within a particular page which is specific to a particular physical erase block of a particular storage element of a particular bank, a physical address is sent on the storage I/O bus 210 and is followed by the packet. The physical address contains enough information for the solid-state storage element 216 to direct the packet to the designated location within the page. Since all storage elements in a column of storage elements (e.g., SSS 0.0-SSS N.0 216*a*, 218*a*, . . . 220*a*) are connected to the same independent I/O bus (e.g., 210*.a.a*) of the storage I/O bus 210*a*, to reach the proper page and to avoid writing the data packet to similarly addressed pages in the column of storage elements (SSS 0.0-SSS N.0 216*a*, 218*a*, . . . 220*a*), the bank 214*a* that includes the solid-state storage element SSS 0.0 216*a* with the correct page where the data packet is to be written is selected by the storage control bus 212*a* and other banks 214*b* . . . 214*n* of the solid-state storage 110*a* are deselected.

Similarly, satisfying a read command on the storage I/O bus 210 requires a signal on the storage control bus 212 to select a single bank 214*a* and the appropriate page within that bank 214*a*. In one embodiment, a read command reads an entire page, and because there are multiple solid-state storage elements 216*a*, 216*b*, . . . 216*m* in parallel in a bank 214*a*, an entire logical page is read with a read command. However, the read command may be broken into subcommands, as will be explained below with respect to bank interleave. Similarly, an entire logical page may be written to the solid-state storage elements 216*a*, 216*b*, . . . 216*m* of a bank 214*a* in a write operation.

An erase block erase command may be sent out to erase an erase block over the storage I/O bus 210 with a particular erase block address to erase a particular erase block. Typically, storage controller 104*a* may send an erase block erase command over the parallel paths (independent I/O buses 210*a-n.a-m*) of the storage I/O bus 210 to erase a logical erase block, each with a particular erase block address to erase a particular erase block. Simultaneously, a particular bank (e.g., Bank 0 214*a*) is selected over the storage control bus 212 to prevent erasure of similarly addressed erase blocks in non-selected banks (e.g., Banks 1-N 214*b-n*). Alternatively, no particular bank (e.g., Bank 0 214*a*) is selected over the storage control bus 212 (or all of the banks are selected) to enable erasure of similarly addressed erase blocks in all of the banks (Banks 1-N 214*b-n*) in parallel. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage media 110. For example, storage controller 104*a* streams packets to storage write buffers of a bank 214*a* of storage elements 216 and, when the buffers are full, the packets are programmed to a designated logical page. Storage controller 104*a* then refills the storage write buffers with packets and, when full, the packets are written to the next logical page. The next logical page may be in the same bank 214*a* or another bank (e.g., 214*b*). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the solid-state storage media 110. When a copy is made, a new copy of the requested data is created and a new entry is created in the index mapping the new copy of the requested data to the original packets. The new copy of the requested data is also written to the solid-state storage media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the solid-state storage media 110 and allows the solid-storage device controller 202 to monitor storage hot spots and level usage of the various logical pages in the solid-state storage media 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222*a-n*, a master controller 224, a DMA controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the host computing system 114 or may be other devices.

Typically, the solid-state storage controller(s) 104 communicate data to the solid-state storage media 110 over a storage I/O bus 210. In a typical embodiment where the solid-state storage is arranged in banks 214 and each bank 214 includes multiple storage elements 216*a*, 216*b*, 216*m* accessed in parallel, the storage I/O bus 210 is an array of busses, one for each column of storage elements 216, 218, 220 spanning the banks 214. As used herein, the term "storage I/O bus" may refer to one storage I/O bus 210 or an array of independent data busses wherein individual data busses of the array independently communicate different data relative to one another. In one embodiment, each storage I/O bus 210 accessing a column of storage elements (e.g., 216*a*, 218*a*, 220*a*) may include a logical-to-physical mapping for storage divisions (e.g., erase blocks) accessed in a column of storage elements 216*a*, 218*a*, 220*a*. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222*a-n* controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically, the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104*a*-104*n*-1 and associated solid-state storage media 110*a*-110*n*-1 while at least one channel (solid-state storage controller 104*n*, solid-state storage media 110*n*) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a host computing system 114 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/solid-state storage device controller 202 manages multiple data storage devices/solid-state storage media 110a-n, the master controller 224 divides the work load among internal controllers, such as the solid-state storage controllers 104a-n. For example, the master controller 224 may divide an object to be written to the data storage devices (e.g., solid-state storage media 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a host computing system 114 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in a computer such as the host computing system 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a host computing system 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g., switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple logical devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228, which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition, the DMA controller 226 may also control RDMA operations with requesting devices through a NIC 244 and associated RDMA controller 246.

In one embodiment, the solid-state storage device controller 202 includes a management controller 234 connected to a management bus 236. Typically, the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically, the management bus 236 is connected to the various components within the storage device/solid-state storage device 102. The management controller 234 may communicate alerts, interrupts, etc. over the local bus 206 or may include a separate connection to a system bus 240 or other bus. In one embodiment, the management bus 236 is an Inter-Integrated Circuit ("I2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically, where the solid-state device controller 202 or master controller 224 is/are configured using a FPGA or other configurable controller, custom logic may be included based on a particular application, customer requirement, storage requirement, etc.

Data Pipeline

Figure 3:
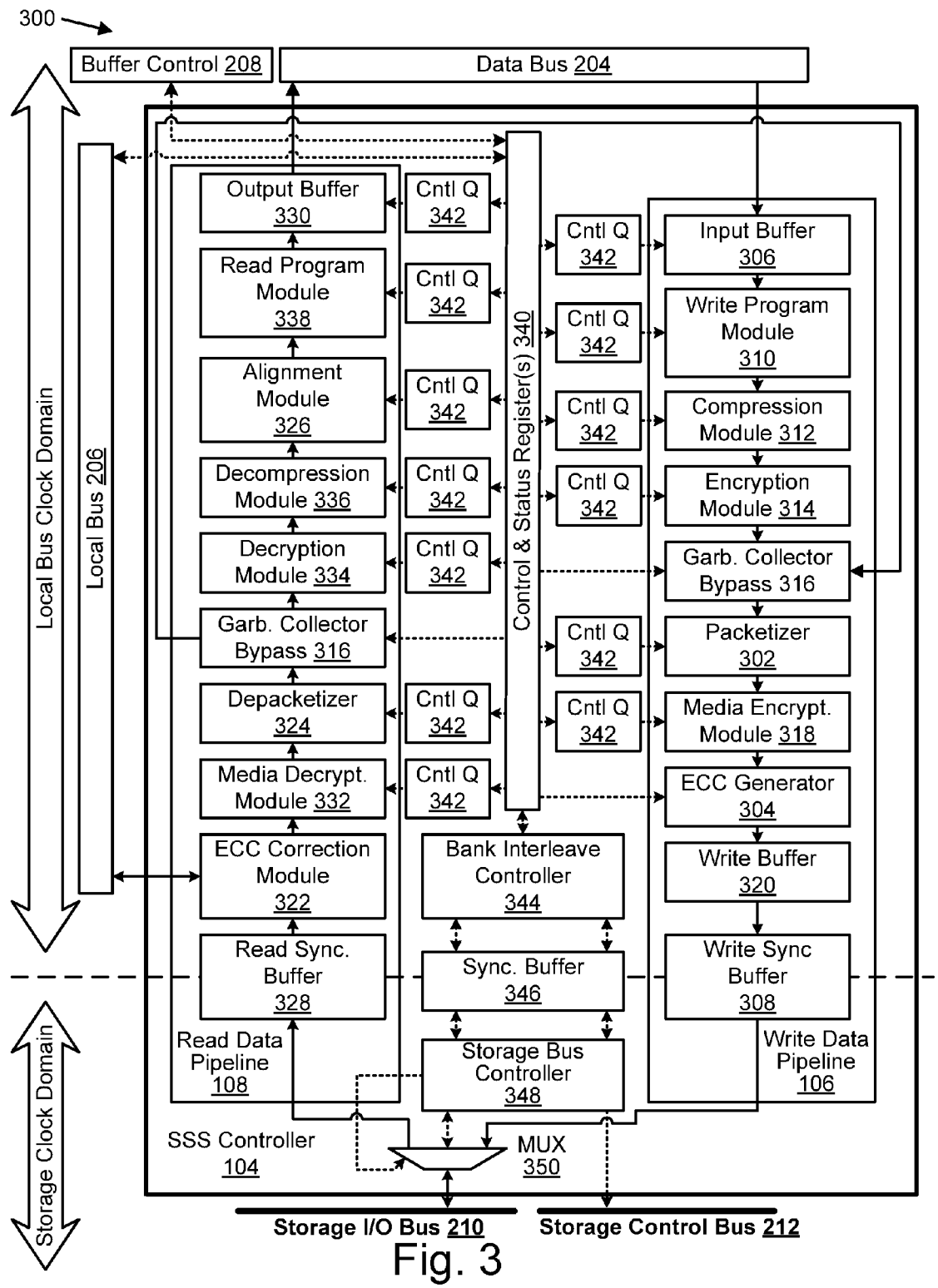
FIG. 3 is a schematic block diagram illustrating one embodiment of a solid-state storage controller with a write data pipeline and a read data pipeline in a data storage device.

FIG. 3 is a schematic block diagram illustrating one embodiment 300 of a solid-state storage controller 104 with a write data pipeline 106, and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an ECC generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the host computing system 114, or other computer or device and is transmitted to the solid-state storage device 102 in data segments streamed to the solid-state storage device 102. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicate the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error-correcting algorithm to generate ECC check bits, which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended, and output as an encoded block of length N+S. The value of N and S are dependent upon the characteristics of the ECC algorithm, which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically, when the write data pipeline 106 does not include an input buffer 306, a buffering function is performed elsewhere, such as in the solid-state storage device 102 but outside the write data pipeline 106, in the host computing system 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synchronization buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, solid-state storage device 102, or server, the contents of the solid-state storage media 110 typically could not be read without use of the same encryption key used during the write of the data to the solid-state storage media 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a host computing system 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The solid-sate storage device 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a host computing system 114, another computer, key manager, or other device that holds the encryption key to be used to encrypt the data segment. In one embodiment, encryption keys are transferred to the solid-state storage controller 104 from one of a solid-state storage device 102, host computing system 114, computer, or other external agent, which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102, if the solid-state storage media 110 is connected to a different solid-state storage controller 104, solid-state storage device 102, or host computing system 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that computing systems 114 or other devices writing data to the solid-state storage device 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section (e.g., an erase block) of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by computing systems 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the logical page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one logical page in the solid-state storage media 110. This allows a write operation to send an entire logical page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full logical page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again, this is inefficient because multiple write/program cycles are required to fill a page.

For depicted embodiment with a write buffer 320 sized larger than a logical page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a logical page of data segments. One of skill in the art will recognize other write buffer 320 configurations that allow a logical page of data to be stored prior to writing the data to the solid-state storage media 110.

In another embodiment, the write buffer 320 is sized smaller than a logical page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a logical page prior to programming the data. In this way, a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically, the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a host computing system 114, a client, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4A:
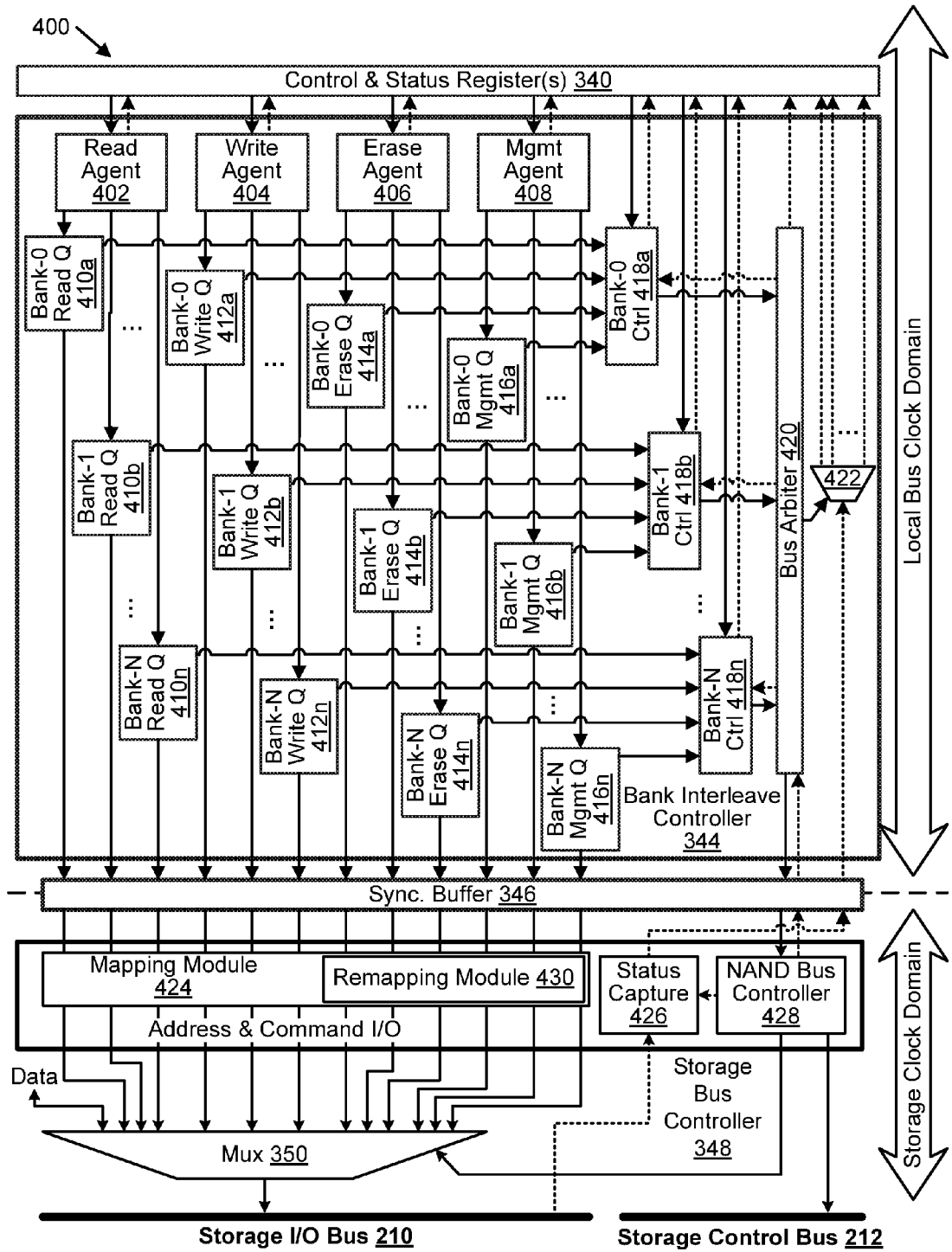
FIG. 4A is a schematic block diagram illustrating one embodiment of a bank interleave controller in a solid-state storage controller.

The solid-state storage controller 104 and or solid-state storage device 102 may also include a bank interleave controller 344, a synchronization buffer 346, a storage bus controller 348, and a multiplexer ("MUX") 350, which are described in relation to FIG. 4A.

Bank Interleave

FIG. 4A is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 304 and coordinates among the banks 214 of the solid-state storage media 110 execution of the commands stored in the queues, such that a command of a first type executes on one bank 214a while a command of a second type executes on a second bank 214b. In one embodiment, the one or more commands may be separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read commands, discard/TRIM commands, and write commands and queues 410, 412 (e.g., I/O operations), but may also include other commands and queues that are storage media specific. For example, in the embodiment depicted in FIG. 4A, erase and management queues 414, 416 are included and would be appropriate for flash memory, NRAM, MRAM, DRAM, PRAM, etc. In other words, while an erase command is a type of storage device management operation, the interleave controller 344 may include a separate erase queue 414 for such commands. In other embodiments, discard/TRIM, erase, and other similar commands are other examples of storage device management operations. In certain embodiments, the interleave controller 344 uses one of a variety of scheduling algorithms to ensure that the scarce resource (access to a bank) is most efficiently scheduled.

For other types of solid-state storage media 110, other types of commands and corresponding queues may be included without straying from the scope of the invention. The flexible nature of an FPGA solid-state storage controller 104 allows flexibility in what type of storage media is used. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4A, the bank interleave controller 344 includes, for each bank 214, a read queue 410 for commands to read data from the solid-state storage media 110, a write queue 412 for write commands to the solid-state storage media 110, an erase queue 414 for commands to erase an erase block in the solid-state storage, and a management queue 416 for management operations. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management operations, status requests, and the like, such as a reset command or a request to read a configuration register of a bank 214, such as bank-0 214a. The management agent 408 sends the management operation to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

In one embodiment, the bank interleave controller 344 may coordinate with the agents 402, 404, 406, 408 to monitor storage requests received by the control and status registers 340. In certain embodiments, the bank interleave controller 344 may monitor storage requests to identify the storage requests and determine whether the ordering of the storage request in the queues 410, 412, 414, 416 satisfy an operation order criteria. An operation order criteria is criteria for controlling the order of operation execution within the solid-state storage controller 104. In one embodiment, the order of operation execution may be managed by the bank interleave controller 344.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. In certain embodiments, the subcommands comprise multi-phase commands. Additionally, in conjunction with example write command, the storage bus controller 348 will cause the one or more commands to be multiplied to each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. As described above, the bus arbiter 420 cooperates with the bank interleave controller 344 such that the desired operation execution order is accomplished. Of course re-adjusting execution order may be performed by ordering operations in a bank queue 418 or defining an order or prioritization for how the bus arbiter 420 selects the operations from a bank queue 418. In another embodiment, the bus arbiter 420 may respond to a high-level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management operations, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue, which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write subcommand on the storage I/O bus 210, which contains the physical addresses including the address of the logical erase block for each individual physical erase block of solid-stage storage element 216a-m as mapped from the logical erase block address. The storage bus controller 348 then multiplexes the write buffer 320 through the write synchronization buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a logical erase block of a bank 214a. While Bank 0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

Figure 4B:
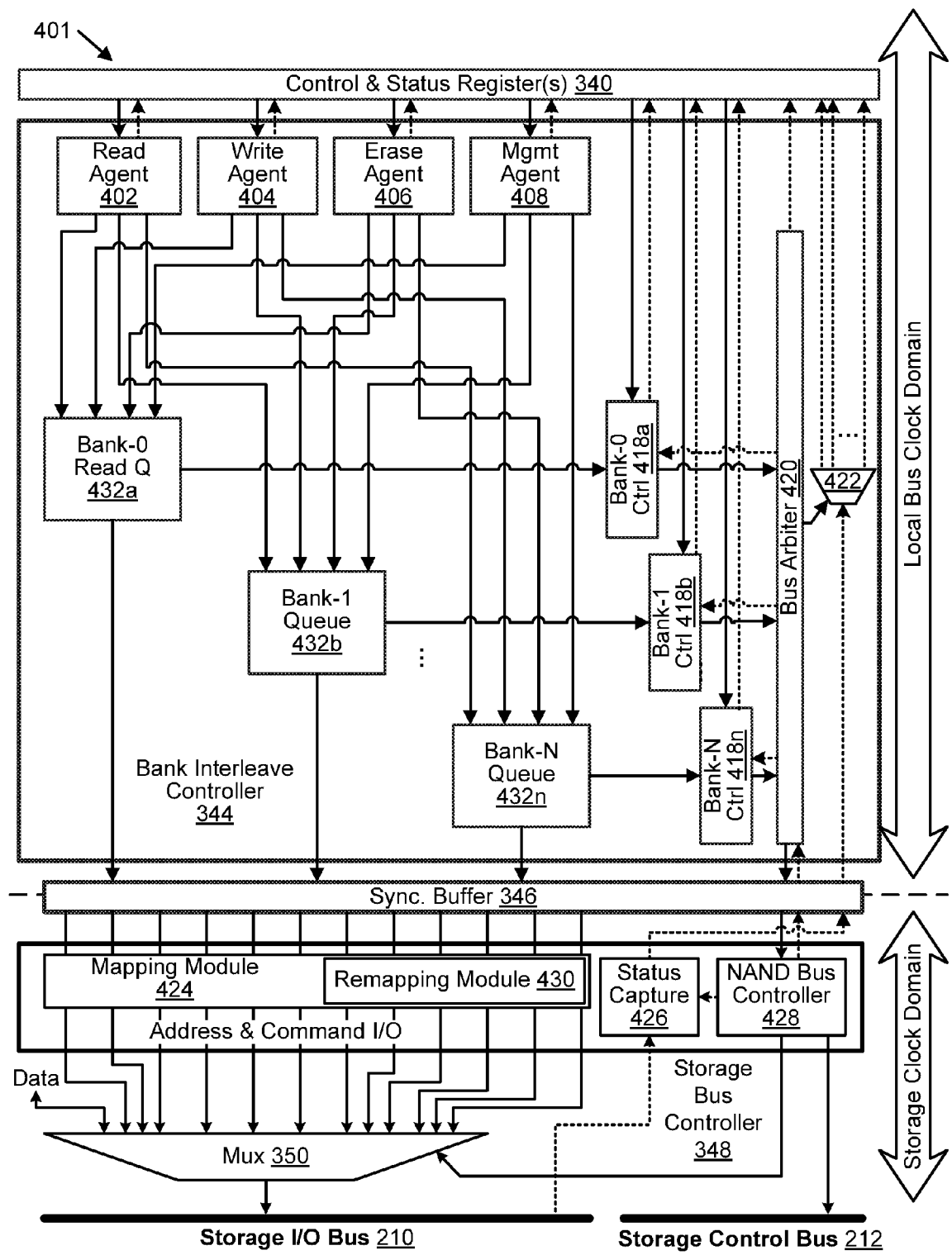
FIG. 4B is a schematic block diagram illustrating an alternate embodiment of a bank interleave controller in the solid-state storage controller.

FIG. 4B is a schematic block diagram illustrating an alternate embodiment 401 of a bank interleave controller in the solid-state storage controller in accordance with the present invention. The components 210, 212, 340, 346, 348, 350, 402-430 depicted in the embodiment shown in FIG. 4B are substantially similar to the bank interleave apparatus 400 described in relation to FIG. 4A except that each bank 214 includes a single queue 432a-n and the read commands, write commands, erase commands, management operations, etc. for a bank (e.g., Bank-0 214a) are directed to a single queue 432a for the bank 214a. The queues 432, in one embodiment, are FIFO. In another embodiment, the queues 432 can have commands pulled from the queues 432 in an order other than the order they were stored. In another alternate embodiment (not shown), the read agent 402, write agent 404, erase agent 406, and management agent 408 may be combined into a single agent assigning commands to the appropriate queues 432a-n.

In another alternate embodiment (not shown), commands are stored in a single queue where the commands may be pulled from the queue in an order other than how they are stored so that the bank interleave controller 344 can execute a command on one bank 214a while other commands are executing on the remaining banks 214b-n. One of skill in the art will easily recognize other queue configurations and types to enable execution of a command on one bank 214a while other commands are executing on other banks 214b-n.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216a-m, 218a-m, 220a-m. For example, one bank interleave controller 344 serves one column of storage elements SSS 0.0-SSS N.0 216a, 218a, . . . 220a, a second bank interleave controller 344 serves a second column of storage elements SSS 0.1-SSS N.1 216b, 218b, . . . 220b etc.
Storage-Specific Components The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage media 110. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each column of solid-state storage elements (e.g., SSS 0.0 216a, SSS 1.0 218a, SSS N.0 220a). A MUX 350 combines data from the write data pipeline 106 and commands sent to the solid-state storage media 110 via the storage I/O bus 210 and separates data to be processed by the read data pipeline 108 from commands. Packets stored in the write buffer 320 are directed on busses out of the write buffer 320 through a write synchronization buffer 308 for each column of solid-state storage elements (SSS 0.x to SSS N.x 216, 218, 220) to the MUX 350 for each column of solid-state storage elements (SSS 0.x to SSS N.x 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage media 110 with an array of twenty storage elements (e.g., SSS 0.0 to SSS 0.M 216) per bank 214*a* may have a logical address for a particular logical erase block mapped to twenty physical addresses of twenty physical erase blocks, one physical address per storage element. Because the storage elements are accessed in parallel, erase blocks at the same position in each storage element in a column of storage elements 216*a*, 218*a*, 220*a* will have the same physical address. To select one erase block (e.g., in storage element SSS 0.0 216*a*) instead of all erase blocks in the column (e.g., in storage elements SSS 0.0, SSS 1.0, . . . SSS N.0 216*a*, 218*a*, 220*a*), one bank (in this case Bank 0 214*a*) is selected.

This logical-to-physical mapping for erase blocks is beneficial because if one physical erase block becomes damaged or inaccessible, the mapping can be changed so that the logical erase block maps to another physical erase block instead of the damaged physical erase block. This mitigates the impact of losing an entire logical erase block when one element's physical erase block is faulty. The remapping module 430 changes a mapping of a logical address of a logical erase block to one or more physical addresses of a physical erase blocks making up the logical erase block (the physical erase blocks being spread over the array of storage elements). A logical erase block may be mapped to a set of physical erase blocks in a single bank. For example, logical erase block 1 may be mapped to physical erase block 1 of storage element SSS 0.0 216*a*, to physical erase block 1 of storage element SSS 0.1 216*b*, . . . , and to physical erase block 1 of storage element SSS 0.M 216*m*; logical erase block 2 may be mapped to physical erase block 2 of storage element SSS 1.0 218*a*, to physical erase block 2 of storage element SSS 1.1 218*b*, . . . , and to logical erase block 2 of storage element 1.M 218*m*, etc. Alternatively, a logical erase block may be mapped to a set of physical erase blocks located in multiple banks. For example, logical erase block 1 may be mapped to one physical erase block from each storage element in an array such that logical erase block 1 includes physical erase blocks from Bank 0 214*a* (e.g., physical erase block 1 of storage element SSS 0.0 216*a*, physical erase block 1 of storage element SSS 0.1 216*b*, . . . , and physical erase block 1 of storage element 0.M 216*m*), physical erase blocks from Bank 1 214*b* (e.g., physical erase block 1 of storage element SSS 1.0 218*a*, physical erase block 1 of storage element SSS 1.1 218*b*, . . . , and physical erase block 1 of storage element 1.M 218*m*), and so on up to physical erase blocks from Bank N 214*n*, which may include, for example erase block 1 of storage element N.M 220*m*.

If, for example, erase block 1 of storage element SSS 0.0 216*a* is damaged, experiencing errors due to wear, etc., or cannot be used for some reason, the remapping module 430 could change the logical-to-physical mapping for the logical address of logical erase block 1 that pointed to physical erase block 1. If a spare physical erase block (call it erase block 221) of storage element SSS 0.0 216*a* is available and currently not mapped, the remapping module 430 could change the mapping of logical erase block 1 to point to physical erase block 221 of storage element SSS 0.0 216*a*, while continuing to point to physical erase block 1 of storage element SSS 0.1 216*b*, physical erase block 1 of storage element SSS 0.2 216*c* (not shown). . . , and physical erase block 1 of storage element M.0 216*m*. The mapping module 424 or remapping module 430 could map erase blocks in a prescribed order (e.g., logical erase block 1 to physical erase block 1 of the storage elements, logical erase block 2 to physical erase block 2 of the storage elements, etc.) or may map physical erase blocks of the storage elements 216, 218, 220 in another order based on some other criteria.

In one embodiment, the physical erase blocks could be grouped into a logical erase block by access time. Grouping by access time, meaning time to execute a command, such as programming (writing) data into pages of specific physical erase blocks, can level command completion so that a command executed across the physical erase blocks of a logical erase block is not limited by the slowest physical erase block. In other embodiments, the physical erase blocks may be grouped into a logical erase block by wear level, health, etc. One of skill in the art will recognize other factors to consider when mapping or remapping physical erase blocks into logical erase blocks.

In one embodiment, the storage bus controller 348 includes a status capture module 426 that receives status messages from the solid-state storage media 110 and sends the status messages to the status MUX 422. In another embodiment, when the solid-state storage media 110 is flash memory, the storage bus controller 348 includes a NAND bus controller 428. The NAND bus controller 428 directs commands from the read and write data pipelines 106, 108 to the correct location in the solid-state storage media 110, coordinates timing of command execution based on characteristics of the flash memory, etc. If the solid-state storage media 110 is another solid-state storage type, the NAND bus controller 428 would be replaced by a bus controller specific to the storage type. One of skill in the art will recognize other functions of a NAND bus controller 428.

Figure 5:
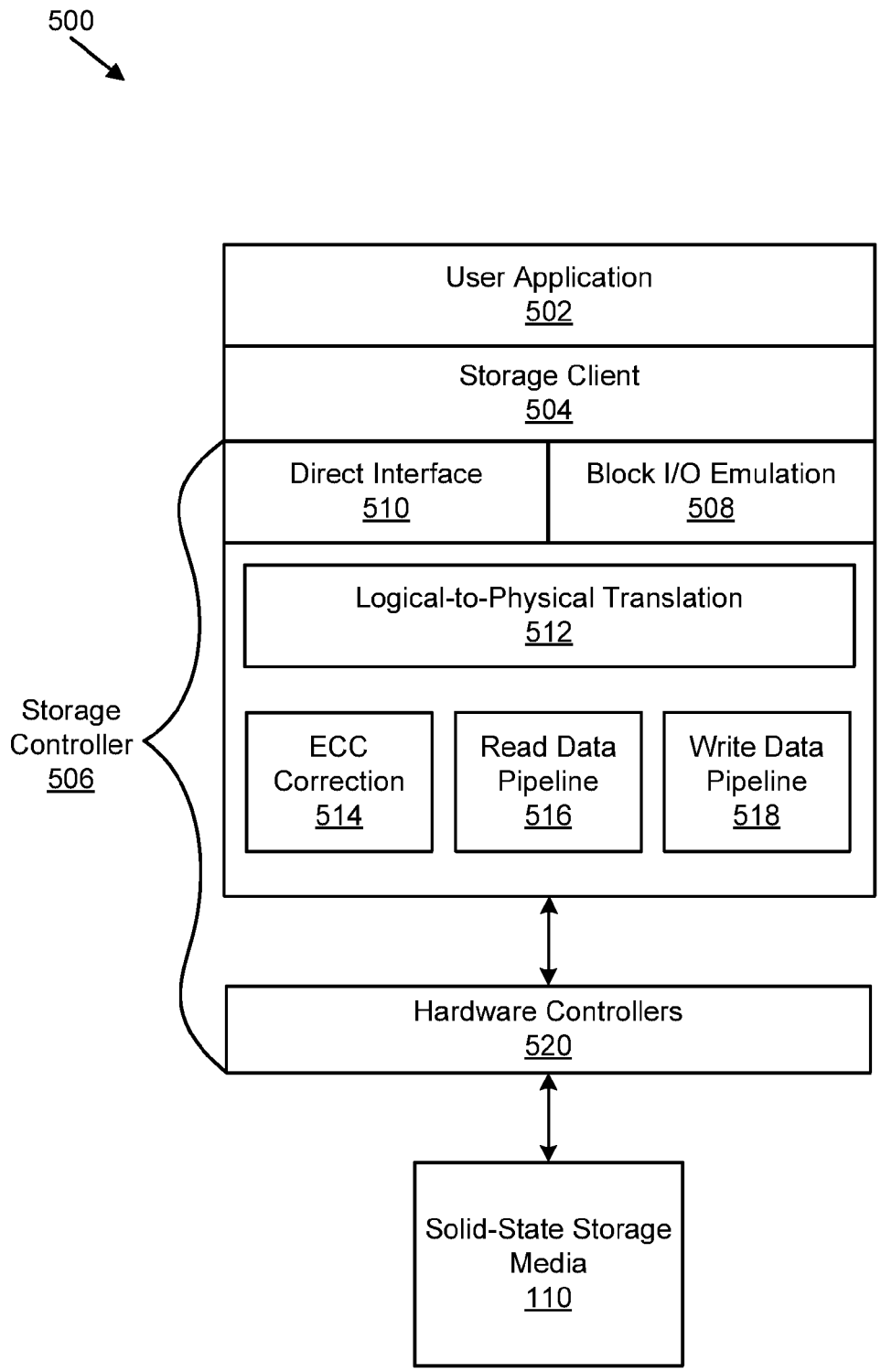
FIG. 5 is a schematic block diagram illustrating one embodiment of a logical representation of a solid-state storage controller with a logical-to-physical translation layer.

FIG. 5 is a schematic block diagram illustrating a logical representation 500 of a solid-state storage controller 506 with a logical-to-physical translation layer 512 in accordance with the present invention. The storage controller 506 may be similar, in certain embodiments, to the solid-state storage controller 104 depicted in FIG. 1A and may include one or more solid-state storage controllers 104. The depicted embodiment shows a user application 502 in communication with a storage client 504. The storage client 504 is in communication with a storage controller 506 that includes the logical-to-physical translation layer 512, an ECC correction module 514, a read data pipeline 516, and a write data pipeline 518.

The storage controller 506 manages solid-state storage media 110. The storage controller 506 may include various hardware and software controllers, drivers, and software, such as the depicted hardware controllers 520.

In one embodiment, the depicted hardware controllers 520 may be substantially similar to and include similar functionality as the solid-state controllers 104 and accompanying controllers and modules depicted in FIGS. 1A and 2 and/or the bank interleave controller 344 and storage bus controller 348 depicted in FIGS. 3, 4A, and 4B. Furthermore, the ECC correction module 514 may be substantially similar and include similar functionality to the ECC correction module 322 and/or the ECC generator 304 depicted in FIG. 3. In addition, the read data pipeline 516 and the write data pipeline 518 may be substantially similar to the read data pipeline 108 and the write data pipeline 106 depicted in FIG. 3. The solid-state storage array may include an array of solid-state storage banks similar to the solid-state storage media 110 and corresponding solid-state storage banks 214 depicted in FIG. 2.

In one embodiment, the user application 502 is a software application operating on or in conjunction with the storage client 504. The storage client 504 manages files and data and utilizes the functions and features of the storage controller 506 and associated solid-state storage array. Representative examples of storage clients include, but are not limited to, a server, a file system, an operating system, a database management system ("DBMS"), a volume manager, and the like.

The storage client 504 is in communication with the storage controller 506. In one embodiment, the storage client 504 communicates through an Input/Output (I/O) interface represented by a block I/O emulation layer 508.

Certain conventional block storage devices divide the storage media into volumes or partitions. Each volume or partition may include a plurality of sectors. One or more sectors are organized into a logical block. In certain storage systems, such as those interfacing with the Windows® operating systems, the logical blocks are referred to as clusters. In other storage systems, such as those interfacing with UNIX, Linux, or similar operating systems, the logical blocks are referred to simply as blocks. A logical block or cluster represents a smallest physical amount of storage space on the storage media that is managed by the storage manager. A block storage device may associate n logical blocks available for user data storage across the storage media with a logical block address, numbered from 0 to n. In certain block storage devices, the logical block addresses may range from 0 to n per volume or partition. In conventional block storage devices, a logical block address maps directly to a particular logical block. In conventional block storage devices, each logical block maps to a particular set of physical sectors on the storage media.

However, certain storage devices 102 do not directly or necessarily associate logical block addresses with particular physical blocks. These storage devices 102 may emulate a conventional block storage interface to maintain compatibility with block storage clients 504.

When the storage client 504 communicates through the block I/O emulation layer 508, the storage device 102 appears to the storage client 504 as a conventional block storage device. In one embodiment, the storage controller 506 provides a block I/O emulation layer 508, which serves as a block device interface, or API. In this embodiment, the storage client 504 communicates with the storage device 102 through this block device interface. In one embodiment, the block I/O emulation layer 508 receives commands and logical block addresses from the storage client 504 in accordance with this block device interface. As a result, the block I/O emulation layer 508 provides the storage device 102 compatibility with block storage clients 504.

In one embodiment, a storage client 504 communicates with the storage controller 506 through a direct interface layer 510. In this embodiment, the storage device 102 directly exchanges information specific to non-volatile storage devices. A storage device 102 using direct interface 510 may store data on the solid-state storage media 110 as blocks, sectors, pages, logical blocks, logical pages, erase blocks, logical erase blocks, ECC chunks, logical ECC chunks, or in any other format or structure advantageous to the technical characteristics of the solid-state storage media 110. The storage controller 506 receives a logical address and a command from the storage client 504 and performs the corresponding operation in relation to the non-volatile solid-state storage media 110. The storage controller 506 may support a block I/O emulation layer 508, a direct interface 510, or both a block I/O emulation layer 508 and a direct interface 510.

As described above, certain storage devices, while appearing to a storage client 504 to be a block storage device, do not directly associate particular logical block addresses with particular physical blocks, also referred to in the art as sectors. Such storage devices may use a logical-to-physical translation layer 512. The logical-to-physical translation layer 512 provides a level of abstraction between the logical block addresses used by the storage client 504, and the physical block addresses at which the storage controller 506 stores the data. The logical-to-physical translation layer 512 maps logical block addresses to physical block addresses of data stored on solid-state storage media 110. This mapping allows data to be referenced in a logical address space using logical identifiers, such as a logical block address. A logical identifier does not indicate the physical location of data on the solid-state storage media 110, but is an abstract reference to the data.

The storage controller 506 manages the physical block addresses in the physical address space. In one example, contiguous logical block addresses may in fact be stored in non-contiguous physical block addresses as the logical-to-physical translation layer 512 determines the location on the solid-state storage media 110 to perform data operations.

Furthermore, in one embodiment, the logical address space is substantially larger than the physical address space. This "thinly provisioned" or "sparse address space" embodiment, allows the number of logical identifiers for data references to greatly exceed the number of possible physical addresses. Specifically, the logical address space may be "sparse" and, as such, may comprise a logical capacity that exceeds the physical storage capacity of the solid-state storage media 110. Accordingly, the logical address space may be defined independent of the solid-state storage media 110; the logical address space may present a larger address space than the physical storage capacity of the solid-state storage media 110, may present different storage location partitions and/or block sizes than provided by the solid-state storage media 110, and so on.

The storage controller 506 may support a sparse address space by writing data using a log-based, append only writing structure. Specifically, the storage controller 506, in one embodiment, writes data of a write request to physical storage media of the solid-state storage media 110 at one or more logical addresses of the physical storage media corresponding to the addresses of the write request as mapped by the logical-to-physical translation layer 512. In a further embodiment, the storage controller 506 writes the data of the write request by appending the data to a sequential, log-based writing structure of the physical storage media of the solid-state storage media 110 at an append point. The storage controller 506, in one embodiment, returns one or more physical addresses corresponding to the append point and the logical-to-physical translation layer 512 maps the one or more logical addresses to the one or more physical addresses corresponding to the append point.

As the storage controller 506 clears, trims, replaces, expires, and/or evicts, data from the physical addresses and associated physical storage media, the solid-state storage media 110 in the depicted embodiment, are freed to store data for other logical addresses. In one embodiment, the storage controller 506 stores data at the physical addresses using a log-based, append only writing structure such that data overwritten by a subsequent write request invalidates other data in the log. Consequently, a garbage collection process recovers the physical capacity of the invalid data in the log. One embodiment of the log-based, append only writing structure is a logically ring-like data structure, as new data is appended to the log-based writing structure, previously used physical capacity is reused in a circular, theoretically infinite manner.

In one embodiment, the logical-to-physical translation layer 512 includes a map or index, a "forward map," that maps logical block addresses to physical block addresses. Often logical addresses used to identify stored data represent a very small number of logical addresses that are possible within a name space or range of possible logical addresses. Searching this sparsely populated space may be cumbersome. For this reason, the forward map is typically a data structure that facilitates quickly traversing the forward map to find a physical address based on a logical address. For example, the forward map may include a B-tree, a content addressable memory ("CAM"), a binary tree, a hash table, or other data structure that facilitates quickly searching a sparsely populated space or range. By using a forward map that quickly searches a sparsely populated logical namespace or address space, the logical-to-physical translation layer 512 provides an efficient way to determine one or more physical addresses from a logical address. In certain embodiments, the logical-to-physical translation layer 512 is a tree with nodes that represent logical block addresses and comprise corresponding physical block addresses.

In one embodiment, the forward map binds, in a logical-to-physical map, bound LBAs to physical storage locations. The storage controller 506 may determine if the logical space has sufficient unallocated logical space using the logical-to-physical map. The logical-to-physical map may be used to track allocation of bound LBAs, unbound LBAs, allocated LBAs, unallocated LBAs, allocated LBA capacity, unallocated LBA capacity, and the like. In one embodiment, the forward map binds LBAs to corresponding physical storage location addresses in multiple maps.

The forward map, the sparse logical address space, and the log-based writing are described in further detail in U.S. patent application Ser. No. 12/986,117 entitled "Apparatus, System, and Method for a Virtual Storage Layer" filed 6 Jan. 2011, for David Flynn et al., and U.S. Provisional Patent Application Ser. No. 61/373,271 entitled "Apparatus, System, and Method for Caching Data" filed 12 Aug. 2010, for David Flynn, which are hereby incorporated by reference.

As stated above, in conventional block storage devices, a logical block address maps directly to a particular physical block. When a storage client 504 communicating with the conventional block storage device deletes data for a particular logical block address, the storage client 504 may note that the particular logical block address is deleted and can re-use the physical block associated with that deleted logical block address without the need to perform any other action.

Conversely, when a storage client 504, communicating with a storage controller 104 with a logical-to-physical translation layer 512 (a storage controller 104 that does not map a logical block address directly to a particular physical block), deletes a logical block address, the corresponding physical block address remains allocated because the storage client 504 does not communicate the change in used blocks to the storage controller 506. The storage client 504 may not be configured to communicate changes in used blocks (also referred to herein as "data block usage information"). Because the storage client 504 uses the block I/O emulation 508 layer, the storage client 504 may erroneously believe that the storage controller 506 is a conventional storage controller that would not utilize the data block usage information. Or, in certain embodiments, other software layers between the storage client 504 and the storage controller 506 may fail to pass on data block usage information.

Consequently, the storage controller 104 preserves the relationship between the logical block address and a physical address and the data on the storage device 102 corresponding to the physical block. As the number of allocated blocks increases, the performance of the storage controller 104 may suffer depending on the configuration of the storage controller 104.

Specifically, in certain embodiments, the storage controller 506 is configured to store data sequentially, using an append-only writing process, and use a storage space recovery process that re-uses non-volatile storage media storing deallocated/unused logical blocks. Specifically, as described above, the storage controller 506 may sequentially write data on the solid-state storage media 110 in a log structured format and within one or more physical structures of the storage elements, the data is sequentially stored on the solid-state storage media 110.

As a result of storing data sequentially and using an append-only writing process, the storage controller 506 achieves a high write throughput and a high number of I/O operations per second ("IOPS"). The storage controller 506 includes a storage space recovery, or garbage collection process that re-uses data storage cells to provide sufficient storage capacity. The storage space recovery process reuses storage cells for logical blocks marked as deallocated, invalid, unused, or otherwise designated as available for storage space recovery in the logical-physical translation layer 512.

As described above, the storage space recovery process determines that a particular section of storage may be recovered. Once a section of storage has been marked for recovery, the storage controller 506 may relocate valid blocks in the section. The storage space recovery process, when relocating valid blocks, copies the packets and writes them to another location so that the particular section of storage may be reused as available storage space, typically after an erase operation on the particular section. The storage controller 506 may then use the available storage space to continue sequentially writing data in an append-only fashion. Consequently, the storage controller 104 expends resources and overhead in preserving data in valid blocks. Therefore, physical blocks corresponding to deleted logical blocks may be unnecessarily preserved by the storage controller 104, which expends unnecessary resources in relocating the physical blocks during storage space recovery.

Some storage devices 102 are configured to receive messages or commands notifying the storage device 102 of these unused logical blocks so that the storage device 102 may deallocate the corresponding physical blocks. As used herein, to deallocate a physical block includes marking the physical block as invalid, unused, or otherwise designating the physical block as available for storage space recovery, its contents on storage media no longer needing to be preserved by the storage controller 506. Data block usage information, in reference to the storage controller 506, may also refer to information maintained by the storage controller 506 regarding which physical blocks are allocated and/or deallocated/unallocated and changes in the allocation of physical blocks and/or logical-to-physical block mapping information. Data block usage information, in reference to the storage controller 506, may also refer to information maintained by the storage controller 506 regarding which blocks are in use and which blocks are not in use by a storage client. Use of a block may include storing of data in the block on behalf of the client, reserving the block for use by a client, and the like.

While physical blocks may be deallocated, in certain embodiments, the storage controller 506 may not immediately erase the data on the storage media. An erase operation may be performed later in time. In certain embodiments, the data in a deallocated physical block may be marked as unavailable by the storage controller 506 such that subsequent requests for data in the physical block return a null result or an empty set of data.

One example of a command or message for such deallocation is the "Trim" function of the "Data Set Management" command under the T13 technical committee command set specification maintained by INCITS. A storage device, upon receiving a Trim command, may deallocate physical blocks for logical blocks whose data is no longer needed by the storage client 504. A storage controller 506 that deallocates physical blocks may achieve better performance and increased storage space, especially storage controllers 506 that write data using certain processes and/or use a similar data storage recovery process as that described above.

Consequently, the performance of the storage controller 506 is enhanced as physical blocks are deallocated when they are no longer needed such as through the Trim command or other similar deallocation commands issued to the storage controller 506.

Reducing the Occurrence of Uncorrectable Bit Errors

Referring to FIG. 6A, a side view and top view of a semiconductor package 602*a* is illustrated. As used herein, the term chip is equivalent to a package. Furthermore, a block diagram of package 602*a* is illustrated. Package 602*a* includes two semiconductor die 604*a* and 604*b*. In some embodiments, a package may include fewer than two or greater than two die. Each die may be a solid-state storage element (e.g., SSS 0.0 216*a*) as described above. For example, each die may be a NAND flash memory device or other non-volatile solid-state memory device. As illustrated, die 604*a* and die 604*b* are both housed in package 602*a*. In one embodiment, die 604*a* and 604*b* may share a connection to storage I/O bus 210*a*. More particularly, die 604*a* and 604*b* may share an independent I/O bus (IIOB) portion (e.g., 210*a.a*) of storage I/O bus 210*a*. IIOBs are described more fully above in the section titled "SOLID-STATE STORAGE."

For example, die 604*a* and 604*b* may both be connected to storage I/O bus 210 (e.g., via an IIOB) in parallel. Storage controller 104 may control lines 606*a* and 606*b* to determine which of die 604*a* and 604*b* uses storage I/O bus 210*a* at a particular moment in time. For example, if storage controller 104 enables line 606*a* and disables line 606*b*, die 604*a* may receive one or more commands, address information, and/or data from storage I/O bus 210 or transmit data on storage I/O bus 210 and die 604*b* may be prevented from using storage I/O bus 210. Alternatively, if storage controller 104 enables line 606*b* and disables line 606*a*, die 604*b* may receive address information and/or data from storage I/O bus 210 or transmit data on storage I/O bus 210 and die 604*b* may be prevented from using storage I/O bus 210. In one embodiment, die 604*a* may be assigned to one bank 214 and die 604*b* may be assigned to a different bank 214. For example, die 604*a* may be solid-state storage element 216*a* assigned to bank 0 214*a* and die 604*b* may be solid-state storage element 218*a* assigned to bank 1 214*b*.

Referring to FIG. 6B, a block diagram of another package 602*b* is illustrated. Package 602*b* includes four die 604*c*, 604*d*, 604*e*, and 604*f*. Die 604*c* and 604*e* may be grouped together to form die pair 608*a* and die 604*d* and 604*f* may be grouped together to form a die pair 608*b*. The die 604 of a pair 608 may share an address space so that a first portion of the address space (e.g., half of the address space) refers to memory locations on one die 604 of the pair 608 and the remaining portion of the address space refers to memory locations on the other die 604 of the pair 608. Accordingly, storage controller 104 may store data in die 604*c* of pair 608*a* when writing to one address and may store data in die 604*e* of pair 608*a* when writing to another address.

Instead of enabling one die at a time as in package 602*a*, a line 606*c* may enable die pair 608*a*, therefore enabling both die 604*c* and 604*e*, and line 606*d* may enable die pair 608*b*, therefore enabling both die 604*d* and 604*f*. Since, in this embodiment, the die 604 of a pair 608 may be enabled or disabled together, the enable line 606 alone might not be enough to select one die 604 of the pair 608 over the other die 604 of the pair 608. Accordingly, to store data in a particular die (e.g., die 6040 of package 602*b*, storage controller 104 (e.g., the address module 132, the write module 124) may enable the line (e.g., line 606*d*) associated with the pair (e.g., pair 608*b*) to which the particular die (e.g., die 6040 belongs and may then write to an address associated with the particular die (e.g., die 6040, rather than an address associated with the other die (e.g., die 604*d*) of the pair (e.g., pair 608*b*).

Referring to FIG. 6C, a side view of a stack of packages 602 and a block diagram of the stack of packages 602 is illustrated. The stack includes package 602*c* and package 602*d*. Packages 602*c* and 602*d* rest on and are electrically connected to substrate 618 (e.g., a card or circuit board). The stack of packages is referred to herein as a pad 620*a*. In some embodiments, a pad may include fewer than two or greater than two packages.

As illustrated in the block diagram, package 602*c* includes two die, more specifically, die 604*g* connected to enable line 606*g* and die 604*h* connected to enable line 606*h*. Similarly, package 602*d* includes die 604*i* connected to enable line 606*i* and die 604*k* connected to enable line 606*k*. Even though package 602*c* may be physically connected to a different data and/or address bus than package 602*d*, in one embodiment, all four of the die 604 of pad 602*a* may share a connection to storage I/O bus 210. More particularly, die 604 of pad 602*a* may share an independent I/O bus (HOB) portion of storage I/O bus 210. In some cases, only one of the die of pad 602.*a* may use storage I/O bus 210 at a time. Storage controller 104 may select the die (e.g., die 604*g*) that uses storage I/O bus 210 at any given time by enabling the line (e.g., line 606*g*) corresponding to the selected die (e.g., die 604*g*) and disabling the other lines 606.

Figure 6D:
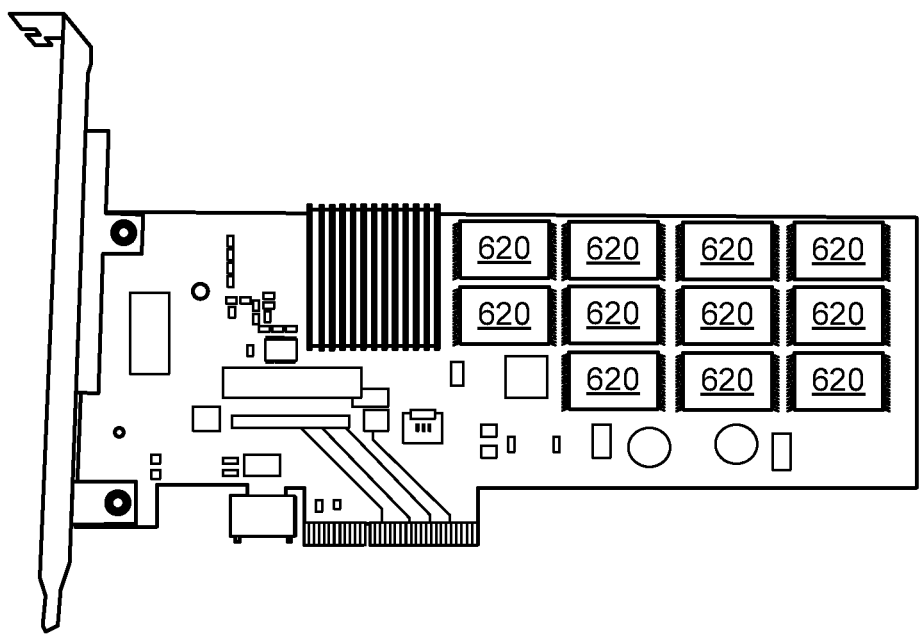
FIG. 6D is a schematic block diagram illustrating one side of an electronics card comprising a plurality of solid-state storage element pads.
Figure 6E:
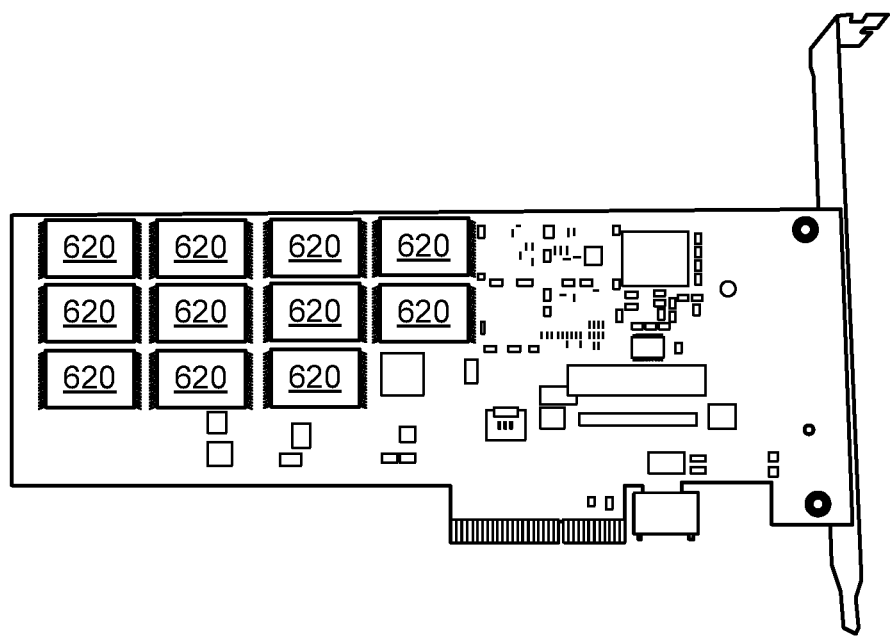
FIG. 6E is a schematic block diagram illustrating another side of the electronics card of FIG. 6D comprising a plurality of solid-state storage element pads.

In one embodiment, solid-state storage 110*a* may be twenty-two columns wide and four banks (rows) deep and have a total of eighty-eight die (twenty-two times four). This embodiment may consist of twenty-two pads, where each pad (e.g., pad 620*a*) includes four die (e.g., die 604*g*, 604*h*, 604*i*, and 604*k*) located in two different packages (e.g., packages 602*c* and 602*d*). This embodiment is depicted in FIGS. 6D and 6E. However, other embodiments are also envisioned having fewer or greater than twenty-two columns and fewer or greater than four banks. For example, in one embodiment, solid-state storage 110*a* may be twenty-five columns wide and four banks (rows) deep and have a total of one hundred die (twenty-five times four).

FIG. 6D illustrates a front side of a card implementing such an embodiment. In FIG. 6D, eleven pads 620 are depicted, each pad consisting of two packages 602. FIG. 6E illustrates the back side of the card of FIG. 6E. In FIG. 6E, eleven pads 620 are depicted, each pad consisting of two packages 602.

Figure 7:
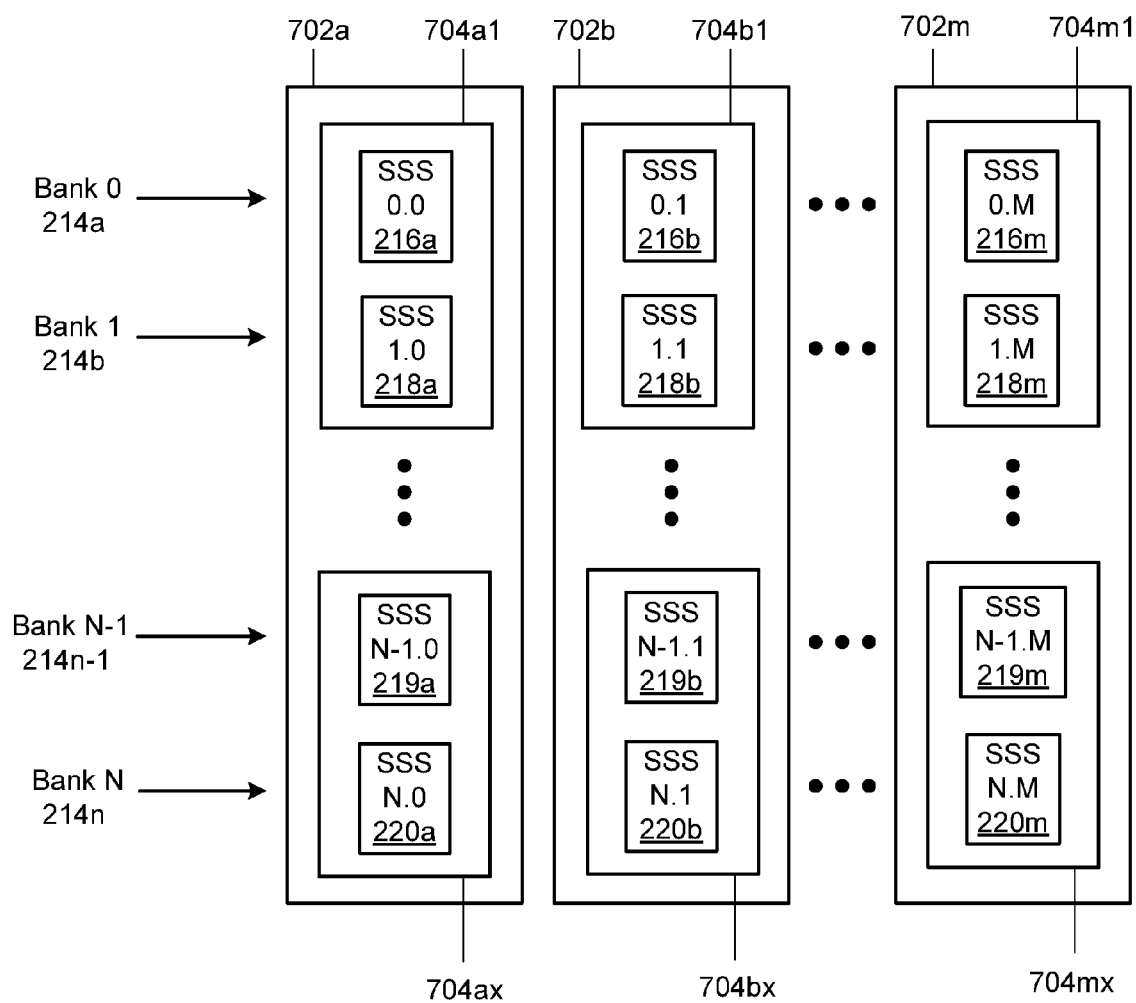
FIG. 7 is a schematic block diagram illustrating one embodiment of an array of solid-state storage elements.

FIG. 7 illustrates an arrangement of solid-state storage elements 216, 218, 219, and 220 in pads 702 according to one embodiment. Pad 702*a* may include a plurality (symbolized by the letter x) of packages 704*a*1 . . . 704*ax*. Package 704*a*1 may include two die, one acting as solid-state storage element 216*a* and one acting as solid-state storage element 218*a*. Similarly, package 704*ax* may include two die, solid-state storage element 219*a* and solid-state storage element 220*a*.

Additional pads are also illustrated. Pad 702*b* includes two packages 704*b*1 and 704*bx* and four die assigned respectively to solid-state storage elements 216*b*, 218*b*, 219*b*, and 220*b*. Similarly, pad 702*m* includes two packages 704*m*1 and 704*mx* and four die assigned respectively to solid-state storage elements 216*m*, 218*m*, 219*m*, and 220*m*. The die of FIG. 7 are assigned to banks 214 as illustrated. For instance, bank 0 214*a* includes one die of package 704*a*1, one die of package 704*b*1, . . . , and one die of package 704*m*1. Rows of the die are similarly assigned to banks 1, N−1, and N illustrated.

The four die of pad 702a may be arranged as a column of solid-state storage elements including SSS 0.0 216a, SSS 1.0 218a, SSS N–1.0 219a, and SSS N.0 220a as illustrated. Accordingly, each of the die of pad 702a may be associated with a different bank (e.g., 214a, 214b, 214n-1, or 214n) relative to one another, with each die being enabled by its own respective enable line 606 (not illustrated).

As indicated by the use of ellipses and the characters N and M in FIG. 7, the arrangement of FIG. 7 includes N×M solid-state storage elements arranged in M columns and N rows (banks).

Figure 7A:
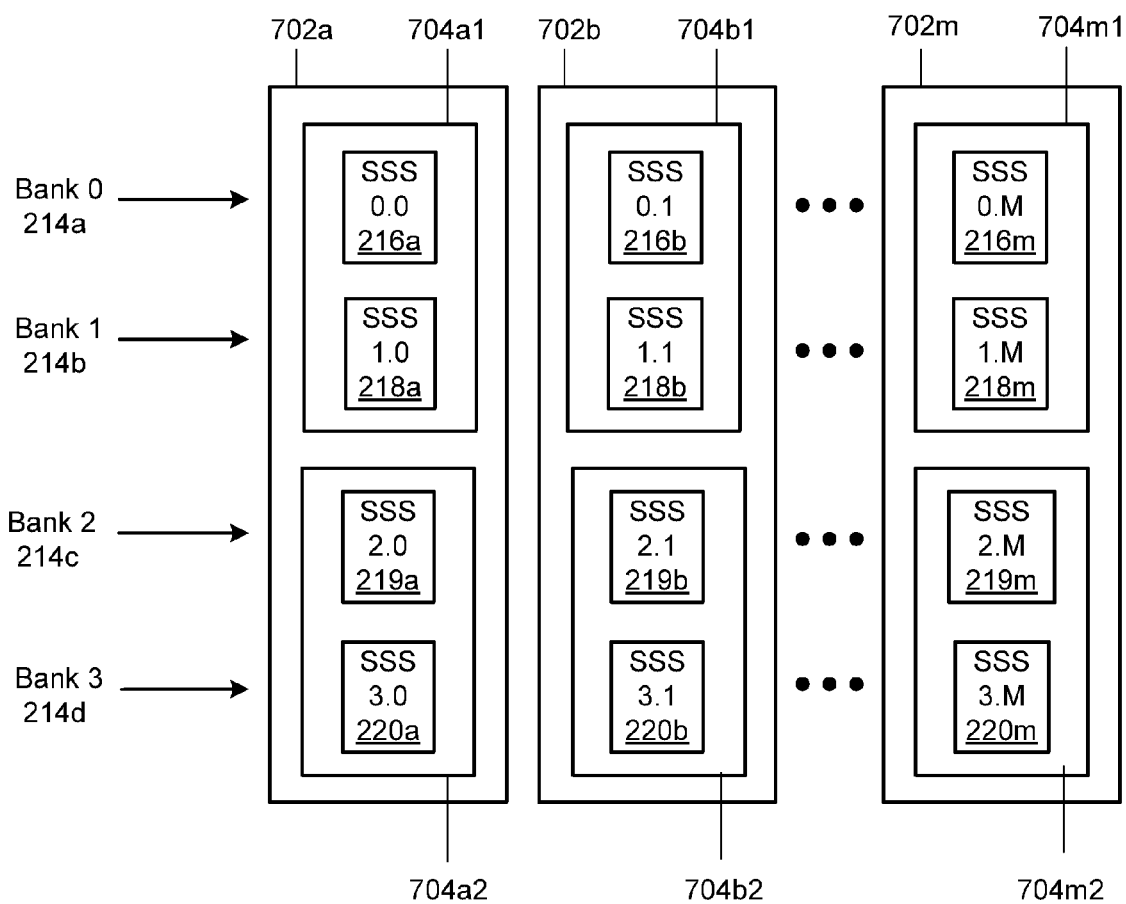
FIG. 7A is a schematic block diagram illustrating one embodiment of an array of solid-state storage elements.

FIG. 7A illustrates a particular embodiment of the arrangement of FIG. 7 in which there are 4×M solid-state storage elements arranged in M columns and four rows (banks). The arrangement of FIG. 7A will be referred to below in illustrating various aspects of the invention.

Figure 8:
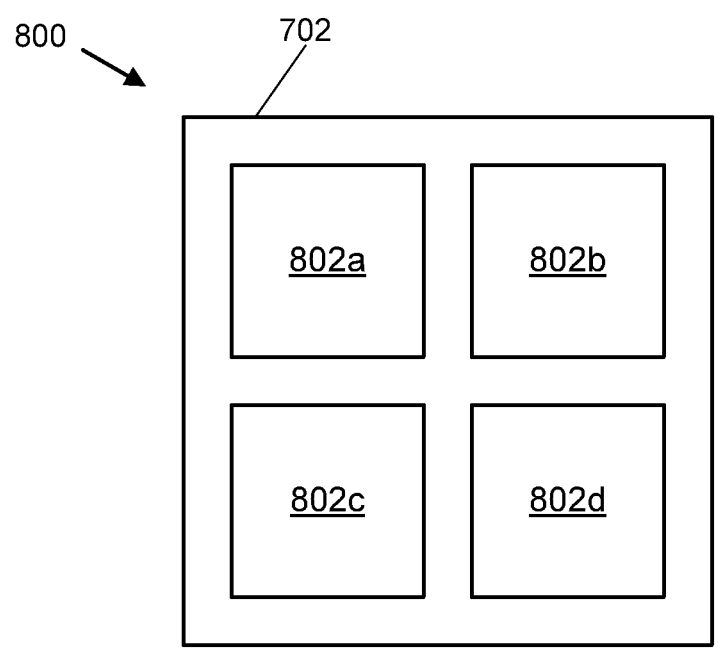
FIG. 8 is an illustration of one embodiment of a symbol used to indicate a die position within a pad in FIGS. 9 and 11.
Figure 9:
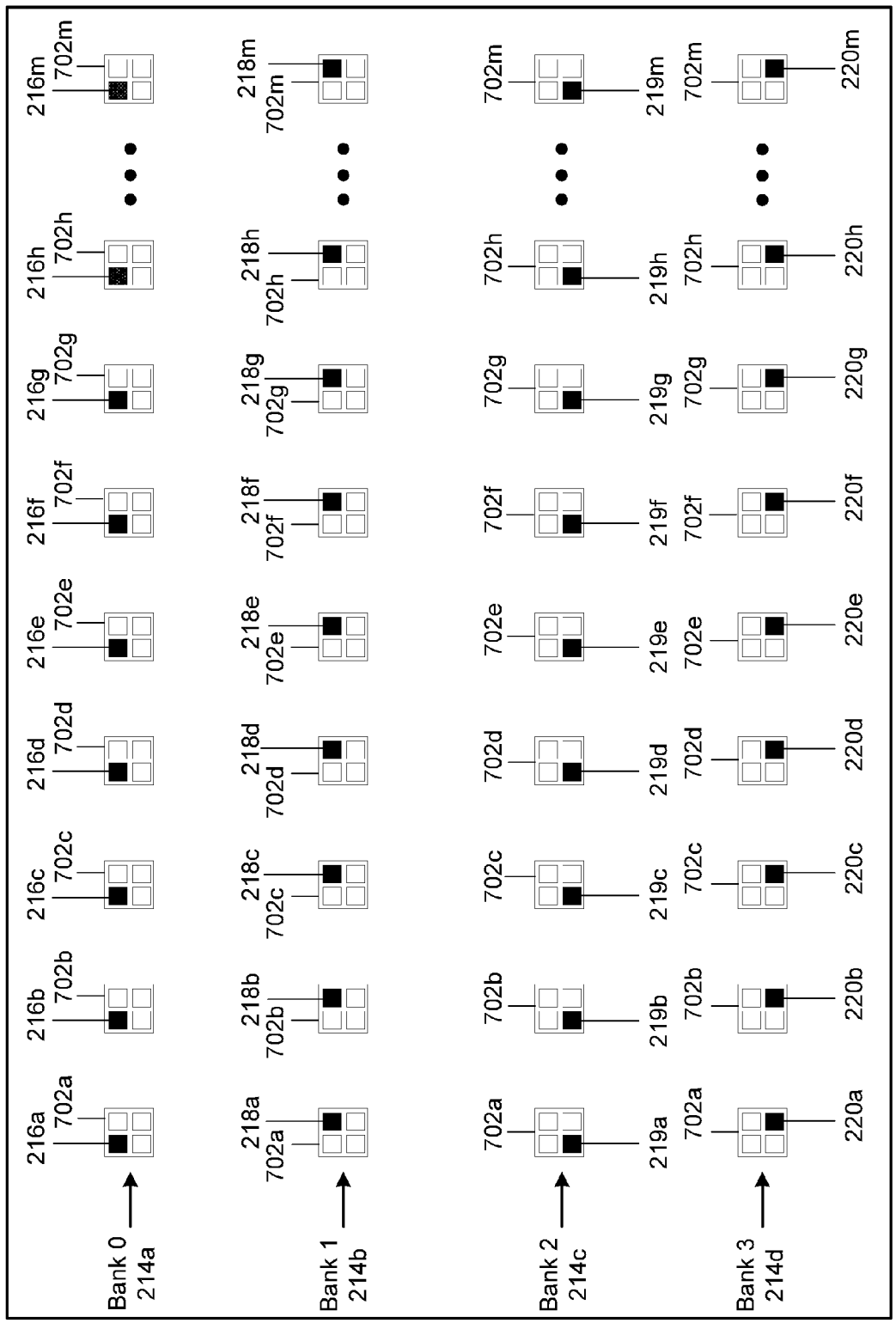
FIG. 9 is a diagram illustrating one embodiment of an arrangement of die in an array of solid-state storage elements.
Figure 11:
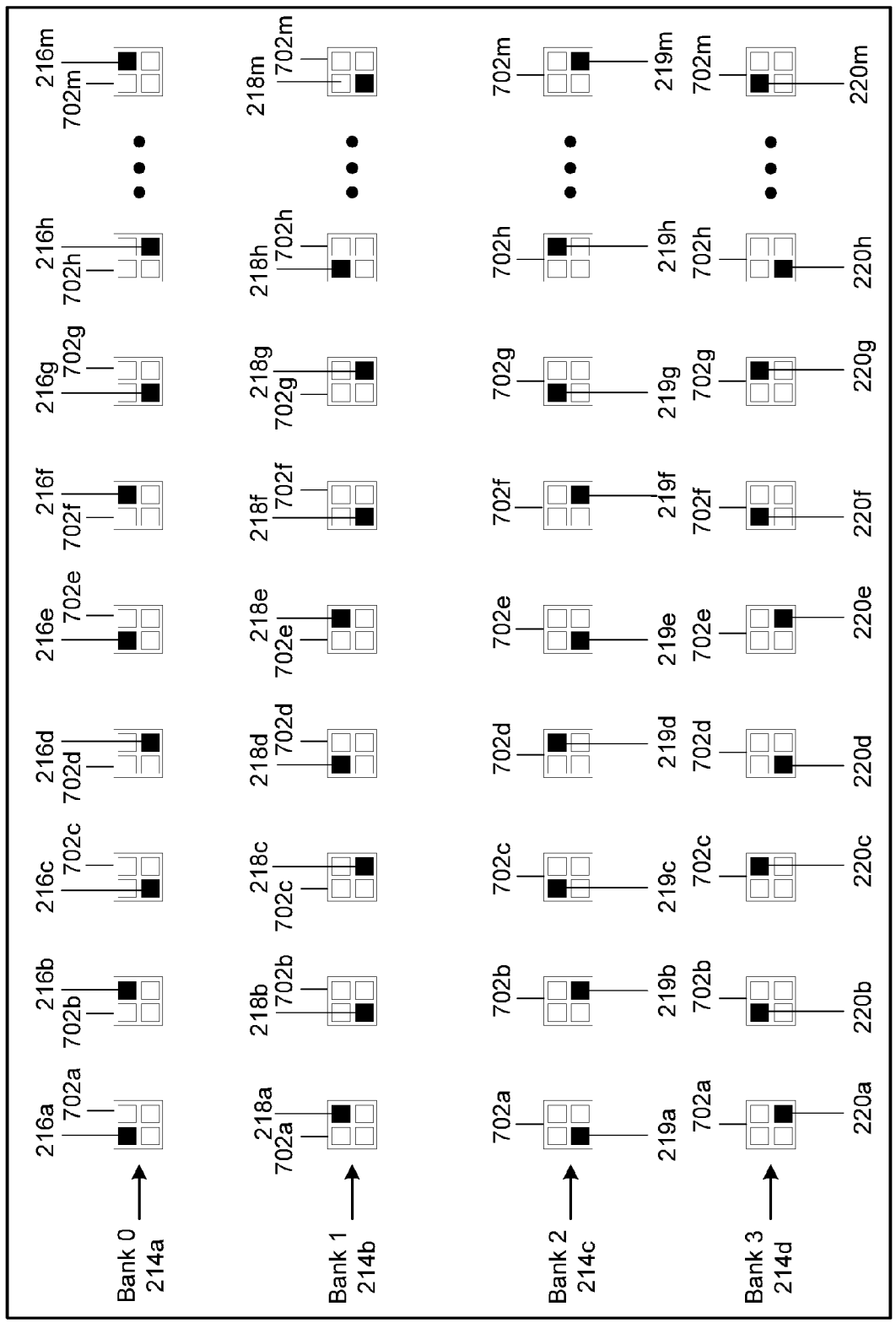
FIG. 11 is a diagram illustrating another embodiment of an arrangement of die in an array of solid-state storage elements.

FIG. 8 illustrates a symbol 800 used to represent a pad 702 in FIGS. 9 and 11. Symbol 800 includes a large box representing pad 702 and four smaller boxes representing die positions 802a, 802b, 802c, and 802d of pad 702. Each of die positions 802 may be in physically different locations relative to one another. Note that the four die of pad 702 may be housed by one or more packages 704, as illustrated in FIG. 7, but such is not indicated by symbol 800.

For example, in one embodiment, the data position module 112 maps positions 800 to physical locations as follows. Position 802a may be a leftmost location in package 602c (See FIG. 6), position 802b may be a rightmost location in package 602c, position 802c may be a leftmost location in package 602d (below location 802a), and position 802c may be a rightmost location in package 602d (below location 802b). As symbol 800 is a symbol, rather than a physical representation, symbol 800 may be used to represent mappings between positions 800 and physical locations within one or more packages 602 of a pad 602/702 different from the mapping described above. Such mappings may include fewer or greater than two die per package and/or fewer or greater than two packages per pad.

FIG. 9 illustrates an arrangement of the die 604 of pads 702 (more specifically, pads 702a, 702b, 702c, 702d, 702e, 702f, 702g, 702h, . . . , 702m) in rows and columns, with each row being assigned a different one of banks 214a, 214b, 214c, and 214d. Note that for bank 0 214a, position 802a of each pad 702 is shaded, indicating that the die in position 802a of pad 702 is assigned to bank 0 214a and is assigned to one of solid-state storage elements 216a, 216b, 216c, 216d, 216e, 216f, 216g, 216h, . . . , 216m, as illustrated. Similarly, FIG. 9 illustrates that the die in position 802b of each pad 702 is assigned to bank 1 214b and to one of the solid-state storage elements as illustrated. Further, the die in position 802c of each pad 702 is assigned to bank 2 214c and to one of the solid-state storage elements as illustrated, and the die in position 802d of each pad 702 is assigned to bank 3 214d and to one of the solid-state storage elements as illustrated.

In bank 0 214a, the upper left boxes of each pad 702 are shaded to indicate that each of the die 604 assigned to bank 0 214a are in position 802a within a pad 702. For example, each of the die assigned to bank 0 214a may be in an upper package of a pad (e.g., package 602c of FIG. 6C) and in a leftmost position within the upper package (e.g., die 604g of FIG. 6C). Of course, all of the die assigned to bank 0 214a could be in a lower package (e.g., package 602d of FIG. 6C) rather than an upper package, as long as all the die assigned to bank 0 214a are in the same position 802 within a pad.

Similarly the die of bank 1 214b are in the same position 802b within pad 702 as illustrated by the fact that the upper right boxes of pads 702 are shaded in bank 1 214b. Note that the die are assigned to banks 214, by the data position module 112 or the like, such that each bank 214 is assigned die in a different position 802 of pads 702 with respect to the other banks 214.

Figure 10:
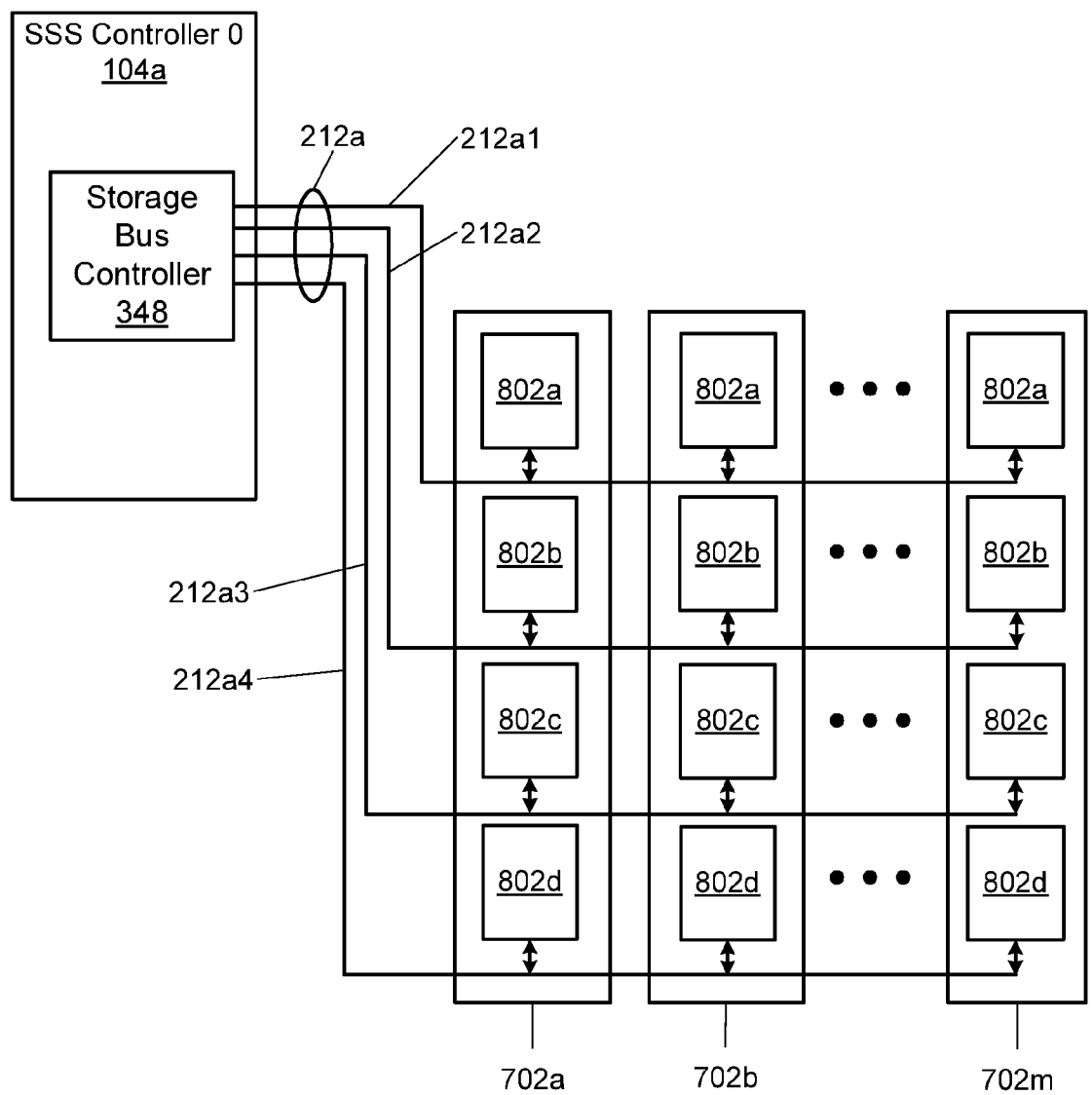
FIG. 10 is a schematic block diagram illustrating one embodiment of a data storage system.

FIG. 10 illustrates one embodiment of storage control bus 212a connecting pads 702 to storage controller 104a. In this embodiment, storage control bus 212a comprises four enable lines 212a1, 212a2, 212a3, and 212a4. Line 212a1 is wired to die 604 of pads 702 that are in position 802a and are assigned to solid-state storage elements 216a, 216b, . . . , and 216m. Accordingly, these die are enabled in parallel by a single enable line 212a1. Similarly, enable line 212a2 is wired to die of pads 702 that are in position 802b, enable line 212a3 is wired to die of pads 702 that are in position 802c, and enable line 212a4 is wired to die of pads 702 that are in position 802d. The routing and placement of enable lines 212a1, 212a2, 212a3, and 212a4 may be relatively easy since these enable lines may respectively connect to pads 702 in the same relative locations of pads 702. For example, enable line 212a1 may connect to the same pin or pins of each pad 702.

As was described above, in one embodiment, storage controller 104 may write a logical page made up of an array of physical pages by writing a different one of the physical pages of the logical page to each of the solid-state storage elements (e.g., 216a, 216b, . . . , 216m) of a bank 214 (e.g., bank 0 214a) in parallel. Accordingly, in one example, storage controller 104, using the write module 124 or the like, may write a physical page of data to each of the die assigned to bank 0 214a in parallel. Thus, each of the die assigned to bank 0 214a may be active (due to a read or write) substantially simultaneously.

In some cases, data stored by one or more die 604 of pad 702 may be more likely to contain errors than data stored by the other die 604 of pad 702. Put another way, the RBER of one of the die 604 of a pad 702 may be higher than the other die 604 of pad 702. This situation may arise for any number of reasons related to packaging, manufacturing defects, temperature, proximity to voltage sources, semiconductor processing or other variables may cause an RBER to be higher for die in one position (e.g., 802a) of pad 702 than for die in the other positions (e.g., 802b, 802c, and 802d) of pad 702. Further, the die position 802 of pad 702 likely to have the highest RBER may not be known or determinable prior to constructing an array of pads.

Accordingly, the assignment of die to banks 214 illustrated in FIG. 9 might result in a higher RBER for some banks than for other banks. For example, given the assignment of die illustrated in FIG. 9, if the die in position 802a of pad 702 has a higher RBER than the other die of pad 702, a logical page stored in bank 0 214a may contain a larger number of errors than a logical page stored in bank 1 214b. This larger number of errors is due to the fact that all of the die of bank 0 214a are in position 802a (the position having the highest RBER) of pad 702 and the logical page comprises a set of physical pages all stored in the die of bank 0 214a.

To alleviate this problem, the data position module 112 may assign die 604 to banks 214 so that each bank 214 comprises die 604 in the various positions 802a, 802b, 802c, and 802d of pad 702 rather than die that are all in the same position 802 of pad 702. By assigning die in various positions of pad 702, die having higher RBERs will be spread throughout banks 214 rather than being concentrated within one bank 214, thereby changing the average RBER of a bank of die with respect to the assignment of die 604 to banks 214 illustrated in FIG. 9.

More generally, this concept may be described as writing a logical page of data across a variety of different locations within storage elements of an array to reduce the occurrence of uncorrectable bit errors. Doing so may reduce uncorrectable bit errors as compared with writing a logical page of data across an array of storage elements such that data of the logical page is written to the same location in each of the storage elements of the array because some locations within the storage elements may be more likely to cause errors in the data than others.

FIG. 11 illustrates an assignment of die 604 to banks 214 such that each bank 214 comprises die in a variety of positions 802 of pad 702. Note, for instance, that bank 0 214a includes die in all four positions (802a, 802b, 802c, and 802d) of pad 702 as indicated by the shading of blocks in FIG. 10. Accordingly, when the write module 124 writes a logical page to bank 0 214a, one physical page of the logical page may be written to solid-state storage element 216a, which is assigned a die in position 802a. Another physical page of the logical page may be written to a solid-state storage element 216b, which is assigned a die in position 802b. Thus, the physical pages of a logical page may be written to die occupying a variety of positions 802 within their respective pads, rather than being written to die occupying the same position within their respective pads as was the case in FIG. 9.

The assignment, by the data position module 112, of die 604 to banks 214 illustrated in FIG. 11 tends to make the RBER of logical pages stored in the array more consistent (uniform) between banks 214 as compared with the arrangement of FIG. 9 in which logical pages stored in a first bank (e.g., bank 0 214a) may have an RBER significantly higher than logical pages stored in a second bank 214 (e.g., bank 1 214b) if the die assigned to the first bank have a higher RBER due to their position 802 in pads 702 than the die assigned to the second bank.

As was described above, logical pages comprise a plurality of ECC chunks where each ECC chunk may be spread out across the die of a bank 214 of the solid-state storage elements. In some embodiments, the number of ECC chunks having uncorrectable errors may be significantly reduced using the assignment of die 604 illustrated in FIG. 11 as compared with the assignment of die 604 illustrated in FIG. 9, since the RBER is averaged across the array. This reduction may be realized if the typical number of bit errors in an ECC chunk resulting from the more consistent (uniform) RBER realized by the arrangement of FIG. 11 is lower than the maximum number of errors correctable by the ECC of the ECC chunk.

In contrast, in the arrangement of FIG. 9, many more ECC chunks may have uncorrectable errors since the RBER for ECC chunks stored in a particular bank may be significantly higher than for other banks. Note that using the arrangement of FIG. 11 may actually increase the RBER for ECC chunks stored in some banks as compared with FIG. 9. However, this increase in RBER might not necessarily result in a greater number of ECC chunks having uncorrectable errors if the typical number of errors in an ECC chunk resulting from the increased RBER is lower than the maximum number of errors correctable by the ECC of the ECC chunk.

In summary, the arrangement of FIG. 11 may significantly reduce the number of ECC chunks having uncorrectable errors when compared with the arrangement of FIG. 9, thereby preventing data loss. FIG. 11 illustrates one assignment of die 604 to banks 214 as an example. Other arrangements in which the die 604 assigned to a bank 214 are located in a variety of positions 802 within their respective pads 702 are also possible and may produce results similar to those of the arrangement of FIG. 11.

Note that the assignment of die 604 to banks 214 by the data position module 112 as illustrated in FIG. 11 may be effective regardless of which position 802 of pad 702 is the position in which die experience greater RBER than the die on the other positions of pad 702 since each bank 214 includes die located in each of the four positions 802a, 802b, 802c, and 802d of pad 702. Accordingly, a designer need not know ahead of time, which of the positions 802 of pad 702 has the highest RBER.

Figure 12:
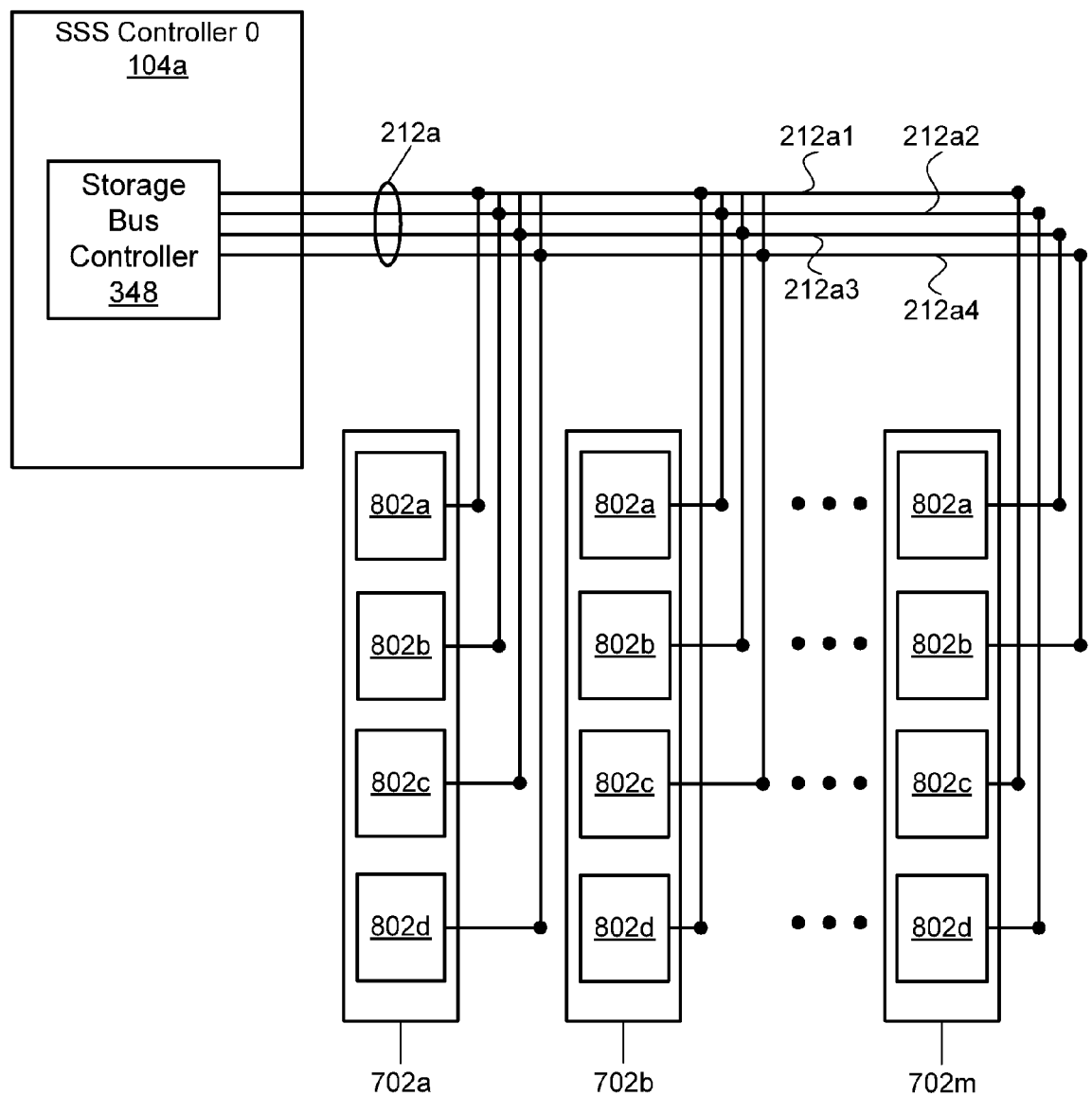
FIG. 12 is a schematic block diagram illustrating another embodiment of a data storage system.

FIG. 12 illustrates one embodiment of storage control bus 212a connecting pads 702 to storage controller 104a. In this embodiment, the data position module 112 comprises enable lines 212a1, 212a2, 212a3, and 212a4 that are each connected to die 604 of pads 702 located in a variety of positions 802. The routing and placement of enable lines 212a1, 212a2, 212a3, and 212a4 as depicted in FIG. 12 may be more difficult than for the embodiment of FIG. 10, and in some cases, may consume more board space or increase the number of layers required for the board on which pads 702 are located. In one embodiment, the physical wiring on the board may be the same for both FIG. 12 and FIG. 10, but storage controller 104a may include additional logic (e.g., inside an FPGA or ASIC) that logically connects pads 702 to storage bus controller 348 in the manner illustrated in FIG. 12.

As was described above in relation to FIG. 6B, storage controller 104 may use addresses to force data to be stored in a particular die of pad 702. In one embodiment, storage controller 104, using the write module 124, the address module 132, or the like, may write a first physical page of a logical page to a die in position 802a of pad 702a by writing the first physical page to a first address. In parallel, storage controller 104, using the write module 124, the address module 132, or the like, may force a second physical page of the logical page to be written to a die in position 802b of pad 702b by writing the second physical page to a second address offset from the first address. In contrast, if the array of solid-state storage elements was arranged as illustrated in FIG. 9, the same address may be used for both the first and second physical pages since both physical pages are stored in die in position 802a.

Figure 13:
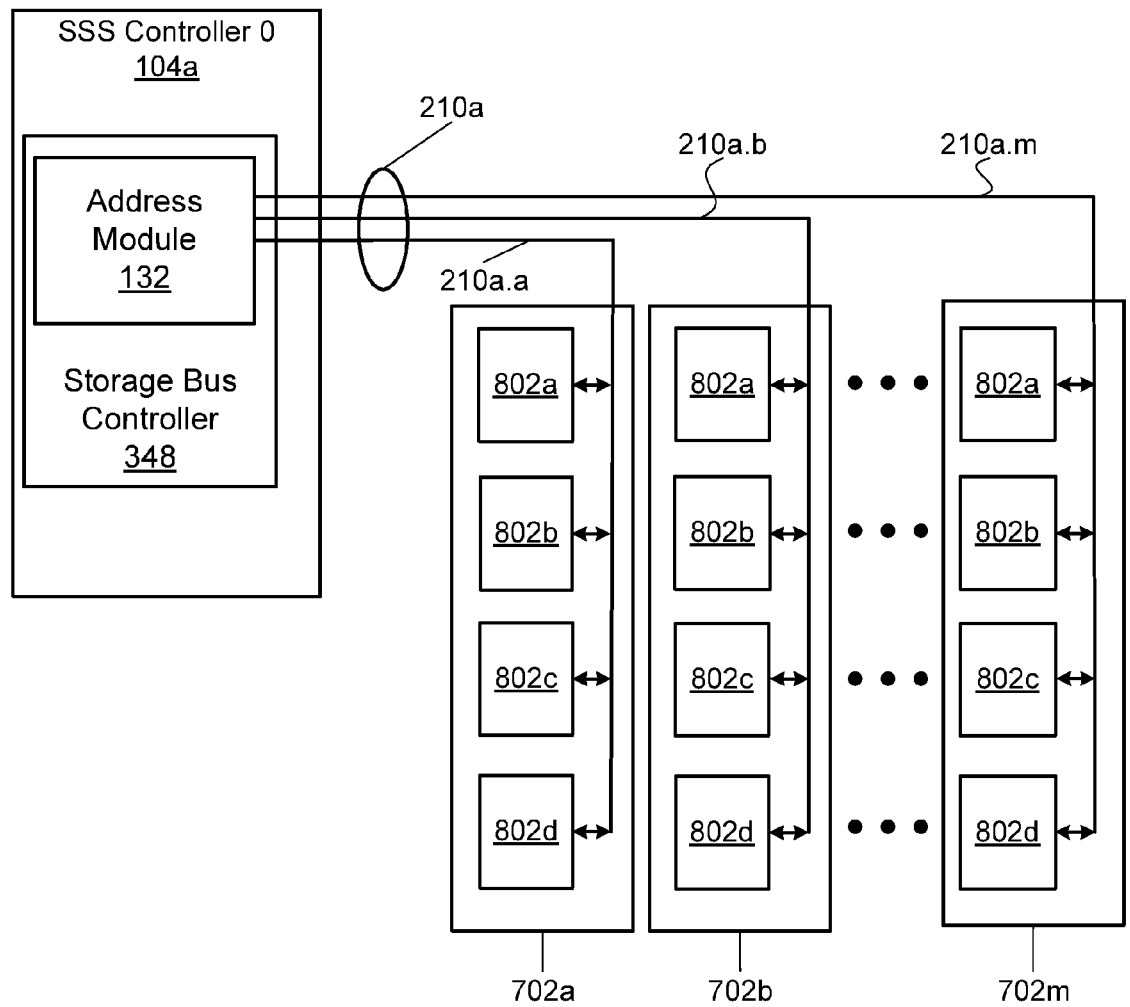
FIG. 13 is a schematic block diagram illustrating another embodiment of a data storage system.

FIG. 13 illustrates an embodiment in which the address module 132 may send different addresses to solid-state storage elements of a bank 214. In FIG. 13, storage bus controller 348 includes an address module 132 that may send different addresses in parallel on storage I/O bus 210a so that physical pages of a logical page are written to different addresses thereby writing the physical pages to die located in different positions 802 of pad 702.

For example, address module 132 may send a first address on bus 210a.a so that the write module 124 writes a first physical page of the logical page to a die assigned as solid-state storage element 216a and located in position 802a of pad 702a. In parallel, address module 132 may send a second address (different than and offset from the first address) on bus 210a.b so that the write module 124 writes a second physical page of the logical page to a die assigned as solid-state storage element 216b and located in position 802b of pad 702b. In this manner, storage controller 104a and/or the write module 124 may write physical pages of a logical page to die in a variety of die positions in parallel by writing the physical pages to different addresses.

In summary, FIG. 12 illustrates an embodiment in which enable lines are wired to pads 702 in a manner that ensures that the write module 124 writes physical pages of a logical page to die in a variety of die positions 802. This technique may be suitable for some solid-state storage element embodiments. FIG. 13 illustrates an embodiment in which the storage controller 104a and/or the write module 124 writes physical pages of a logical page to die in a variety of die positions 802 by writing the physical pages of the logical page to different addresses. This technique may be suitable for other solid-state storage element embodiments. For some solid-state storage element embodiments, the storage controller 104 and/or the write module 124 may use a combination of both enable line wiring (as described above in relation to FIG. 12) and different addresses (as described above in relation to FIG. 13) to ensure that physical pages belonging to a logical page are written to die located in a variety of die positions 802.

Figure 14:
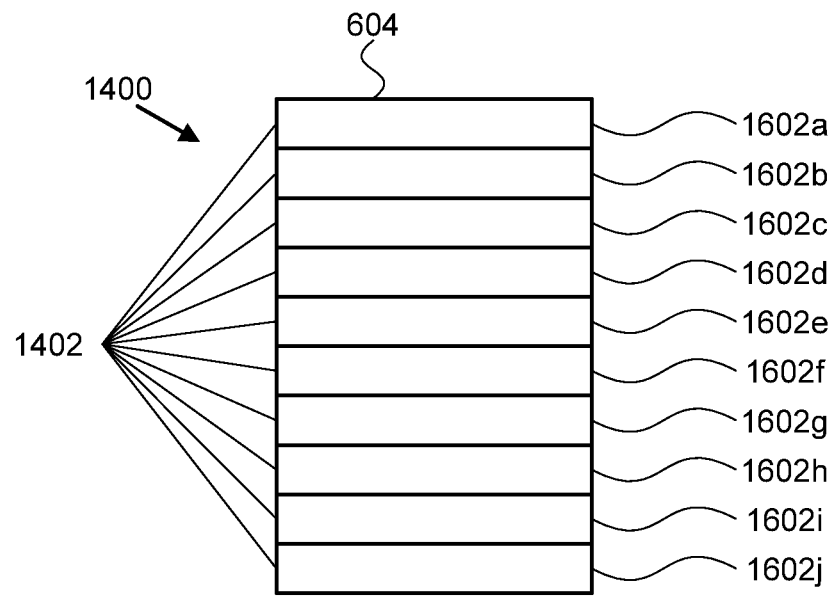
FIG. 14 is an illustration of one embodiment of a symbol used to indicate an erase block position within a die in FIGS. 16, 17, and 18.
Figure 16:
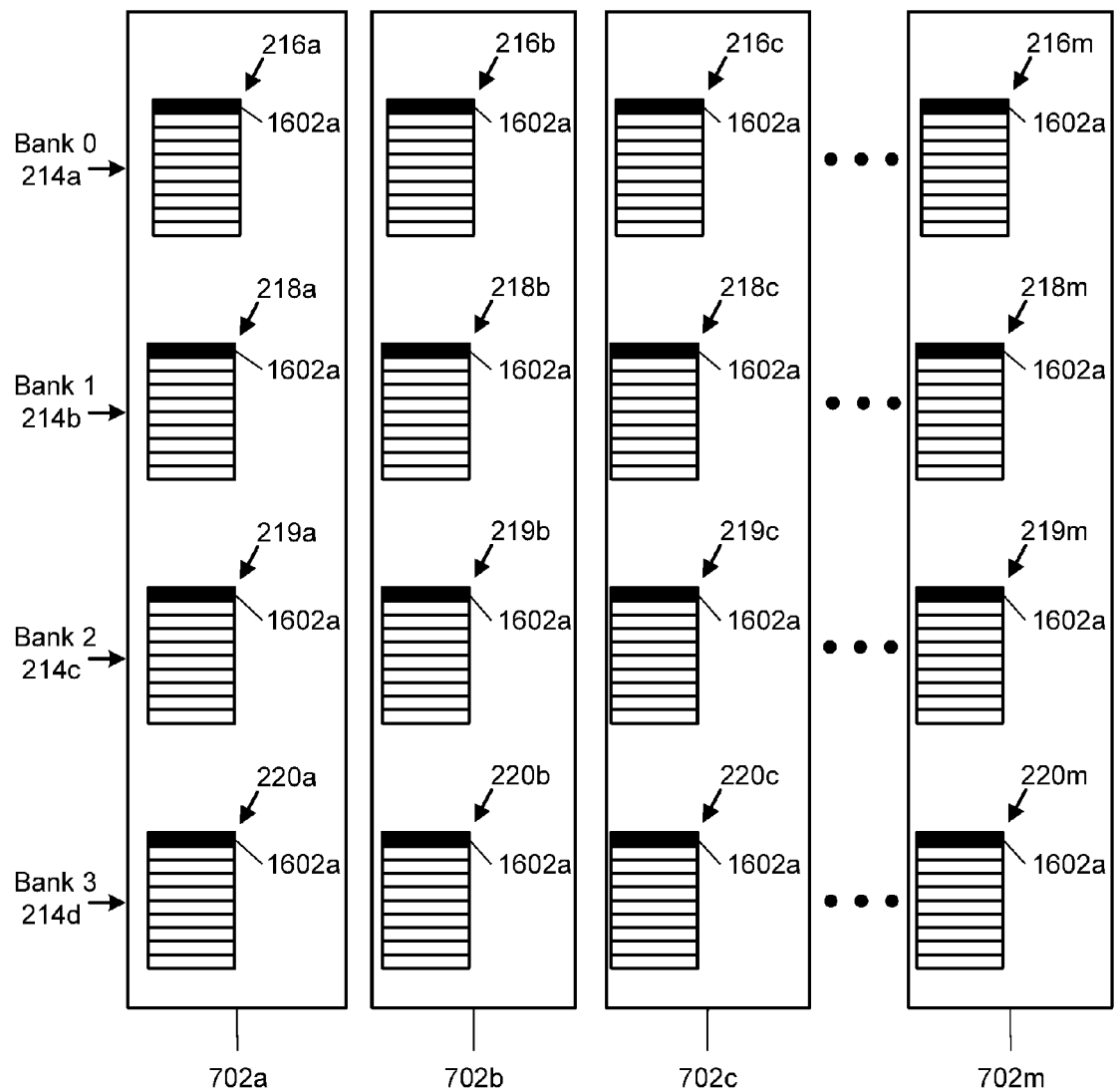
FIG. 16 is a diagram illustrating one embodiment of an arrangement of erase blocks in an array of solid-state storage elements.
Figure 17:
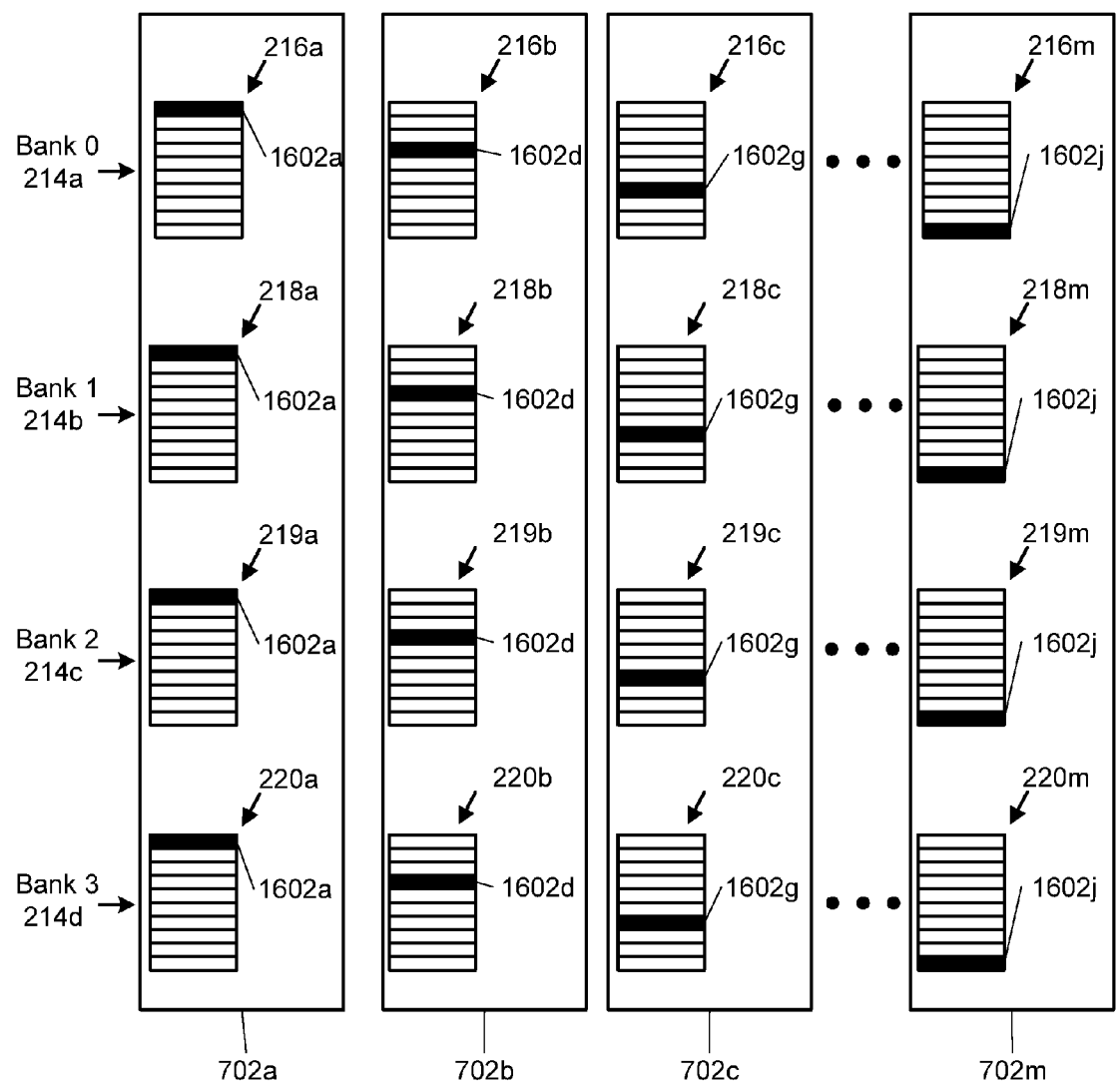
FIG. 17 is a diagram illustrating another embodiment of an arrangement of erase blocks in an array of solid-state storage elements.
Figure 18:
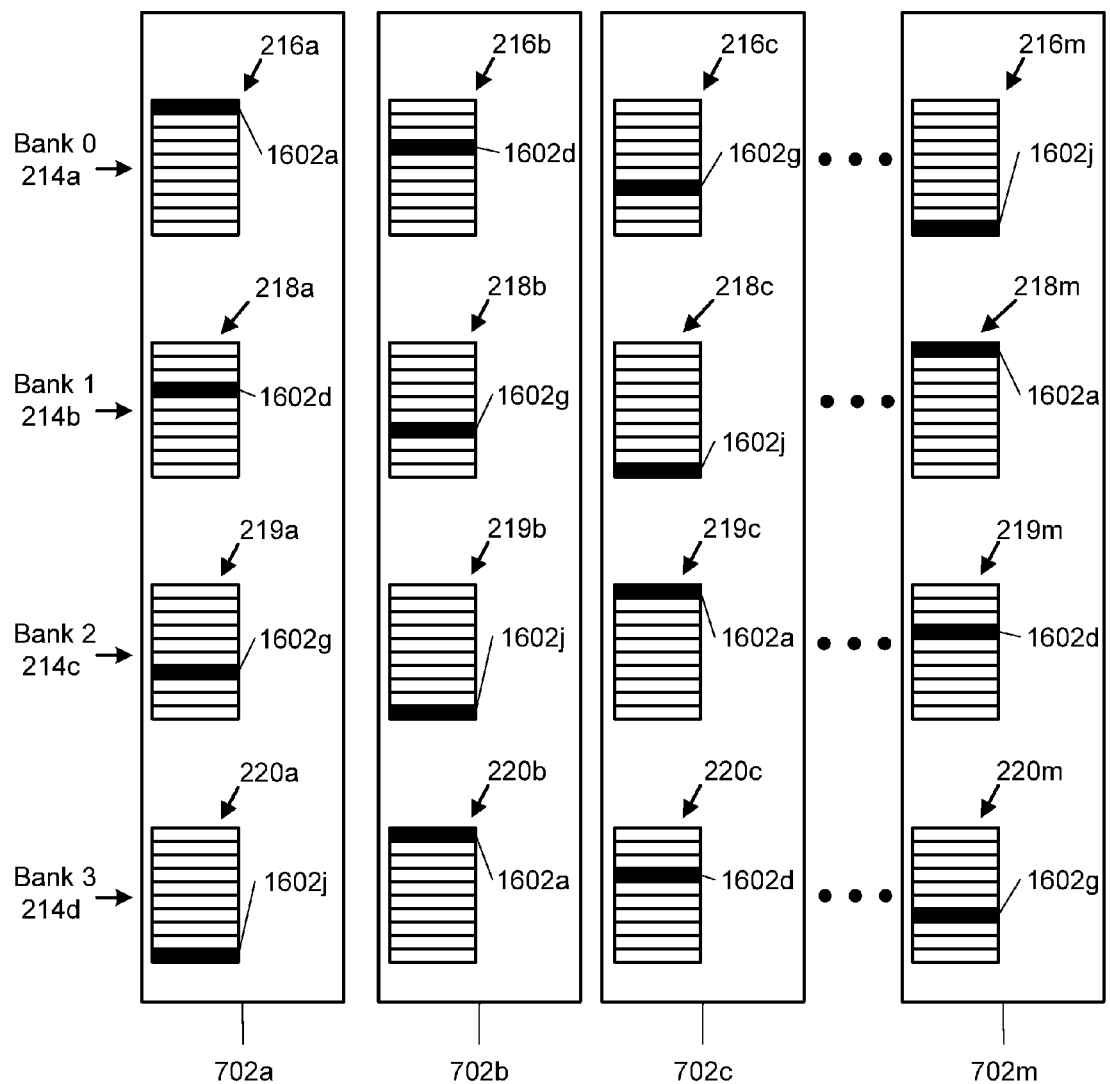
FIG. 18 is a diagram illustrating another embodiment of an arrangement of erase blocks in an array of solid-state storage elements.

FIG. 14 illustrates a symbol 1400 used to represent erase blocks 1402 within a die 604 in FIGS. 16-18. Although just ten erase blocks 1402 are illustrated, die 604 may include hundreds or thousands of erase blocks 1402. Each erase block 1402 is located in one of positions 1602a, 1602b, 1602c, 1602d, 1602e, 1602f, 1602g, 1602h, 1602i, and 1602j.

Figure 15:
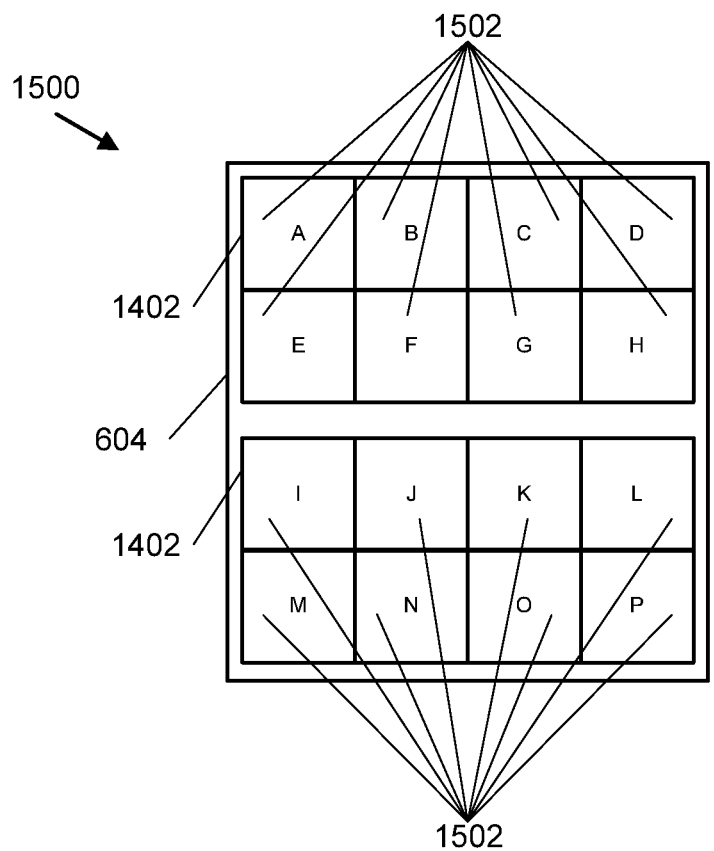
FIG. 15 is an illustration of one embodiment of a symbol used to indicate a page position within an erase block in FIGS. 19, 20, 21, and 22.

FIG. 15 illustrates a symbol 1500 used to represent pages 1502 within erase blocks 1402 in FIGS. 19-22. The symbol includes eight pages labeled A-H in a first erase block 1402 of a die 604 and eight pages labeled I-P in a second erase block 1402 of die 604. Each page is located in one of positions A, B, C, D, E, F, G, H, I, J, K, L, M, N, O, and P. Although just eight pages per erase block are illustrated, each erase block 1402 may include hundreds or thousands of pages 1502. Furthermore, although just two erase blocks 1402 per die 604 are illustrated, each die 604 may include hundreds or thousands of erase blocks 1402.

FIG. 16 illustrates one approach for writing erase blocks 1402 within die 604. Solid-state storage elements 216, 218, 219, 220 are illustrated in banks 214 and pads 702. For each solid-state storage element 216, 218, 219, 220, ten erase blocks 1402 are illustrated using symbol 1400 of FIG. 14 and one of the ten erase blocks of each symbol is shaded. The shading of the erase block indicates that the next page written to the solid-state storage element by storage controller 104 will be written to the shaded erase block. Storage controller 104, using the write module 124 and/or the address module 132, may control the erase block to which the next page is written by presenting an address on storage I/O bus 210 associated with the position 1602 of the shaded erase block. Once the shaded erase block has been written, storage controller 104 may start writing another erase block, for example, the erase block directly below the shaded erase block.

FIG. 16 illustrates one arrangement in which the shaded erase blocks of all solid-state storage elements 216, 218, 219, 220 are located in position 1602a. This arrangement may be particularly efficient to implement because storage controller 104 may present the same address on storage I/O bus 210a to each of pads 702, for example, by presenting the same address on each of buses 210a.a, 210a.b, . . . , 210a.m (See FIG. 13). However, the arrangement of FIG. 16 may be vulnerable to errors.

In some cases, data stored by one or more erase blocks 1402 of die 604 may be more likely to contain errors than data stored by the other erase blocks 1402 of die 604. Put another way, the RBER of one or more of the erase blocks 1402 of die 604 may be higher than the other erase blocks 1402 of die 604. This situation may arise for any number of reasons related to packaging, manufacturing defects, temperature, proximity to voltage sources, semiconductor processing, or other variables may cause an RBER to be higher for some erase blocks of die 604 than for other erase blocks of die 604. Further, the erase blocks of die 604 likely to have the highest RBER may not be known or determinable prior to constructing an array of pads.

Accordingly, writing a logical page in parallel to a set of erase blocks 1402 all in the same position 1602 as illustrated in FIG. 16 might result in a higher RBER for some ECC chunks than for other ECC chunks. For example, if the erase block in position 1602a has a higher RBER than the erase block in position 1602d, an ECC chunk stored across erase blocks 1402 all in position 1602a may contain a larger number of errors than an ECC chunk stored across erase blocks 1402 all in position 1602d. This larger number of errors is due to the fact that all of the erase blocks 1402 across which the ECC chunk is stored are in a position 1602 of die 604, which is the position having the highest RBER.

To alleviate this problem, storage controller 104, using the write module 124 and/or the address module 132, may write an ECC chunk across a set of erase blocks 1402 wherein the erase blocks of the set are located in various positions 1602a, 1602d, 1602g, and 1602j of die 604 rather than across a set of erase blocks 1402 all located in the same position 1602 of die 604. By writing in parallel to a set of erase blocks in various positions 1602 of die 604, an ECC chunk will not be written exclusively to a set of erase blocks 1402 in positions 1602 having the highest RBERs, thereby reducing the RBER of an ECC chunk with respect to the arrangement illustrated in FIG. 16.

FIG. 17 illustrates a shading of erase blocks 1402 of die 604 such that the write module 124 writes a logical page across a set of erase blocks 1402 in a variety of positions 1602 of die 604. Note, for instance, that the next logical page that the write module 124 writes to bank 0 214a will include pages written to erase blocks 1402 in a variety of positions (1602a, 1602d, 1602g, and 1602j) of die 604 as indicated by the shading of erase blocks 1402 in FIG. 17. Accordingly, when writing a logical page to bank 0 214a, the write module 124 may write one physical page of the logical page to an erase block of solid-state storage element 216a in position 1602a. The write module 124 may write another physical page of the logical page to an erase block of solid-state storage element 216b in position 1602d. Thus, the write module 124 may write the physical pages of a logical page to erase blocks occupying a variety of positions 1602 within their respective die, rather than the physical pages being written to erase blocks occupying the same position 1602 within their respective die as was the case in FIG. 16.

FIG. 18 illustrates another embodiment of shading of erase blocks 1402 of die 604 such that the write module 124 writes a logical page across a set of erase blocks 1402 in a variety of positions 1602 of die 604. Note that in this embodiment, a different shading pattern is used for each of banks 214.

The arrangements of FIGS. 17 and 18 may be more complex to implement than the arrangement of FIG. 16 because storage controller 104a, using the address module 132 or the like, may present different addresses on storage I/O bus 210a to each of pads 702. For example, storage controller 104a may, in parallel, present a first address associated with position 1602a on bus 210a.a (see FIG. 13), a second address associated with position 1602d on bus 210a.b, a third address associated with position 1602g on bus 210a.c, and so on. Address module 132, described above, may be configured to determine and present the different addresses on storage I/O bus 210a in parallel.

The shading patterns of FIGS. 17 and 18 tend to make the RBER of logical pages stored in the array more consistent and distributed between logical erase blocks as compared with the arrangement of FIG. 16 in which logical pages stored in a first logical erase block (e.g., a logical erase block consisting of erase blocks all in position 1602a) may have an RBER significantly higher than logical pages stored in a second logical erase block (e.g., a logical erase block consisting of erase blocks all in position 1602g) if the erase blocks of the first logical erase block have a higher RBER due to their position 1602 in die 604 than the erase blocks of the second logical erase block, which may be in a more favorable position 1602 in die 604.

As was described above, logical pages comprise a plurality of ECC chunks where each ECC chunk may be spread out across the erase blocks of a logical erase block. In some embodiments, the number of ECC chunks having uncorrectable errors may be significantly reduced using the shading illustrated in FIG. 17 or 18 as compared with the shading of FIG. 16. This reduction may be realized if the typical number of bit errors in an ECC chunk resulting from the more consistent RBER realized by the arrangement of FIG. 17 or 18 is lower than the maximum number of errors correctable by the ECC of the ECC chunk.

In contrast, in the arrangement of FIG. 16, many more ECC chunks may have uncorrectable errors since the RBER for ECC chunks stored in a particular logical erase block may be significantly higher than for other logical erase blocks. Note that using the arrangement of FIG. 17 or 18 may actually increase the RBER for ECC chunks stored in some logical erase blocks as compared with FIG. 16. However, this increase in RBER might not necessarily result in a greater number of ECC chunks having uncorrectable errors if the typical number of errors in an ECC chunk resulting from the increased RBER is lower than the maximum number of errors correctable by the ECC of the ECC chunk.

In summary, the arrangements of FIGS. 17 and 18 may significantly reduce the number of ECC chunks having uncorrectable errors when compared with the arrangement of FIG. 16, thereby preventing data loss. FIGS. 17 and 18 illustrate two arrangements as examples. Other arrangements in which the erase blocks 1402 assigned to a logical erase block are located in a variety of positions 1602 within their respective die 604 are also possible and may produce results similar to those of the arrangements of FIGS. 17 and 18.

Note that the assignments of erase blocks 1402 to logical erase blocks by the data position module 112 as illustrated in FIGS. 17 and 18 may be effective regardless of which position (or positions) 1602 of erase block 1402 is the position in which erase blocks experience greater RBER than erase blocks in other positions 1602 of die 604 since each logical erase block includes erase blocks 1402 located in a variety of positions 1602 of die 604. Accordingly, a designer need not know ahead of time, which of the positions 1602 of die 604 have the highest RBER.

Figure 19:
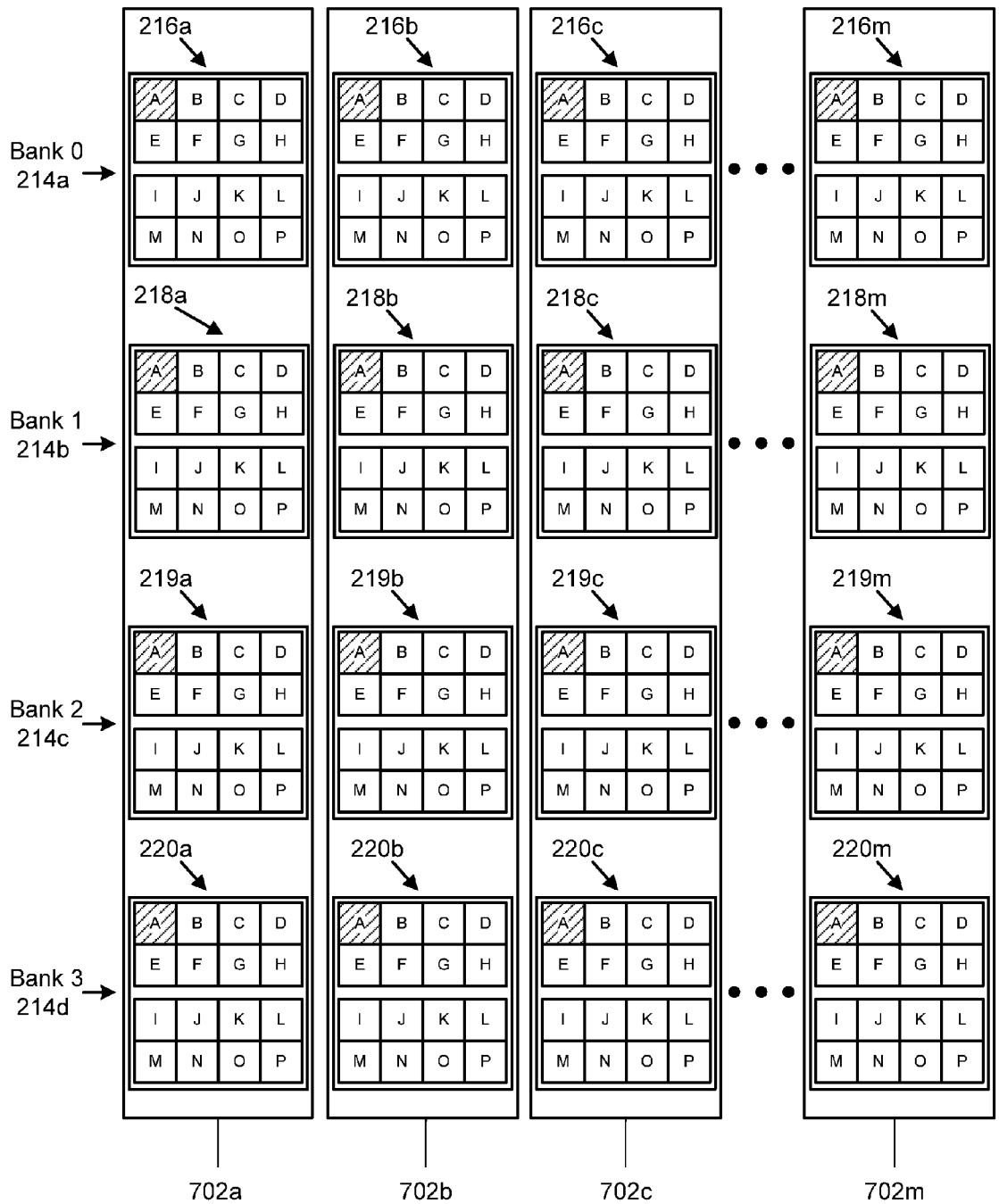
FIG. 19 is a diagram illustrating one embodiment of an arrangement of pages in an array of solid-state storage elements.

FIG. 19 illustrates one approach for determining an order in which pages 1502 are written within erase blocks 1402. Solid-state storage elements 216, 218, 219, 220 are illustrated in banks 214 and pads 702. For each solid-state storage element 216, 218, 219, 220, sixteen pages 1502 in two erase blocks 1402 are illustrated using symbol 1500 of FIG. 15 and one of the sixteen pages is shaded. The shading of the page indicates that the next data written to the solid-state storage element by storage controller 104 will be written to the shaded page. Storage controller 104 may control the page to which the next data is written by presenting an address on storage I/O bus 210 associated with the position of the shaded page. Once the shaded page has been written, storage controller 104 may start writing another page.

Furthermore, the shaded pages of one or more banks 214 form a logical page, which was described in detail above. Data may be written to the logical page by writing a different physical page to each of the shaded pages of one or more banks 214.

FIG. 19 illustrates one arrangement in which the shaded pages of all solid-state storage elements 216, 218, 219, 220 are located in position A. This arrangement may be particularly efficient to implement because the storage controller 104 may present the same address on storage I/O bus 210a to each of the pads 702, for example, by presenting the same address on each of buses 210a.a, 210a.b, . . . , 210a.m. However, the arrangement of FIG. 19 may be vulnerable to data errors.

In some cases, data stored by one or more pages 1502 of erase block 1402 may be more likely to contain errors than data stored by the other pages 1502 of erase block 1402. For example, pages associated with particular wordlines within a die may have a higher RBER than pages associated with other wordlines within the die. Put another way, the RBER of one or more of pages 1502 of erase block 1402 may be higher than the other pages 1502 of erase block 1402. This situation may arise for any number of reasons related to wordline location within a die, sharing of wordlines, packaging, storage media defects, temperature, proximity to voltage sources or voltage sinks, semiconductor processing, or other variables may cause an RBER to be higher for some pages of erase blocks 1402 than for other pages of erase blocks 1402. Further, the pages of erase blocks 1402 likely to have the highest RBER may not be known or determinable prior to constructing an array of pads.

Accordingly, writing a logical page in parallel to a set of pages 1502 all in the same position A as illustrated in FIG. 19 might result in a higher RBER for some ECC chunks than for other ECC chunks. For example, if the page in position A has a higher RBER than the page in position D, an ECC chunk stored across pages 1502 all in position A may contain a larger number of errors than an ECC chunk stored across pages 1502 all in position D. This larger number of errors is due to the fact that all of the pages 1502 across which the ECC chunk is stored are in position A, which is the position having the highest RBER.

To alleviate this problem, storage controller 104, using the write module 124 and/or the address module 132, may write an ECC chunk across a set of pages 1502 wherein the pages of the set are located in various positions A, B, C . . . of erase block 1402 rather than across a set of pages 1502 all located in the same position of erase block 1402. By writing in parallel to a set of pages in various positions of erase block 1402, an ECC chunk will not be written exclusively to a set of pages 1502 in positions having the highest RBERs, thereby reducing the RBER of an ECC chunk with respect to the arrangement illustrated in FIG. 19.

Figure 20:
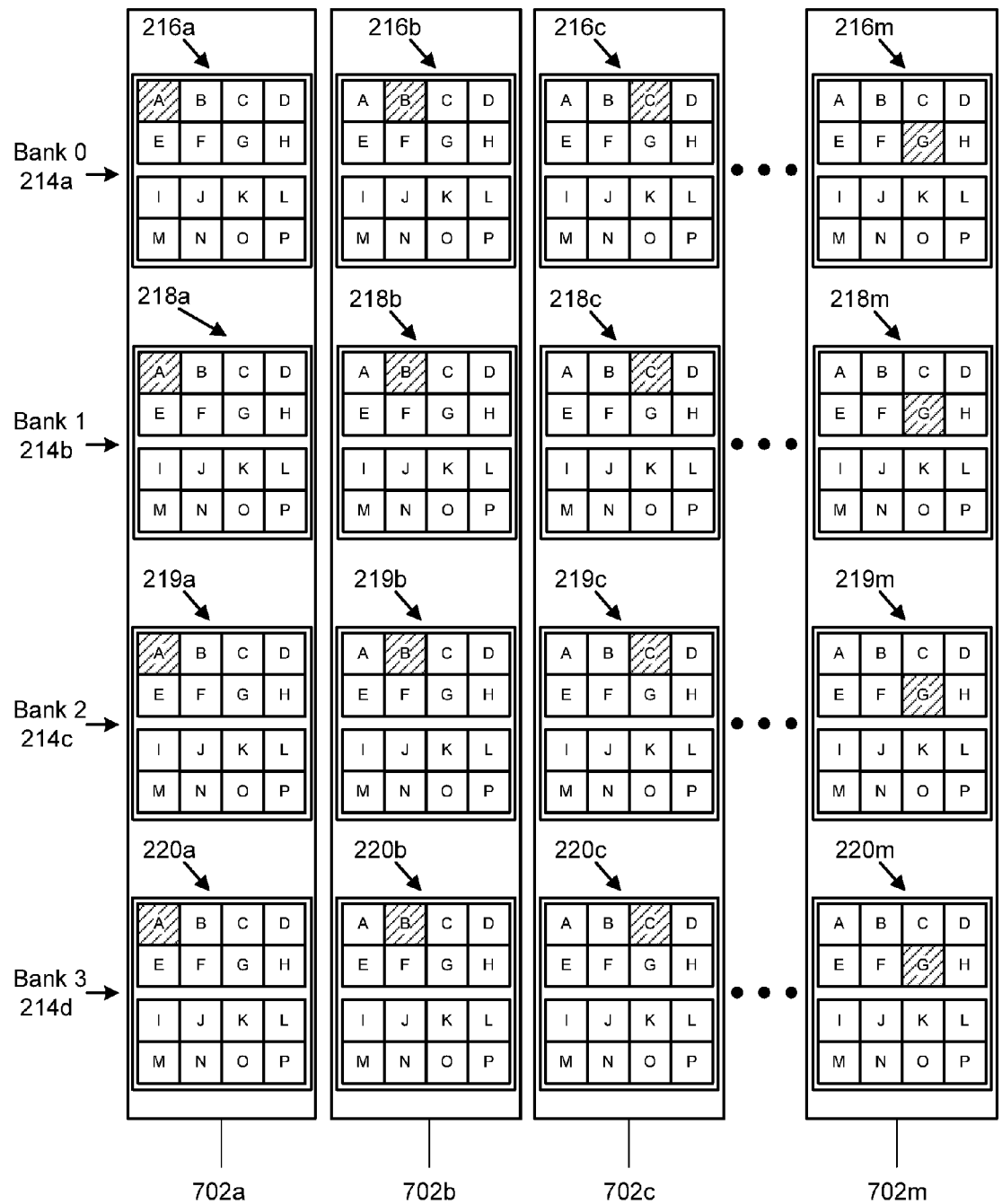
FIG. 20 is a diagram illustrating another embodiment of an arrangement of pages in an array of solid-state storage elements.

FIG. 20 illustrates a shading of pages 1502 of erase block 1402 such that the write module 124 writes a logical page across a set of pages 1502 in a variety of positions of erase block 1402. Note, for instance, that the next logical page that the write module 124 writes to bank 0 214a will include data written to pages 1502 in a variety of positions (A, B, C, and G) of erase block 1402 as indicated by the shading of pages 1502 in FIG. 20. Accordingly, when writing a logical page to bank 0 214a, the write module 124 may write one physical page of the logical page to a page of solid-state storage element 216a in position A. The write module 124 may write another physical page of the logical page to a page of solid-state storage element 216b in position B. Thus, the write module 124 may write the physical pages of a logical page to pages occupying a variety of positions within their respective erase blocks, rather than the physical pages being written to pages occupying the same position within their respective erase blocks as was the case in FIG. 19.

Figure 21:
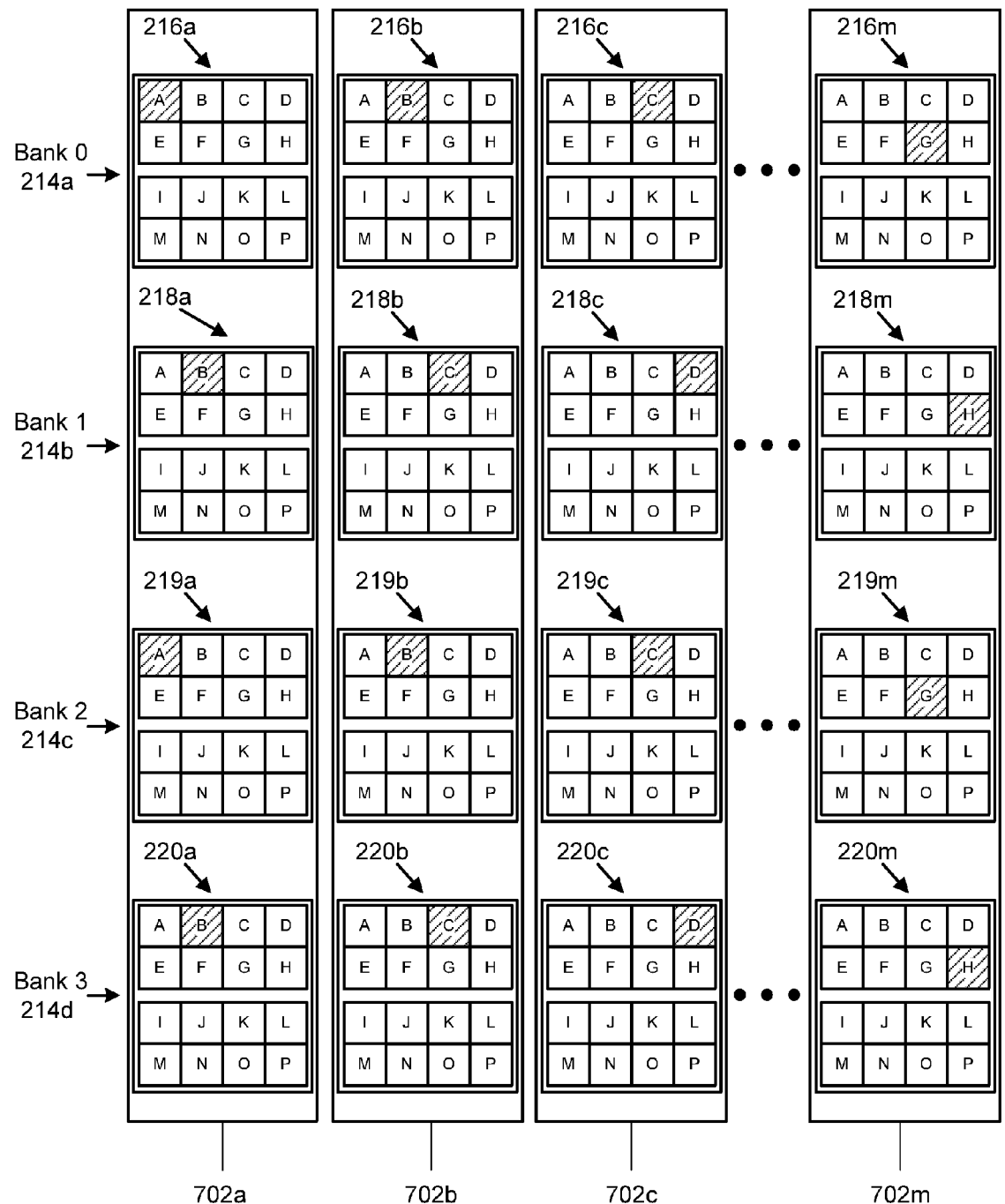
FIG. 21 is a diagram illustrating another embodiment of an arrangement of pages in an array of solid-state storage elements.

FIG. 21 illustrates another embodiment of shading of pages 1502 of erase block 1402 such that the write module 124 writes a logical page across a set of pages 1502 in a variety of positions of erase block 1402. Note that in this embodiment, a different shading pattern is used for each of banks 214.

The arrangements of FIGS. 20 and 21 may be more complex to implement than the arrangement of FIG. 19 because storage controller 104a may present different addresses on storage I/O bus 210a to each of pads 702. For example, storage controller 104a, using the address module 132, may, in parallel, present a first address associated with position A on bus 210a.a, a second address associated with position B on bus 210a.b, a third address associated with position C on bus 210a.c, and so on. Address module 132, described above, may be configured to determine and present the different addresses on storage I/O bus 210a in parallel.

The shading patterns of FIGS. 20 and 21 tend to make the RBER of logical pages stored in the array more consistent between logical pages as compared with the arrangement of FIG. 19 in which a first page (e.g., a logical page consisting of pages all in position A) may have an RBER significantly higher than a second logical page (e.g., a logical page consisting of pages all in position C) if the pages of the first logical page have a higher RBER due to their position in erase block 1402 than the pages of the second logical page, which may be in a more favorable position in erase block 1402.

As was described above, logical pages comprise a plurality of ECC chunks where each ECC chunk may be spread out across the pages of a logical page. In some embodiments, the number of ECC chunks having uncorrectable errors may be significantly reduced using the shading illustrated in FIG. 20 or 21 as compared with the shading of FIG. 19. This reduction may be realized if the typical number of bit errors in an ECC chunk resulting from the more consistent RBER realized by the arrangement of FIG. 20 or 21 is lower than the maximum number of errors correctable by the ECC of the ECC chunk.

In contrast, in the arrangement of FIG. 19, many more ECC chunks may have uncorrectable errors since the RBER for ECC chunks stored in a particular logical page may be significantly higher than for other logical pages. Note that using the arrangement of FIG. 20 or 21 may actually increase the RBER for ECC chunks stored in some logical pages as compared with FIG. 19. However, this increase in RBER might not necessarily result in a greater number of ECC chunks having uncorrectable errors if the typical number of errors in an ECC chunk resulting from the increased RBER is lower than the maximum number of errors correctable by the ECC of the ECC chunk.

In summary, the arrangements of FIGS. 20 and 21 may significantly reduce the number of ECC chunks having uncorrectable errors when compared with the arrangement of FIG. 19, thereby preventing data loss. FIGS. 20 and 21 illustrate two arrangements as examples. Other arrangements in which the pages 1502 assigned to a logical page are located in a variety of positions within their respective erase blocks 1402 are also possible and may produce results similar to those of the arrangements of FIGS. 20 and 21.

Note that the assignments of physical pages 1502 to logical pages by the data position module 112 as illustrated in FIGS. 20 and 21 may be effective regardless of which position (or positions) of erase block 1402 is the position in which pages experience greater RBER than pages in other positions of erase block 1402 since each logical page includes pages 1502 located in a variety of positions of erase block 1402. Accordingly, a designer need not know ahead of time, which of the positions of erase block 1402 have the highest RBER.

In some cases, there may be constraints regarding the assignment of physical pages to logical pages. For example, when using flash memory, there may be a preferred (or required) write order in which the physical pages of an erase block should be programmed (i.e., written). Programming physical pages of an erase block in the preferred write order may reduce bit errors as compared with programming the pages of the erase block in any other order. Typically, the preferred order is specified by the manufacturer of the flash memory.

The write order may be specific to pages of one solid-state storage element (e.g., one die) and each individual solid-state storage element of solid-state storage 100 may have an independent write order that includes just the pages of the individual solid-state storage element. In other words, in certain embodiments, the write order for one solid-state storage element does not include pages from other solid-state storage elements. Furthermore, in some embodiments, the write order may be confined to pages of one physical erase block of a solid-state storage element and each individual physical erase block of each solid-state storage element of solid-state storage 100 may have an independent write order that includes just the pages of the individual physical erase block. In other words, the write order for one physical erase block of one solid-state storage element may not include pages from other physical erase blocks.

The preferred order may affect the efficiency of the method of programming a logical page comprising a plurality of physical pages in different positions as described above. One efficiency affect is that some physical pages of an erase block might not be used. For example, FIG. 20 illustrates a logical page that includes page A of element 216a, page B of element 216b, page C of element 216c . . . and page G of element 216m. By way of example, consider the page written to position B of element 216b. If the preferred order specifies that pages of an erase block should be written left to right, top to bottom, for example, and the first page written to the erase block of element 216b is written to position B, the page in position A of the erase block might go unused since this page cannot be programmed after programming the page in position B and still honor the preferred programming order. Similarly, the pages in positions A and B of the erase block illustrated for element 216c might also go unused. Thus, pages at the top of the preferred write order may go unused.

Pages near the end of the preferred write order may also go unused. For example, the last logical page written to a logical erase block may include a few physical pages located in the last positions of their respective physical erase blocks, but may also include many pages positioned earlier in the preferred order. For these physical erase blocks, some pages at the end of the preferred order may be unused.

Although FIGS. 19-21 illustrate erase blocks having only eight pages, a typical erase block may have tens or hundreds of pages (e.g., 64, 128, or 256 pages). Accordingly, the few pages at the beginning and end of the preferred order that go unused may be a small percentage of the total number of pages of the erase block. Nevertheless, the fact that these pages go unused reduces the overall usable capacity of the array of storage elements.

In another configuration, a logical page may comprise physical pages in two different logical erase blocks. In this configuration, one logical page may include some physical pages near and at the end of the preferred order of their respective physical erase blocks. These physical erase blocks may belong to a first logical erase block. The logical page may also include some physical pages at and near the beginning of the preferred order of their respective physical erase blocks. These physical erase blocks may belong to a second logical erase block different from the first logical erase block. Even though a logical page may span two different logical erase blocks, storage controller 104 may prevent an ECC chunk from spanning more than one logical erase block by confining each ECC chunk to a single logical erase block. This configuration may advantageously use all of the physical pages of a physical erase block, rather than leaving some unused as in the configuration described above. However, having a logical page that spans more than one logical erase block may have other limitations.

For example, if the logical page that spans more than one logical erase block is updated, the existing version of the logical page that spans more than one logical erase block may be marked as invalid and the new version of the logical page may be written elsewhere in the array of storage elements. One result of marking the existing version of the logical page as invalid is that two different logical erase blocks will have portions marked as invalid. Eventually, both of these logical erase blocks may be recovered (e.g., groomed) using, for example, the garbage collection process described above.

However, prior to being recovered, these two different logical erase blocks will each have invalid portions. The two different logical erase blocks may be recovered (groomed) at different times since the garbage collection process may operate on a logical erase block or physical erase block basis recovering a single logical erase block or physical erase block at a time. As a result, one of the logical erase blocks may be recovered (groomed) while the other remains with a portion marked as invalid waiting to be recovered (groomed) leaving the logical page only partially groomed.

This configuration is less efficient than a configuration in which a logical page does not span more than one logical erase block because in this configuration portions of more than one logical erase block can be marked as invalid and therefore unused. These unused portions remain unused until the physical erase block storing these portions is erased. These invalid and unused portions reduce the overall usable capacity of the array of storage elements. In contrast, if the logical page did not span more than one logical erase block, when the logical page is updated, portions of only one logical erase block would be marked invalid and the whole logical erase block could be recovered (groomed) in one operation.

Figure 22:
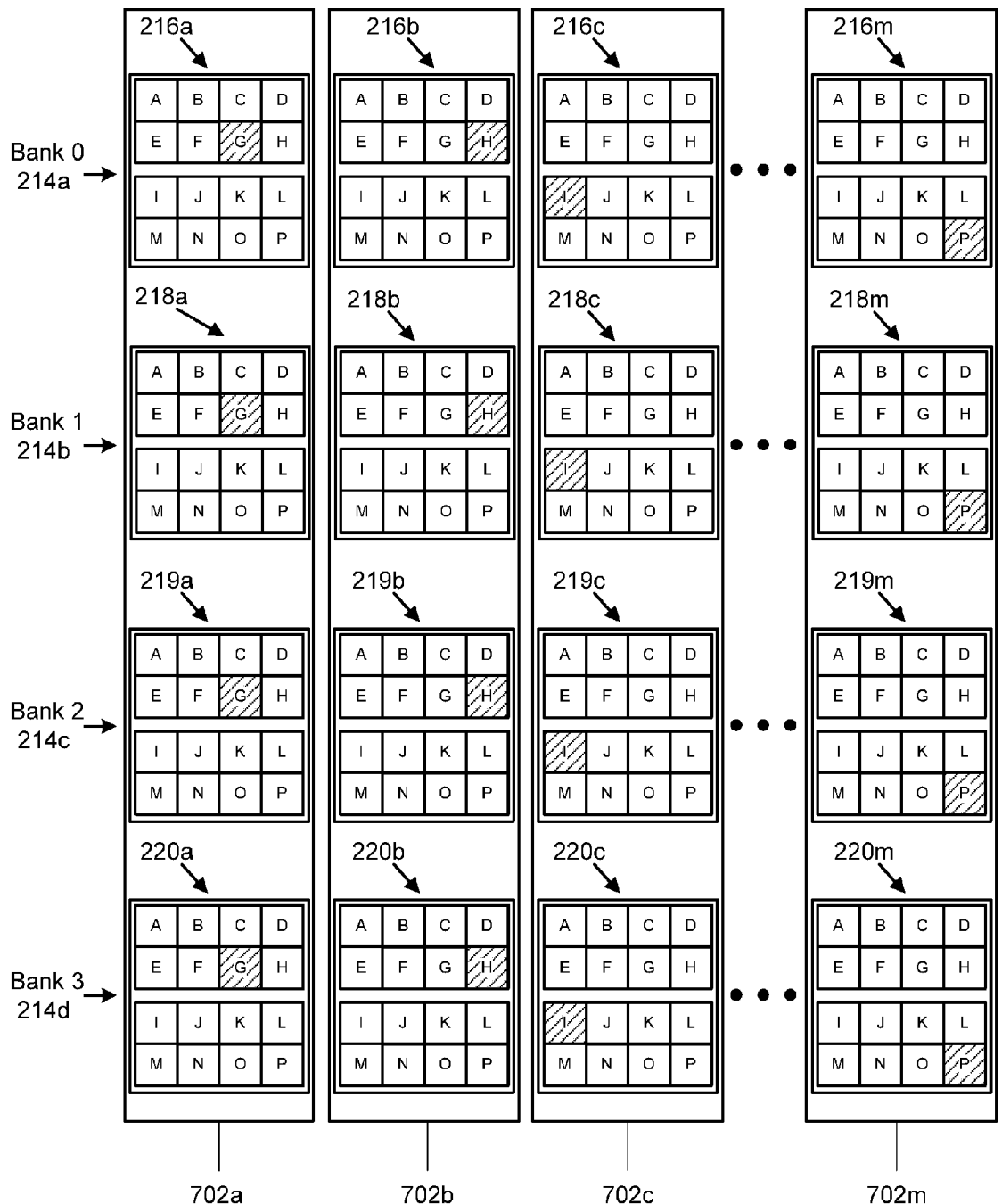
FIG. 22 is a diagram illustrating another embodiment of an arrangement of pages in an array of solid-state storage elements.

Such a configuration, in which a logical page comprises physical pages in two different logical erase blocks, is illustrated in FIG. 22 in which a logical page stored in bank 0 214*a* includes page G of element 216*a*, page H of element 216*b*, page I of element 216*c*, ... and page P of element 216*m*. FIG. 22 also illustrates two logical erase blocks in bank 0 214*a*. The first logical erase block includes pages A-H of elements 216*a*, 216*b*, 216*c*, ..., and 216*m* and the second logical erase block includes pages I-P of elements 216*a*, 216*b*, 216*c*, ..., and 216*m*. Thus, page G of element 216*a* and page H of element 216*b* are in the first logical erase block and page I of element 216*c* and page P of element 216*m* are in the second logical erase block.

In some embodiments, solid-state storage elements 216, 218, 219, 220 may include multi-level memory cells. Such cells may be configured to store more than one bit. For example, some multi-level memory cells may be configured to store two bits, three bits, etc. Examples of data stored by such multi-level memory cells include bit patterns associated with different voltage levels or resistance levels measured for a multi-level memory cell ("MLC"). One example bit pattern for different associated voltage levels may be "00," "01," "11," and "10." In some embodiments, groups of MLC cells having particular bit patterns may be associated with an upper page and MLC cells having other bit patterns may be associated with lower pages. For example, the most significant bit ("MSB") in the set of bit patterns "00," "01," "11," and "10" may represent an upper page and the lease significant bit ("LSB") may represent binary values stored in the lower page. So using the bit pattern above, an MLC cell with a voltage level corresponding to "01" has a zero in the upper page and a one in the lower page. An MLC with a "10" has a one in the upper page and a zero in the lower page, etc. It should be noted that depending on the non-volatile memory media used a zero in the bit pattern may represent a binary 1 and a one in the bit pattern may represent a binary 0. An erase block may comprise a plurality of upper pages and a plurality of lower pages. Solid-state storage elements having two page types, upper and lower, may be referred to generally as all-bitline elements.

Figure 23:
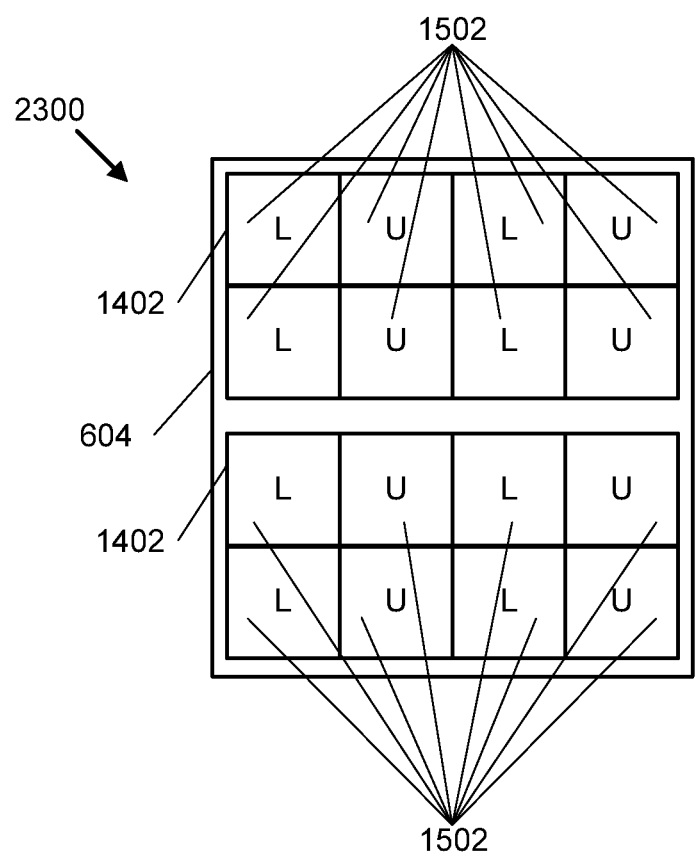
FIG. 23 is an illustration of one embodiment of a symbol used to indicate a page type within an erase block in FIGS. 24 and 25.
Figure 24:
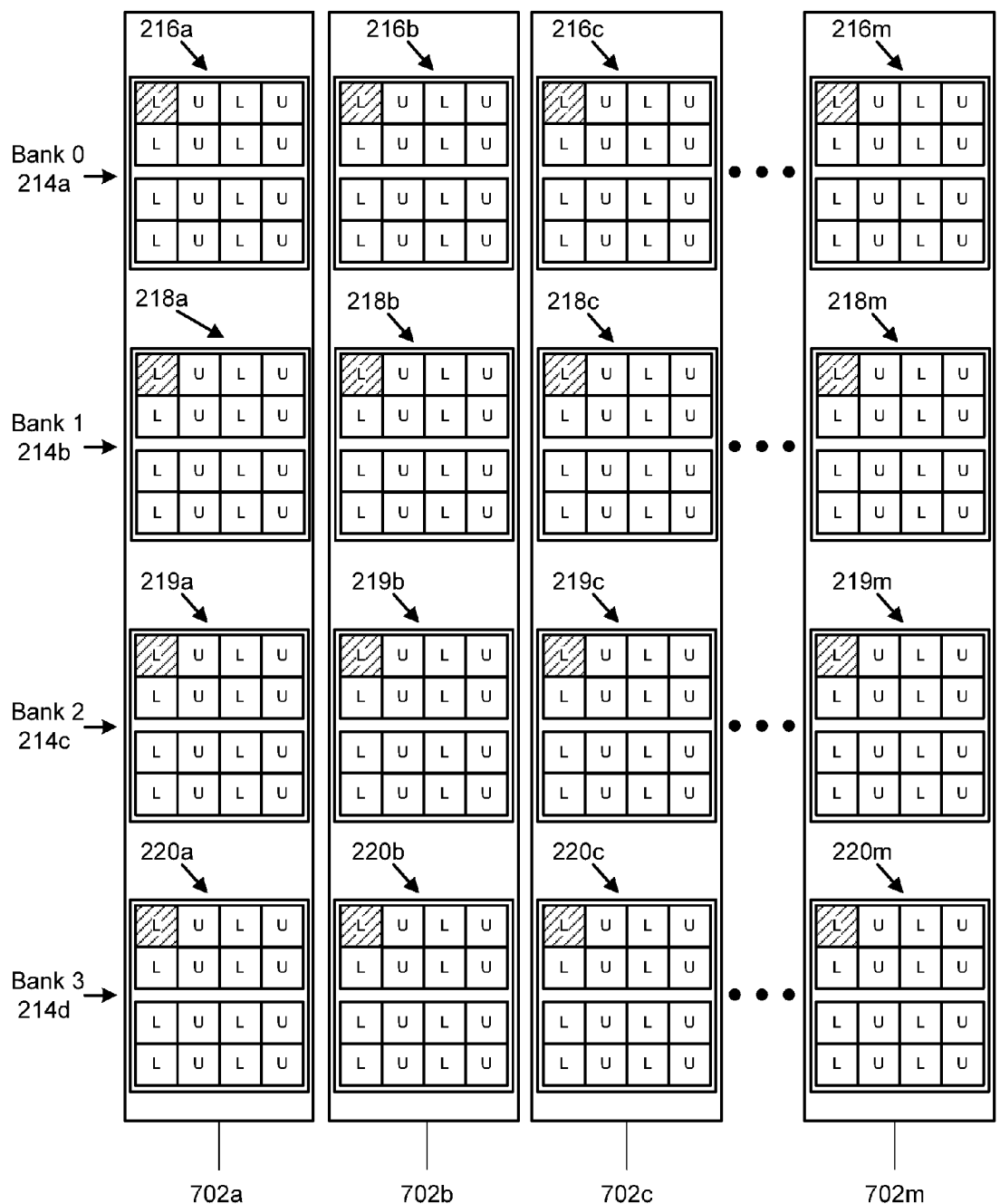
FIG. 24 is a diagram illustrating one embodiment of an arrangement of pages in an array of solid-state storage elements.
Figure 25:
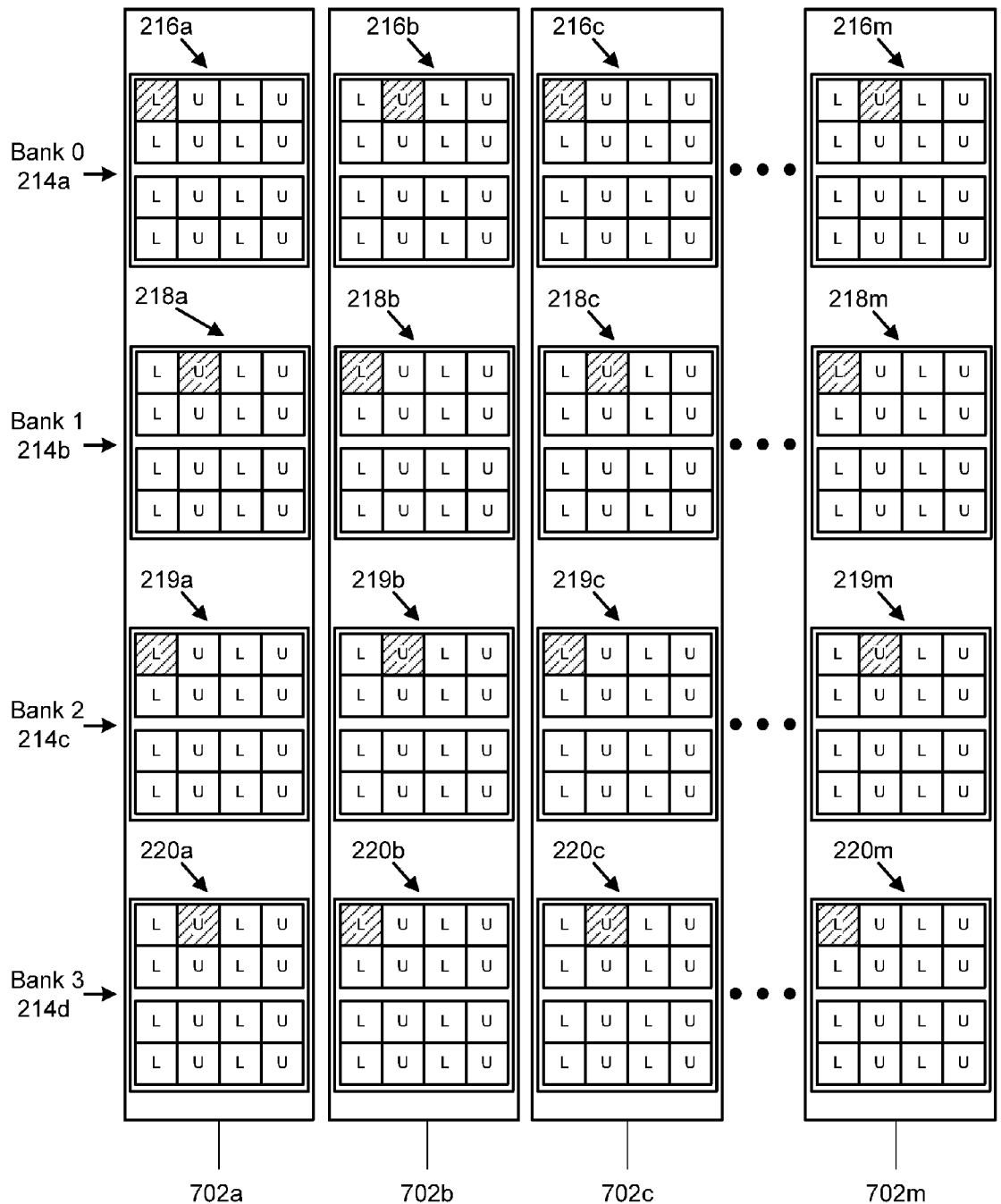
FIG. 25 is a diagram illustrating another embodiment of an arrangement of pages in an array of solid-state storage elements.

FIG. 23 illustrates a symbol 2300 used to represent upper pages and lower pages within an erase block 1402 in FIGS. 24-25. In the symbol, upper pages are marked with a "U" and lower pages are marked with a "L." Although just eight upper pages and eight lower pages are illustrated, each erase block 1402 may include hundreds or thousands of upper and lower pages. The upper and lower pages of the erase blocks 1402 of FIG. 23 are formed by plurality of multi-level memory cells.

FIG. 24 illustrates one approach for determining an order in which the write module 124 writes pages 1502 within erase blocks 1402. Solid-state storage elements 216, 218, 219, 220 are illustrated in banks 214 and pads 702. For each solid-state storage element 216, 218, 219, 220, eight upper pages and eight lower pages are illustrated using symbol 2300 of FIG. 23 and one of the sixteen pages is shaded. The shading of the page indicates that the next data written to the solid-state storage element by the storage controller 104 and/or the write module 124 will be written to the shaded page. Storage controller 104 may control the page to which the write module 124 writes next data by presenting an address on storage I/O bus 210 associated with the shaded page using the address module 132. Once the shaded page has been written, storage controller 104 may start writing another page using the write module 124 and the address module 132.

Furthermore, the shaded pages of one or more banks 214 form a logical page, which was described in detail above. The write module 124 may write data to the logical page by writing a different physical page to each of the shaded page of one bank 214.

FIG. 24 illustrates one arrangement in which the shaded pages of all solid-state storage elements 216, 218, 219, 220 are all lower pages. This arrangement may be particularly efficient to implement because storage controller 104 may present the same address on storage I/O bus 210*a* to each of pads 702, for example, by presenting the same address on each of buses 210*a.a*, 210*a.b*, ..., 210*a.m*. However, the arrangement of FIG. 24 may be vulnerable to data errors.

In some cases, data stored by lower pages of erase block 1402 may be more likely to contain errors than data stored by upper pages of erase block 1402 or vice versa. Put another way, the RBER of lower pages of erase block 1402 may be higher than the upper pages of erase block 1402 or vice versa. This situation may arise for any number of reasons related to packaging, manufacturing defects, temperature, proximity to voltage sources, semiconductor processing, position within a die, stress on a cell due to programming of particular page types, or other variables may cause an RBER to be higher for lower pages than for upper pages of erase blocks 1402 or vice versa. Further, whether the upper or lower pages have the highest RBER may not be known or determinable prior to constructing an array of pads.

Accordingly, writing a logical page in parallel to a set of lower pages as illustrated in FIG. 24 might result in a higher RBER for some ECC chunks than for other ECC chunks. For example, if lower pages have a higher RBER than upper pages, an ECC chunk stored across a set of lower pages may contain a larger number of errors than an ECC chunk stored across upper pages. This larger number of errors is due to the fact that all of the pages 1502 across which the ECC chunk is stored are lower pages, which may have a higher RBER than upper pages.

To alleviate this problem, storage controller 104, using the write module 124 and/or the address module 132, may write an ECC chunk across a set of pages 1502 wherein the pages of the set are a mixture of upper pages and lower pages rather than across a homogeneous set of upper pages or a homogeneous set of lower pages. By writing in parallel to a mixed set of upper and lower pages, an ECC chunk will not be written exclusively to a set of pages 1502 having the highest RBERs, thereby reducing the RBER of an ECC chunk with respect to the arrangement illustrated in FIG. 24.

FIG. 25 illustrates a shading of pages 1502 of erase block 1402 such that the write module 124 writes a logical page across a set of pages 1502 comprising a mixture of upper pages and lower pages. Note, for instance, that the next logical page that the write module 124 writes to bank 0 214*a* will include data written to both upper pages and lower pages as indicated by the shading of pages 1502 in FIG. 25. Accordingly, when writing a logical page to bank 0 214*a*, the write module 124 may write one physical page of the logical page to a lower page of solid-state storage element 216*a*. The write module 124 may write another physical page of the logical page to an upper page of solid-state storage element 216*b*. Thus, the write module 124 may write the physical pages of a logical page to a mixture of upper and lower pages, rather than being written to a homogeneous set of upper pages as was the case in FIG. 24.

The arrangement of FIG. 25 may be more complex to implement than the arrangement of FIG. 24 because the storage controller 104*a*, using the address module 132, may present different addresses on storage I/O bus 210*a* to each of pads 702. For example, storage controller 104*a* using the address module 132 may, in parallel, present a first address associated with a lower page on bus 210*a.a*, a second address associated with an upper page on bus 210*a.b*, a third address associated with a lower page on bus 210*a*.c, and so on. Address module 132, described above, may be configured to determine and present the different addresses on storage I/O bus 210*a* in parallel.

As was described above, some solid-state storage elements may impose a particular write order in which pages are to be written. For example, a particular write order may order pages of a physical erase block so that lower pages must be written before upper pages or vice versa. To accommodate such write ordering schemes, the storage controller 104 and/or the write module 124 may buffer enough pages, for example, in write data pipeline 106, prior to writing the pages to the solid-state storage elements so that the buffered pages can be written according to the write ordering scheme imposed by the solid-state storage elements. In some embodiments, the buffering may include buffering four or more pages for each solid-state storage element prior to writing the buffered pages. Doing so enables a logical page to include both upper and lower pages as described above.

Although the arrangement of FIG. 25 is for multi-level memory cells storing two bits with upper and lower pages, other arrangements are possible for multi-level memory cells storing more than two bits.

The shading pattern of FIG. 25 tends to make the RBER of logical pages stored in the array more consistent between logical pages as compared with the arrangement of FIG. 24 in which a first page (e.g., a logical page consisting entirely of lower pages) may have an RBER significantly higher than a second logical page (e.g., a logical page consisting entirely of upper pages) if the pages of the first logical page have a higher RBER than the pages of the second logical page.

As was described above, logical pages comprise a plurality of ECC chunks where each ECC chunk may be spread out across the pages of a logical page. In some embodiments, the number of ECC chunks having uncorrectable errors may be significantly reduced using the shading illustrated in FIG. 25 as compared with the shading of FIG. 24. This reduction may be realized if the typical number of bit errors in an ECC chunk resulting from the more consistent RBER realized by the arrangement of FIG. 25 is lower than the maximum number of errors correctable by the ECC of the ECC chunk.

In contrast, in the arrangement of FIG. 24, many more ECC chunks may have uncorrectable errors since the RBER for ECC chunks stored in a particular logical page may be significantly higher than for other logical pages. Note that using the arrangement of FIG. 25 may actually increase the RBER for ECC chunks stored in some logical pages as compared with FIG. 24. However, this increase in RBER might not necessarily result in a greater number of ECC chunks having uncorrectable errors if the typical number of errors in an ECC chunk resulting from the increased RBER is lower than the maximum number of errors correctable by the ECC of the ECC chunk.

In summary, the arrangement of FIG. 25 may significantly reduce the number of ECC chunks having uncorrectable errors when compared with the arrangement of FIG. 24, thereby preventing data loss. FIG. 25 illustrates one arrangement as an example. Other arrangements in which the pages 1502 assigned to a logical page are a mixture of upper and lower pages within their respective erase blocks 1402 are also possible and may produce results similar to those of the arrangement of FIG. 25.

Note that the assignment of pages 1502 to logical pages illustrated in FIG. 25 may be effective regardless of whether upper pages or lower pages experience greater RBER since each logical page includes a mixture of upper pages and lower pages. Accordingly, a designer need not know ahead of time, which of the upper pages and lower pages of erase block 1402 have the highest RBER.

In some embodiments, upper pages may be known to have a higher RBER than lower pages and may therefore be avoided altogether. In such embodiments, logical pages may consist only of lower pages and the upper pages of the array of storage elements may go unused. Accordingly, only half of the capacity of the array of storage elements may be used.

In some embodiments, solid-state storage elements 216, 218, 219, 220 may include multi-level memory cells arranged in a half-bitline architecture. In this architecture, a page may be classified as an even lower page, an odd lower page, an even upper page, or an odd upper page.

Figure 26:
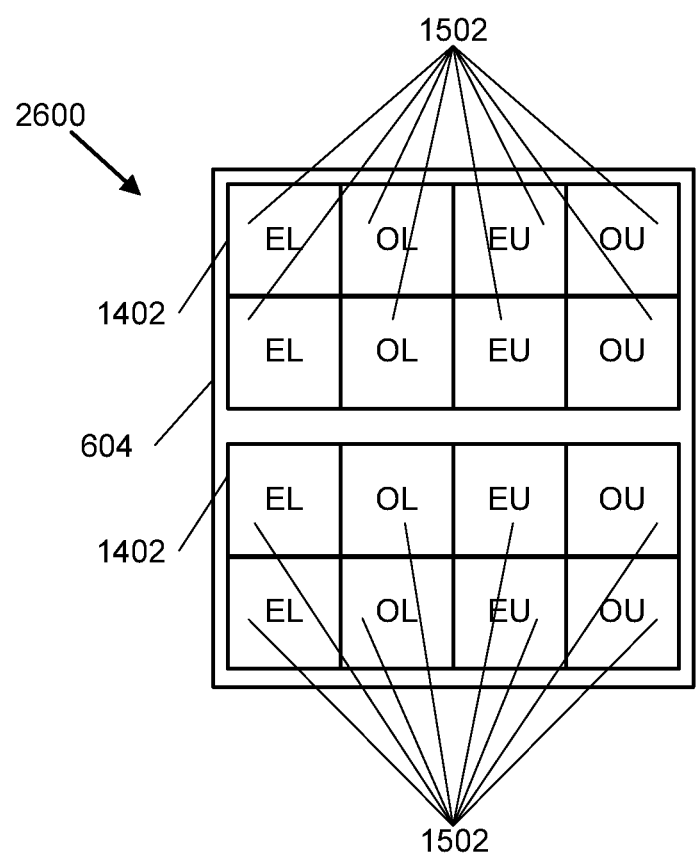
FIG. 26 is an illustration of one embodiment of a symbol used to indicate a page type within an erase block in FIGS. 27 and 28.
Figure 27:
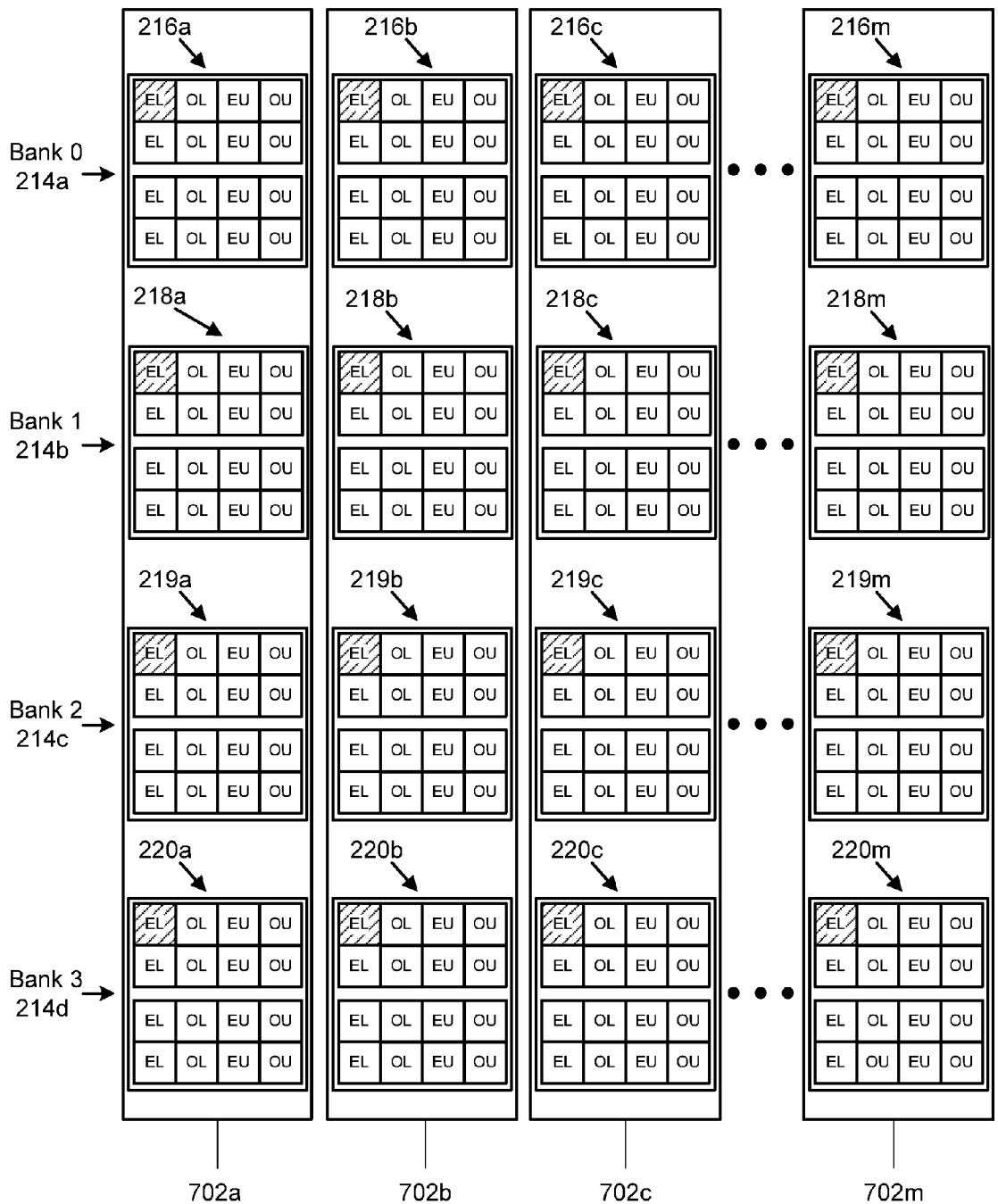
FIG. 27 is a diagram illustrating one embodiment of an arrangement of pages in an array of solid-state storage elements.
Figure 28:
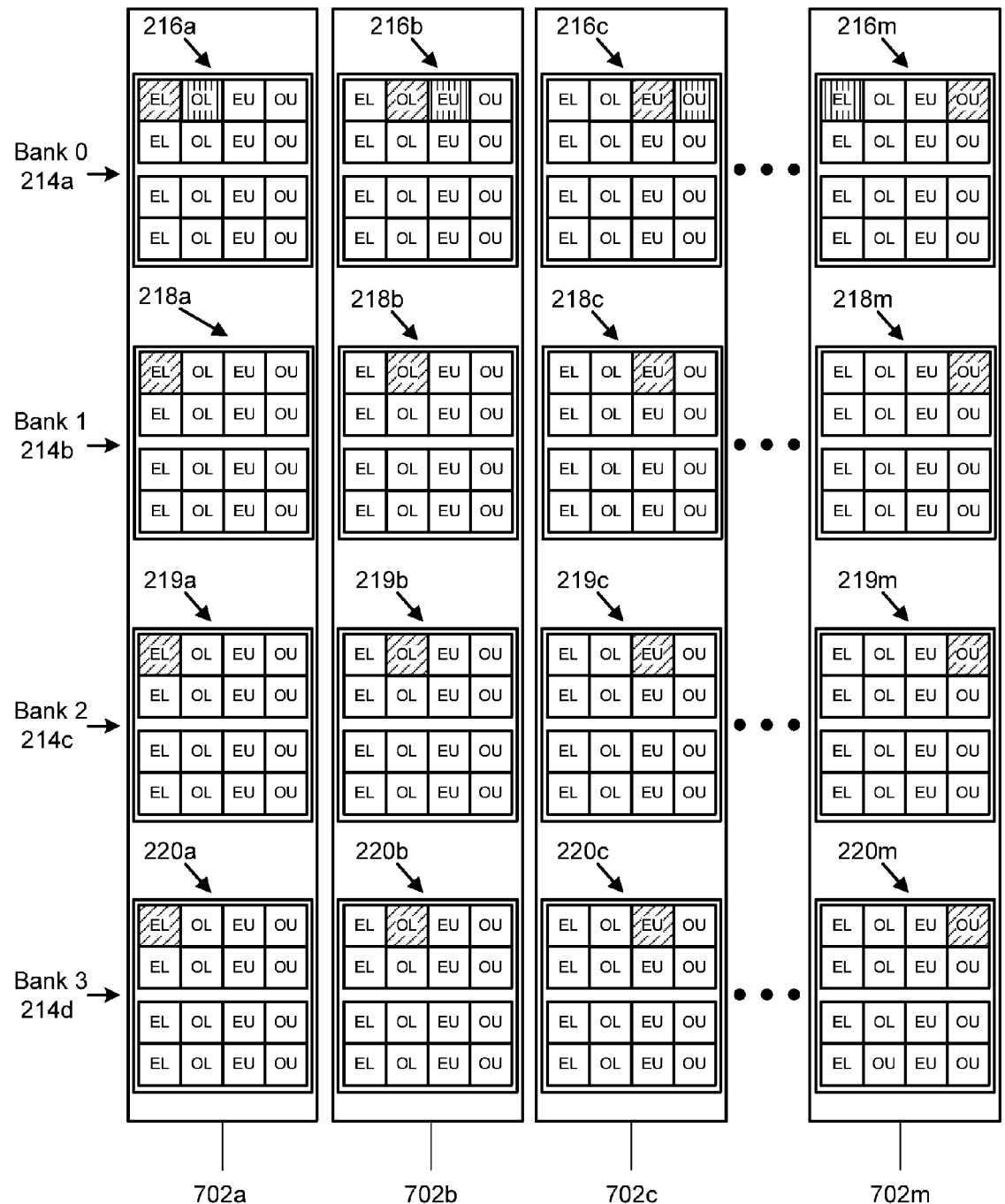
FIG. 28 is a diagram illustrating another embodiment of an arrangement of pages in an array of solid-state storage elements.

FIG. 26 illustrates a symbol 2600 used to represent even lower pages, odd lower pages, even upper pages, and odd upper pages within erase blocks 1402 in FIGS. 27-28. In the symbol, even lower pages are marked with an "EL," odd lower pages are marked with an "OL," even upper pages are marked with an "EU," and odd upper pages are marked with an "OU." Although just a few pages are illustrated, each erase block 1402 may include hundreds or thousands of pages formed by plurality of multi-level memory cells.

FIG. 27 illustrates one approach for determining an order in which pages 1502 are written within erase blocks 1402. Solid-state storage elements 216, 218, 219, 220 are illustrated in banks 214 and pads 702. For each solid-state storage element 216, 218, 219, 220, pages are illustrated using symbol 2600 of FIG. 26 and one of the pages is shaded. The shading of the page indicates that the next data written to the solid-state storage element by storage controller 104 will be written to the shaded page. Storage controller 104 may control the page to which the next data is written by presenting an address on storage I/O bus 210 associated with the shaded page. Once the shaded page has been written, storage controller 104 may start writing another page.

Furthermore, the shaded pages of one bank 214 form a logical page, which was described in detail above. Data may be written to the logical page by writing a different physical page to each of the shaded page of one bank 214.

FIG. 27 illustrates one arrangement in which the shaded pages of all solid-state storage elements 216, 218, 219, 220 are all even lower pages. This arrangement may be particularly efficient to implement because storage controller 104 may present the same address on storage I/O bus 210a to each of pads 702, for example, by presenting the same address on each of buses 210a.a, 210a.b, . . . , 210a.m. However, the arrangement of FIG. 27 may be vulnerable to data errors.

In some cases, data stored by even lower pages of erase block 1402 may be more likely to contain errors than data stored by other page types (e.g., odd lower, even upper, and odd upper) of erase block 1402. Put another way, the RBER of even lower pages of erase block 1402 may be higher than other page types of erase block 1402. This situation may arise for any number of reasons related to packaging, manufacturing defects, temperature, proximity to voltage sources, semiconductor processing, position within a die, stress on a cell due to programming of particular page types, or other variables may cause an RBER to be higher for one type of page than for other types of pages. For some half-bitline devices, even upper pages have the highest RBER, even lower pages have the next highest RBER, odd upper pages have the next highest RBER, and odd lower pages have the lowest RBER. Other half-bitline devices may have different characteristics. In fact, one might not know prior to constructing an array of pads which page type has the highest RBER.

Accordingly, writing a logical page in parallel to a set of even lower pages as illustrated in FIG. 27 might result in a higher RBER for some ECC chunks than for other ECC chunks. For example, if even lower pages have a higher RBER than other page types, an ECC chunk stored across a set of even lower pages may contain a larger number of errors than an ECC chunk stored across odd lower pages, odd upper pages, or even upper pages. This larger number of errors is due to the fact that all of the pages 1502 across which the ECC chunk is stored are even lower pages, which may have a higher RBER than other page types.

To alleviate this problem, storage controller 104, using the write module 124 and/or the address module 132, may write an ECC chunk across a set of pages 1502 wherein the pages of the set are a mixture of page types rather than across a homogeneous set of page types (e.g., all even lower pages). By writing in parallel to a mixed set of page types, an ECC chunk will not be written exclusively to a set of pages 1502 having the highest RBERs, thereby reducing the RBER of an ECC chunk with respect to the arrangement illustrated in FIG. 27.

FIG. 28 illustrates a shading of pages 1502 of erase block 1402 such that the write module 124 writes logical pages across a set of pages 1502 comprising a mixture of even lower pages, odd lower pages, even upper pages, and odd upper pages. Note, for instance, that a first logical page written to bank 0 214a includes the diagonally shaded pages of elements 216 and will include data written to pages of all four types (i.e., EL, OL, EU, OU) as indicated by the diagonal shading of pages 1502 in FIG. 28. Accordingly, when writing the first logical page to bank 0 214a, one physical page of the first logical page is written to an even lower page of solid-state storage element 216a, another physical page of the first logical page is written to an odd lower page of solid-state storage element 216b, and so on across the elements 216 of bank 0 214a. Thus, the physical pages of a logical page may be written to a mixture of page types rather than being written to a set of pages having the same page type as was the case in FIG. 27.

FIG. 28 further illustrates a second logical page written to bank 0 214a including vertically shaded pages of elements 216. The write module 124 also writes this second logical page to a mixture of page types since one physical page of the second logical page is written to an odd lower page of solid-state storage element 216a, another physical page of the second logical page is written to an even upper page of solid-state storage element 216b, and so on across the elements 216 of bank 0 214a.

The arrangement of FIG. 28 may be more complex to implement than the arrangement of FIG. 27 because the storage controller 104a and/or the address module 132 may present different addresses on storage I/O bus 210a to each of pads 702. For example, the storage controller 104a using the address module 132 may, in parallel, present a first address associated with an even lower page on bus 210a.a, a second address associated with an odd lower page on bus 210a.b, a third address associated with an even upper page on bus 210a.c, and so on. Address module 132, described above, may be configured to determine and present the different addresses on storage I/O bus 210a in parallel.

Some half-bitline solid-state storage elements may impose a particular write order in which pages are to be written. For example, for some half-bitline solid-state storage elements, pages must be written in this order: even lower, odd lower, even upper, odd upper. To accommodate such write ordering schemes, the storage controller 104 and/or the write module 124 may buffer enough pages, for example, in write data pipeline 106, prior to writing the pages to the solid-state storage elements so that the buffered pages can be written according to the write ordering scheme imposed by the solid-state storage elements. In some embodiments, the buffering may include buffering four or more pages for each solid-state storage element prior to writing the buffered pages. Doing so enables a logical page to include all four page types as described above.

For example, in FIG. 28, the vertically shaded page of element 216m belongs to the second logical page and the diagonally shaded page of element 216m belongs to the first logical page. Assume that the write ordering scheme for the pages of element 216m is left to right, top to bottom. Since the vertically shaded page is prior to the diagonally shaded page in the write ordering scheme, it must be written prior to the diagonally shaded page. Accordingly, the storage controller 204 and/or the write module 124 may need to buffer the data to be written to the diagonally shaded page of element 216m and delay writing the buffered data until after the vertically shaded page of element 216m is written (and until after the OL page and EU page positioned between the vertically shaded EL block and the diagonally shaded OU page have been written).

The shading pattern of FIG. 28 tends to make the RBER of logical pages stored in the array more consistent between logical pages as compared with the arrangement of FIG. 27 in which a first page (e.g., a logical page consisting entirely of even lower pages) may have an RBER significantly higher than a second logical page (e.g., a logical page consisting entirely of odd lower pages) if the pages of the first page have a higher RBER than the pages of the second logical page.

As was described above, logical pages comprise a plurality of ECC chunks where each ECC chunk may be spread out across the pages of a logical page. In some embodiments, the number of ECC chunks having uncorrectable errors may be significantly reduced using the shading illustrated in FIG. 28 as compared with the shading of FIG. 27. This reduction may be realized if the typical number of bit errors in an ECC chunk resulting from the more consistent RBER realized by the arrangement of FIG. 28 is lower than the maximum number of errors correctable by the ECC of the ECC chunk.

In contrast, in the arrangement of FIG. 27, many more ECC chunks may have uncorrectable errors since the RBER for ECC chunks stored in a particular logical page may be significantly higher than for other logical pages. Note that using the arrangement of FIG. 28 may actually increase the RBER for ECC chunks stored in some logical pages as compared with FIG. 27. However, this increase in RBER might not necessarily result in a greater number of ECC chunks having uncorrectable errors if the typical number of errors in an ECC chunk resulting from the increased RBER is lower than the maximum number of errors correctable by the ECC of the ECC chunk.

In summary, the arrangement of FIG. 28 may significantly reduce the number of ECC chunks having uncorrectable errors when compared with the arrangement of FIG. 27, thereby preventing data loss. FIG. 28 illustrates one arrangement as an example. Other arrangements in which the pages 1502 assigned to a logical page are a mixture of page types within their respective erase blocks 1402 are also possible and may produce results similar to those of the arrangement of FIG. 28.

Note that the assignment of pages 1502 to logical pages illustrated in FIG. 28 may be effective regardless of which page type has the highest RBER since each logical page includes a mixture of page types. Accordingly, a designer need not know ahead of time, which page type has the highest RBER.

In some embodiments, even upper pages may be known to have a higher RBER than other page types and may therefore be avoided altogether. In such embodiments, logical pages may consist only of even lower pages, odd upper pages, and odd lower pages and the even upper pages of the array of storage elements may go unused. Accordingly, three fourths of the capacity of the array of storage elements may be used. Other arrangements are also possible in which only lower pages (and therefore only half of the capacity) are used, only odd pages (and therefore only half of the capacity) are used, or only even pages (and therefore only half of the capacity) are used. In implementing such arrangements, the write module 124 and/or the address module 132 may rely on the write order to avoid particular page types. For example, if only even lower pages are to be used in a logical page, logical pages might include only pages in positions 0, 4, 8, 12, . . . of the write order. Or, if only even pages are to be used, logical pages might include only even numbered pages of the write order (e.g., 0, 2, 4, 6, . . . ).

For some solid-state storage elements, including both all-bitline and half-bitline elements, some page types may take longer to program than other page types. For example, it may take several times as long to program an upper page (e.g., an all-bitline upper page, a half-bitline even upper page, a half-bitline odd upper page) as it does to program a lower page (e.g., an all-bitline lower page, a half-bitline even lower page, a half-bitline odd lower page). In one case, it may take about 1500 μs to program an upper page and only about 500 μs to program a lower page, or the like.

One side effect resulting from having logical pages comprising a mixture of page types is that the programming time for such logical pages will be determined by the page type that takes the longest to program. For example, if a logical page comprises an upper page as well as lower pages and the upper pages take longer to program, the programming time for the logical page will be determined by the programming time for the upper physical pages of the logical page. Accordingly, logical pages comprising physical pages of mixed types may take longer to program than logical pages comprising only lower physical pages. However, waiting longer for a logical page to be programmed may be an acceptable trade-off for the decreased number of uncorrectable bit errors that may result from logical pages having a mixture of physical page types. In embodiments in which programming speed is important, logical pages might not include upper pages. As a result, half of the capacity of the array of solid-state storage elements might not be used.

For some solid-state storage elements, the programming time of a page may decrease as the number of program/erase cycles for the page increases. One reason the programming time may decrease is that electrons may accumulate in cells of the page due to repeated programming. To take advantage of this effect, the following strategy may be employed. Initially, some logical pages might comprise lower pages, but no upper pages and other logical pages might include just upper pages. The logical pages without upper pages may be programmed much faster than the logical pages with upper pages and may be used for time sensitive data. The logical pages with upper pages may also be used. When the logical pages having upper pages have been through a sufficient number of program/erase cycles (e.g., 20,000 cycles) that their programming time has decreased below an acceptable threshold, the restructure module 134 described above may restructure the logical pages without upper pages to include a mixture of upper and lower pages. Of course, other embodiments may include logical pages comprising exclusively upper pages and the restructure module 134 may reconfigure the logical pages once the program/erase cycles of the logical pages of just upper pages reach an acceptable threshold.

Many distinct techniques for reducing data loss have been described above. First, the write module 124 may write an ECC chunk across a set of die 604 located in a variety of positions 802 within a set of pads 702. Second, the write module 124 may write an ECC chunk across a set of erase blocks 1402 located in a variety of positions 1602 within a set of die 604. Third, the write module 124 may write an ECC chunk across a set of pages 1502 located in a variety of positions within a set of erase blocks 1402. Fourth, if multi-level cells are used, the write module 124 may write an ECC chunk across a mixture of upper pages and lower pages within a set of erase blocks 1402. Fifth, if half-bitline cells are used, the write module 124 may write an ECC chunk across a variety of page types (e.g., even lower, odd lower, even upper, and odd upper) within a set of erase blocks 1402. As was mentioned above, in one embodiment, the set of erase blocks 1402 across which the ECC chunk is written may all belong to the same logical erase block. In various embodiments, the data position module 112 may use different combinations of these four techniques to further reduce data loss.

For example, in one embodiment, the write module 124 may write a logical page to a bank of solid-state storage elements such that a first physical page of the logical page is written to solid-state storage element 216*a* in page 1, a second physical page of the logical page is written to solid-state storage element 216b in page 2, a third physical page of the logical page is written to solid-state storage element 216c in page 3, and so on, resulting in a "barber pole" or striping of the media with a slope of one page per storage element. In some embodiments, the logical page may span multiple logical and/or physical erase blocks and a logical order of erase blocks may be used.

Other slopes for the "barber pole" may be used. A higher slope may provide a more consistent RBER between logical pages, but may result in some wasted space in partially groomed erase blocks as was discussed above. A lower slope may provide a less consistent RBER between logical pages, but may result in less wasted space consumed by partially groomed erase blocks. For a slope of 1, the wasted space may be approximately N−1 logical pages where N is the number of physical pages in a logical page. If the slope is 2/N, the space for only one logical page may be wasted, and then only if the logical page spans multiple erase blocks.

When using small slopes, the write module 124 and/or the address module 132 may use interleaving so that the physical pages of a logical page are addressed from a base address A. The physical pages may be stored across a bank 214 of solid-state storage elements, for example, with the first physical page in element 216a, the second physical page in element 216b, and so on. In such an arrangement, the page addresses of the physical pages making up the logical page may be represented as follows: A, A+1, A, A+1, A, A+1, and so on, where each address is the page address of a different one of the storage elements in the bank, thereby achieving some interleaving. This approach may be advantageous over a non-interleaved addressing scheme using page addresses as follows: A, A, A, A+1, A+1, A+1, and so on.

Figure 29:
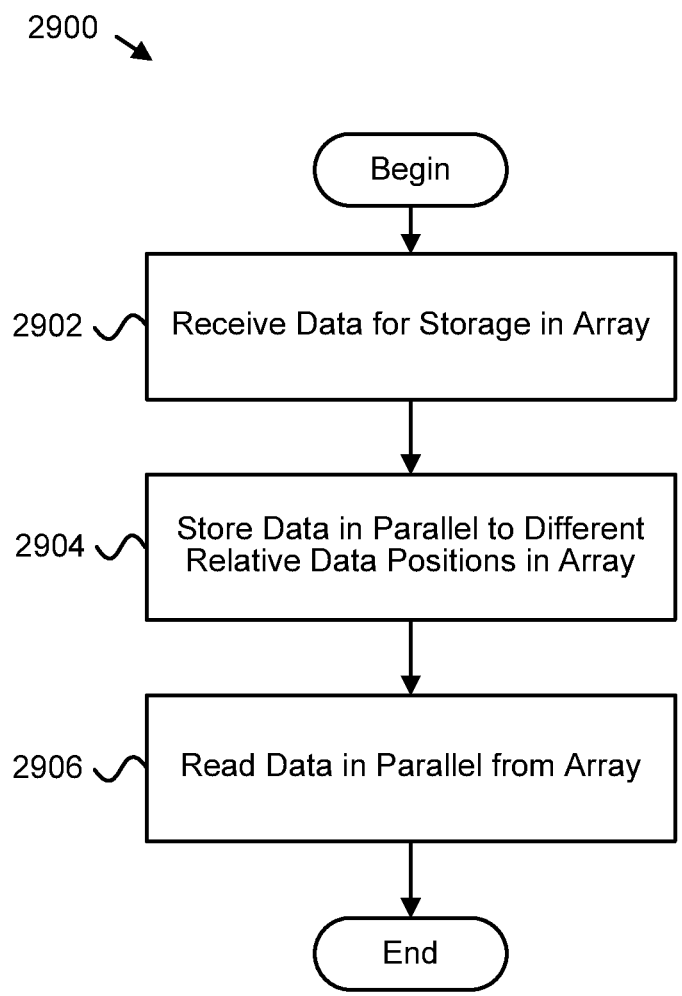
FIG. 29 is a schematic flowchart diagram illustrating one embodiment of a method for varied data positioning.

FIG. 29 depicts one embodiment of a method 2900 for varied data positioning. The method 2900 begins, and the write request module 122 receives 2902 data for storage in an array of solid-state storage elements. In certain embodiments, the solid-state storage elements are accessible in parallel. The write module 124 stores 2904 the data in parallel to the array of solid-state storage elements in a plurality of varied, different data positions relative to different solid-state storage elements of the array. The read module 126 reads 2906 the data in parallel from the array of solid-state storage elements. In certain embodiments, the read module 126 reads 2906 the data from the same varied, different data positions relative to the different solid-state storage elements of the array to which the write module 124 stored 2904 the data and the method 2900 ends.

Figure 30:
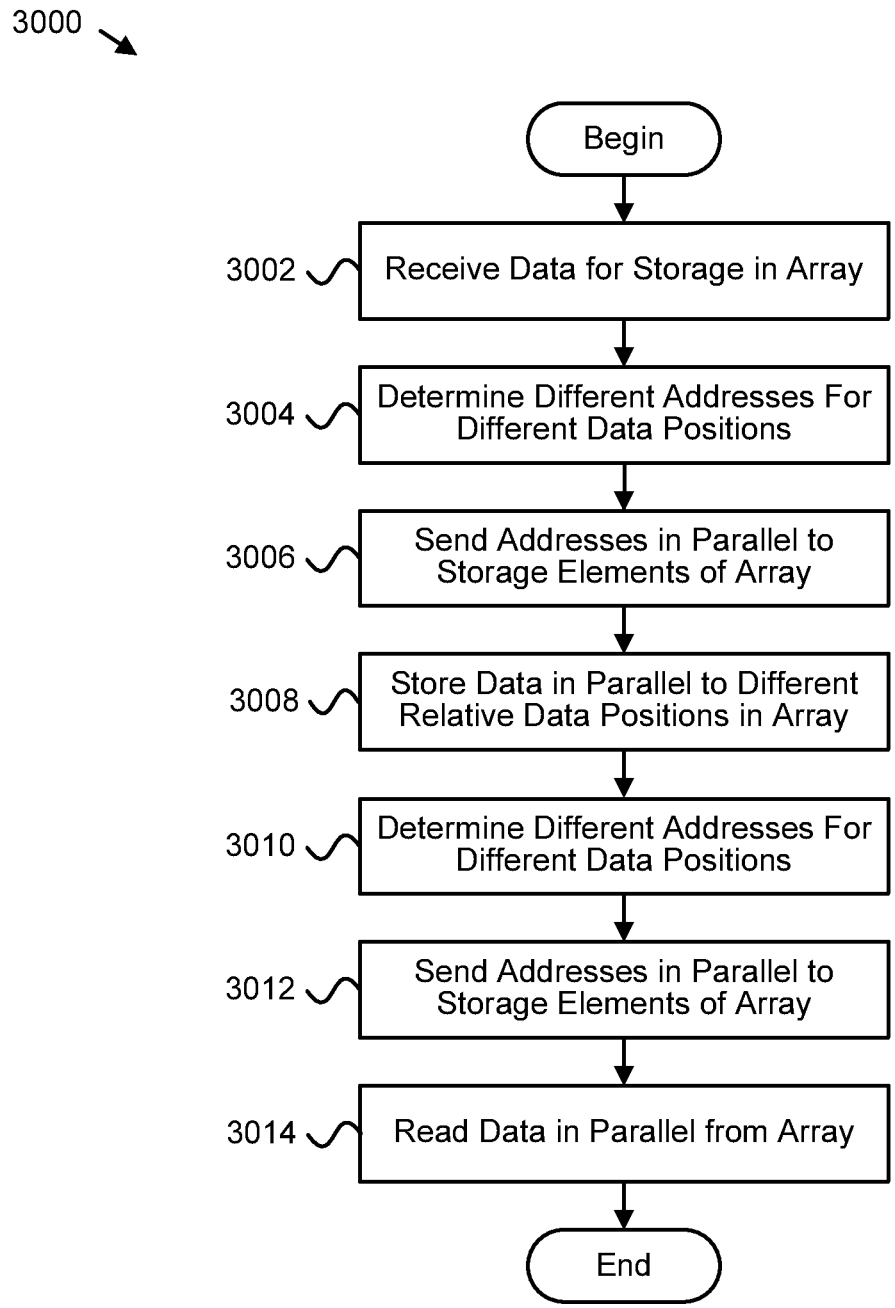
FIG. 30 is a schematic flowchart diagram illustrating another embodiment of a method for varied data positioning.

FIG. 30 depicts another embodiment of a method 3000 for varied data positioning. The method 3000 begins, and the write request module 122, in response to a write request or the like, receives 3002 data for storage in an array of solid-state storage elements. The address module 132 determines 3004 a different address for varied, different data positions in different solid-state storage elements of the array.

The address module 132 sends 3006 the different addresses in parallel to the solid-state storage elements of the array in cooperation with the write module 124, that stores 3008 the received 3002 data in parallel to the array of solid-state storage elements in the plurality of varied, different data positions associated with the determined 3004 addresses.

In response to a read request for the data or the like, the address module 132 determines 3010 the different addresses for the varied, different data positions in the different solid-state storage elements of the array. The address module 132 sends 3012 the determined 3010 addresses in parallel to the solid-state storage elements of the array in cooperation with the read module 126, that reads 3014 the data from the same varied, different data positions to which the write module 124 stored 3010 the data and the method 3000 ends.

In a further embodiment, the method includes inverting an address bit for solid-state storage elements of the array to alternate the different data positions between the one or more upper pages and the one or more lower pages of the multi-level memory cells. In certain embodiments, the method includes restructuring logical pages of the array of solid-state storage elements from physical pages disposed in similar positions relative to the different solid-state storage elements of the array to the physical pages disposed in different positions in response to a number of program/erase cycles satisfying a threshold. In one embodiment, the method includes buffering the data with other data such that the data and the other data is stored to the physical pages in an order that satisfies a write order for the physical pages.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
receiving data for storage in an array of solid-state storage elements, the solid-state storage elements comprising data positions having respective error rates, wherein one or more of the data positions have an error rate that differs from an average error rate of the array;
storing the received data at a plurality of data positions within the array, wherein each of the plurality of data positions corresponds to a respective solid-state storage element, wherein storing the received data further comprises varying data positions of the received data within the respective solid-state storage elements in accordance with the error rates corresponding to the data positions; and
reading data from the varied data positions within the respective solid-state storage elements in the array of solid-state storage elements.

2. The method of claim 1, further comprising determining a different address for each of the different data positions based on known reliability characteristics of the different data positions within the array of solid-state storage elements.

3. The method of claim 2, further comprising sending the different addresses in parallel to the solid-state storage elements of the array to store the data and to read the data.

4. The method of claim 2, wherein the different address for each of the different data positions comprises adding a predetermined offset to addresses to define each of the different data positions according to an order of the solid-state storage elements of the array.

5. The method of claim 1, wherein the data is stored as a logical page spanning the solid-state storage elements in the array.

6. The method of claim 1, wherein the different data positions comprise one or more of solid-state storage dies having different relative positions within the solid-state storage elements of the array, physical pages disposed in different positions relative to the solid-state storage elements of the array, one or more upper pages and one or more lower pages of the solid-state storage elements of the array, physical erase blocks disposed in different physical positions relative to the solid-state storage elements of the array, and one or more odd physical pages and one or more even physical pages of the array of solid-state storage elements.

7. The method of claim 1, wherein the data comprises a logical page of data and the different data positions comprise physical pages disposed in different positions relative to the solid-state storage elements of the array.

8. The method of claim 7, further comprising inverting an address bit for solid-state storage elements of the array to alternate the different data positions between the one or more upper pages and the one or more lower pages of the multi-level memory cells.

9. The method of claim 7, further comprising restructuring logical pages of the array of solid-state storage elements from physical pages disposed in similar positions relative to the solid-state storage elements of the array to the physical pages disposed in different positions in response to a number of program/erase cycles satisfying a threshold.

10. The method of claim 7, further comprising buffering the data with other data such that the data and the other data is stored to the physical pages in an order that satisfies a write order for the solid-state storage elements of the array.

11. An apparatus, comprising:
a data position module configured to arrange a data segment for storage within a logical page, the logical page comprising physical pages on each of a plurality of solid-state storage elements of an array, the physical pages having respective reliability characteristics that vary within the respective solid-state storage elements, such that reliability characteristics of certain physical pages differ from average reliability characteristics of the physical pages of the array, wherein the data position module is configured to select varied data positions for the physical pages of the logical page in accordance with the varied reliability characteristics of the physical pages within the respective solid-state storage elements;
a write module configured to store the data segment the logical page arranged by the data position module ; and
a read module configured to read the stored data segment from the logical page arranged by the data position module.

12. The apparatus of claim 11, further comprising an address module configured to determine a different address for each of the physical pages at the varied data positions within the respective solid-state storage elements of the array.

13. The apparatus of claim 11, wherein enable lines are electrically coupled to the different solid-state storage elements of the array in different relative locations of the different solid-state storage elements such that the array of solid-state storage elements is configured to receive the data segment in parallel at the varied data positions.

14. The apparatus of claim 11, wherein the varied data positions comprise solid-state storage dies having different relative positions within the different solid-state storage elements of the array.

15. The apparatus of claim 11, wherein the data segment comprises an error correcting code codeword.

16. The apparatus of claim 11, wherein the logical page comprises one or more upper pages and one or more lower pages of respective multi-level memory cells.

17. The apparatus of claim 11, wherein the logical page spans more than one logical erase block of the array of solid-state storage elements.

18. The apparatus of claim 11, wherein the logical page comprises physical pages within respective physical erase blocks at different physical positions relative to the different solid-state storage elements of the array.

19. The apparatus of claim 11, wherein the varied data positions comprise one or more odd physical pages and one or more even physical pages of the array of solid-state storage elements.

20. The apparatus of claim 11, wherein the varied data positions comprise a combination of two or more of solid-state storage dies having different relative positions within the different solid-state storage elements of the array, one or more upper pages and one or more lower pages of the array of solid-state storage elements, and physical pages disposed in different positions relative to the different solid-state storage elements of the array.

21. The apparatus of claim 11, wherein the varied data positions are selected to average an error rate across the plurality of physical pages of the logical page.

22. A system comprising:
a solid-state storage device comprising a plurality of solid-state storage elements, each solid-state storage element comprising a plurality of physical storage locations at respective physical addresses, each physical storage location having a respective error rate, wherein the error rates of the physical storage locations differ in accordance with the physical addresses of the physical storage locations; and
a storage controller, comprising,
a write module configured to store an error correcting code chunk in parallel across the plurality of solid-state storage elements, wherein data of the error correcting code chunk are stored in physical storage locations within a plurality of different solid-state storage elements and at varied physical address offsets within the respective solid-state storage elements, wherein the physical address offsets are varied in accordance with the error rates of the physical storage locations at different physical addresses within the respective solid-state storage elements ; and
a read module configured to read the error correcting code chunk in parallel from the array of solid-state storage elements.

23. The system of claim 22, further comprising a host computing system in communication with the solid-state storage device over one or more communications buses.

24. A non-transitory computer program product comprising a computer readable storage medium storing computer usable program code executable to perform operations, the operations of the computer program product comprising:
determining a plurality of different addresses for a virtual page, each address of the virtual page corresponding to a physical data position within a respective one of a plurality of solid-state storage elements in a storage array, wherein error rates of the physical data positions vary in accordance with the respective addresses of the physical data positions within the array, wherein determining the plurality of different addresses for the virtual page comprises selecting addresses at different offsets within the respective solid-state storage elements such that the virtual page comprises physical data positions corresponding to different error rates within the array;
sending the plurality of different addresses in parallel to the solid-state storage elements of the storage array; and
storing data in parallel to the physical data positions within the respective solid-state storage elements at the plurality of different addresses determined for the virtual page.

25. An apparatus, comprising:
means for receiving data for storage in an array of solid-state storage elements, the solid-state storage elements accessible in parallel, the solid-state storage elements comprising storage locations at respective data positions within the array, wherein error rates of the storage locations vary based on data position of the storage locations within the array;

means for storing the received data to a plurality of storage locations within the array in parallel, each of the plurality of storage locations corresponding to a respective one of the solid-state storage elements such that the data is stored in storage locations at different data positions relative to the solid-state storage elements of the array, the different data positions selected to average an error rate of the plurality of storage locations based on the varied error rates of the data positions of the plurality of storage locations within the array; and means for reading data in parallel from the array of solid-state storage elements.

* * * * *